US012801883B2

(12) United States Patent
Takeda et al.

(10) Patent No.: US 12,801,883 B2
(45) Date of Patent: Nov. 17, 2026

(54) IC MODULES AND IC CARDS

(71) Applicant: TOPPAN HOLDINGS INC., Tokyo (JP)

(72) Inventors: Shigenori Takeda, Tokyo (JP); Shin Kataoka, Tokyo (JP); Tetsuya Tsukada, Tokyo (JP)

(73) Assignee: TOPPAN HOLDINGS INC., Tokyo (JP)

( * ) Notice: Subject to any disclaimer, the term of this patent is extended or adjusted under 35 U.S.C. 154(b) by 0 days.

(21) Appl. No.: 19/390,481

(22) Filed: Nov. 14, 2025

(65) Prior Publication Data

US 2026/0073175 A1 Mar. 12, 2026

Related U.S. Application Data

(63) Continuation of application No. PCT/JP2024/015553, filed on Apr. 19, 2024.

(30) Foreign Application Priority Data

May 19, 2023 (JP) ................................ 2023-082744
May 19, 2023 (JP) ................................ 2023-082878

(51) Int. Cl.

| | |
|---|---|
| ***G06K 19/07*** | (2006.01) |
| ***G06K 19/073*** | (2006.01) |
| ***H10W 44/20*** | (2026.01) |
| ***H10W 70/60*** | (2026.01) |
| ***H10W 70/67*** | (2026.01) |
| ***H10W 70/68*** | (2026.01) |

(Continued)

(52) U.S. Cl.

CPC ...... *G06K 19/07354* (2013.01); *H10W 44/20* (2026.01); *H10W 70/68* (2026.01); *H10W 70/688* (2026.01); *H10W 70/699* (2026.01); *H10W 74/127* (2026.01); *H10W 90/401* (2026.01); *H10W 44/248* (2026.01)

(58) Field of Classification Search

CPC ........ G06K 19/07354; G06K 19/0718; H10W 70/699
USPC ........................................................ 235/492
See application file for complete search history.

(56) References Cited

U.S. PATENT DOCUMENTS

2019/0236320 A1* 8/2019 Ahluwalia ......... G06K 19/0718

FOREIGN PATENT DOCUMENTS

CN 111063667 A 4/2020
JP H07-239922 A 9/1995

(Continued)

OTHER PUBLICATIONS

International Searching Authority, "International Search Report," issued in connection with International Patent Application No. PCT/JP2024/015553, dated Jul. 16, 2024.

(Continued)

*Primary Examiner* — Toan C Ly

(74) *Attorney, Agent, or Firm* — Foley & Lardner LLP

(57) ABSTRACT

The present invention is an IC module including: a substrate having a through hole; a contact terminal provided on a first surface of the substrate; an IC chip provided on a second surface of the substrate; a holding portion fixed to the substrate and projecting from the substrate; and a fingerprint sensor fixed to the holding portion, wherein the contact terminal is electrically connected to the IC chip via the through hole, and the fingerprint sensor is electrically connected to the IC chip via the holding portion.

25 Claims, 28 Drawing Sheets

(51) Int. Cl.
*H10W 74/10* (2026.01)
*H10W 90/00* (2026.01)

(56) References Cited

FOREIGN PATENT DOCUMENTS

| | | | |
|---|---|---|---|
| JP | H10-320519 | A | 12/1998 |
| JP | 2001-056850 | A | 2/2001 |
| JP | 2002-150256 | A | 5/2002 |
| JP | 2004-241719 | A | 8/2004 |
| JP | 2009-188026 | A | 8/2009 |
| JP | 2020-086769 | A | 6/2020 |
| JP | 2022-154155 | A | 10/2022 |

OTHER PUBLICATIONS

International Searching Authority, “Written Opinion,” issued in connection with International Patent Application No. PCT/JP2024/015553, dated Jul. 16, 2024.

* cited by examiner

IC MODULES AND IC CARDS

CROSS-REFERENCE TO RELATED PATENT APPLICATIONS

The present application is a Bypass Continuation of International Patent Application No. PCT/JP2024/015553, filed Apr. 19, 2024, which claims priority to and the benefit of Japanese Patent Application Nos. 2023-082744 and 2023-082878, both filed on May 19, 2023. The contents of these applications are hereby incorporated by reference herein in their entireties.

TECHNICAL FIELD

The present invention relates to IC modules and IC cards.

BACKGROUND

Known IC cards incorporating a semiconductor memory or the like include hybrid IC cards (dual IC cards) having both contact and contactless type functions. Hybrid IC cards may be used, for example, as credit cards, cash cards, prepaid cards, membership cards, gift cards, transportation cards, passports and driver's licenses. When using IC cards, identity verification is mainly performed by using a personal identification number consisting of four to six digits, but there are problems such as complexity of memorizing the personal identification number and a risk of the personal identification number being stolen. Therefore, in order to enhance the convenience and security of identity verification when using IC cards, IC cards have been proposed which have a function of authenticating biometric information unique to a user, such as fingerprint (see e.g., PTL 1).

CITATION LIST

Patent Literature

PTL 1: JP 2022-154155 A

SUMMARY OF THE INVENTION

Technical Problem

A hybrid IC card with a function for authenticating fingerprint information includes an IC module in which a contact terminal for contacting a contact type external device and an IC chip that functions as both a contact type and a contactless type are provided on a substrate, and a fingerprint sensor configured to acquire the user's fingerprint information, which are sandwiched by card substrates. In a hybrid IC card having a configuration in which a fingerprint sensor is provided separately from an IC module, the IC chip and the fingerprint sensor need to be connected to each other by a wiring mechanism, which increases the number of production steps and production costs of the IC module and the IC card. Further, when the IC chip and the fingerprint sensor are mounted on the substrate using an anisotropic conductive film (ACF), if force is applied to the anisotropic conductive film due to bending of the IC card or the like, the anisotropic conductive film is likely to be peeled off since the number of terminals of the fingerprint sensor is as large as about 4 to 8, causing the IC card to be unable to communicate.

The present invention has been made in view of the above circumstances, and aims to provide an IC module and an IC card that can suppress an increase in the number of production steps and production costs.

Solution to Problem

In order to solve the above problems, the present invention proposes the following solution.

A first aspect of the present invention is an IC module including: a substrate having a through hole penetrating in a plate thickness direction; a contact terminal provided on a first surface of the substrate facing a first side in the plate thickness direction; an IC chip provided on a second surface of the substrate facing a second side in the plate thickness direction; a holding portion fixed to the substrate and projecting from the substrate toward the second side in the plate thickness direction; and a fingerprint sensor fixed to the holding portion and disposed facing the IC chip with a gap therebetween in the plate thickness direction, wherein the contact terminal is electrically connected to the IC chip via the through hole, and the fingerprint sensor is electrically connected to the IC chip via the holding portion.

A second aspect of the present invention is an IC module including: a substrate having a through hole penetrating in a plate thickness direction; a contact terminal provided on a first surface of the substrate facing a first side in the plate thickness direction; an IC chip provided on a second surface of the substrate facing a second side in the plate thickness direction; a holding portion fixed to the substrate and projecting from the substrate toward the second side in the plate thickness direction; and a fingerprint sensor fixed to the holding portion and disposed facing the IC chip with a gap therebetween in the plate thickness direction, wherein the IC chip includes a first IC chip and a second IC chip, the contact terminal is electrically connected to the first IC chip via the through hole, and the fingerprint sensor is electrically connected to the second IC chip via the holding portion.

A third aspect of the present invention is the IC module according to the first or second aspect, wherein the holding portion is made of a conductive material.

A fourth aspect of the present invention is the IC module according to the first or second aspect, wherein the holding portion is a substrate to which the fingerprint sensor is mounted and in which a recess is formed that is recessed from a surface facing the first side in the plate thickness direction toward the second side in the plate thickness direction, and the IC chip is accommodated in the recess.

A fifth aspect of the present invention is the IC module according to any one of the first to fourth aspects, including: a first fixing portion that fixes the holding portion to the substrate; and a second fixing portion that fixes the holding portion to the fingerprint sensor, wherein the first fixing portion and the second fixing portion are formed of solders having different melting points from each other.

A sixth aspect of the present invention is the IC module according to any one of the first to third aspects, wherein the holding portion is a copper core solder ball.

A seventh aspect of the present invention is the IC module according to any one of the first to sixth aspects, including a resin sealing portion made of a resin, wherein the resin sealing portion covers the IC chip.

An eighth aspect of the present invention is the IC module according to any one of the first to seventh aspects, including a coupling portion electrically connected to the IC chip, wherein an outer edge of the substrate surrounds the holding portion and the fingerprint sensor when viewed in the plate thickness direction, and the coupling portion is provided in a portion of the second surface of the substrate on the outside of the holding portion.

A ninth aspect of the present invention is the IC module according to the fourth or fifth aspect, including a coupling portion electrically connected to the IC chip, wherein an outer edge of the holding portion surrounds the substrate when viewed in the plate thickness direction, and the coupling portion is provided in a portion of a surface of the holding portion facing the first side in the plate thickness direction on the outside of the substrate.

A tenth aspect of the present invention is an IC card including: the IC module according to the eighth or ninth aspect; a card substrate into which the IC module is fitted; and an antenna substrate having a booster antenna electrically connected to the coupling portion.

An eleventh aspect of the present invention is the IC card according to the tenth aspect, wherein the antenna substrate includes a connection terminal electrically connected to the booster antenna, and the coupling portion is a terminal in contact with the connection terminal.

A twelfth aspect of the present invention is the IC card according to the tenth aspect, wherein the coupling portion is a coil capable of being electromagnetically coupled to the booster antenna.

A thirteenth aspect of the present invention is an IC module including: a first substrate having a first through hole penetrating in a plate thickness direction; a contact terminal fixed to a first surface of the first substrate facing a first side in the plate thickness direction via a conductive fixing portion; and an IC chip and a fingerprint sensor provided on a second surface of the first substrate facing a second side in the plate thickness direction, wherein the contact terminal is electrically connected to the IC chip via the fixing portion and the first through hole.

A fourteenth aspect of the present invention is an IC module including: a first substrate having a first through hole penetrating in a plate thickness direction; a contact terminal fixed to a first surface of the first substrate facing a first side in the plate thickness direction via a conductive fixing portion; and an IC chip and a fingerprint sensor provided on a second surface of the first substrate facing a second side in the plate thickness direction, wherein the IC chip includes a first IC chip and a second IC chip, the contact terminal is electrically connected to the first IC chip via the fixing portion and the first through hole, and the fingerprint sensor is electrically connected to the second IC chip.

A fifteenth aspect of the present invention is the IC module according to the thirteenth or fourteenth aspect, including a second substrate disposed between the fixing portion and the contact terminal in the plate thickness direction, the second substrate having a second through hole penetrating in the plate thickness direction, wherein the contact terminal is provided on a third surface of the second substrate facing a first side in the plate thickness direction, and is electrically connected to the fixing portion via the second through hole.

A sixteenth aspect of the present invention is the IC module according to the fifteenth aspect, wherein the fixing portion is formed of solder.

A seventeenth aspect of the present invention is the IC module according to the thirteenth or fourteenth aspect, including a second substrate disposed between the first substrate and the contact terminal in the plate thickness direction, the second substrate having a hole penetrating in the plate thickness direction, wherein the contact terminal is provided on a third surface of the second substrate facing a first side in the plate thickness direction, and the fixing portion includes a first fixing portion that fixes the first substrate and the second substrate to each other, and a second fixing portion that passes through the hole and fixes the first substrate and the contact terminal to each other.

An eighteenth aspect of the present invention is the IC module according to the seventeenth aspect, wherein the first fixing portion is formed of solder, and the second fixing portion is formed of a copper core solder ball.

A nineteenth aspect of the present invention is the IC module according to any one of the fifteenth to eighteenth aspects, including a first resin sealing portion made of a resin, wherein the first resin sealing portion covers the IC chip, and a surface of the fingerprint sensor facing a second side in the plate thickness direction is exposed from the first resin sealing portion.

A twentieth aspect of the present invention is the IC module according to any one of the fifteenth to nineteenth aspects, including a second resin sealing portion made of a resin, wherein at least a part of the fixing portion is covered with the second resin sealing portion.

A twenty-first aspect of the present invention is the IC module according to any one of the fifteenth to twentieth aspects, including a coupling portion electrically connected to the IC chip, wherein an outer edge of the first substrate overlaps an outer edge of the second substrate when viewed in the plate thickness direction, and the coupling portion is formed on the second surface of the first substrate.

A twenty-second aspect of the present invention is the IC module according to any one of the fifteenth to twentieth aspects, including a coupling portion electrically connected to the IC chip, wherein an outer edge of the second substrate surrounds an outer edge of the first substrate when viewed in the plate thickness direction, and the coupling portion is provided in a portion of a fourth surface of the second substrate facing the second side in the plate thickness direction on the outside of the first substrate.

A twenty-third aspect of the present invention is an IC card including: the IC module according to the twenty-first aspect; a card substrate into which the IC module is fitted; and an antenna substrate having a booster antenna electrically connected to the coupling portion.

A twenty-fourth aspect of the present invention is the IC card according to the twenty-third aspect, wherein the antenna substrate includes a connection terminal electrically connected to the booster antenna, and the coupling portion is a terminal in contact with the connection terminal.

A twenty-fifth aspect of the present invention is the IC card according to the twenty-third aspect, wherein the coupling portion is a coil capable of being electromagnetically coupled to the booster antenna.

Advantageous Effects of Invention

According to the IC module and the IC card of the present invention, an increase in the number of production steps and production costs can be suppressed.

DETAILED DESCRIPTION

First to Eighth Embodiments

Figure 1:
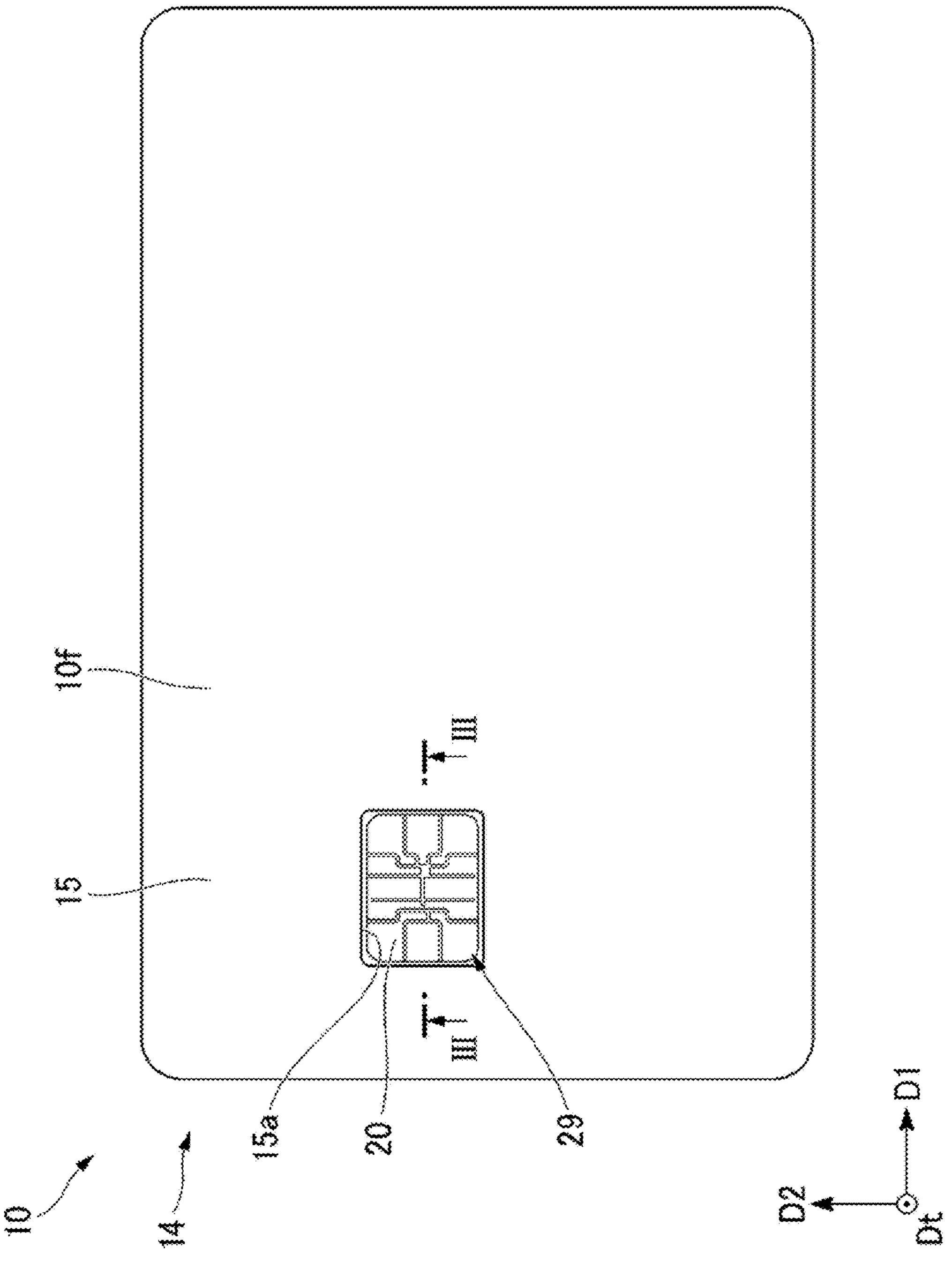
FIG. 1 is a plan view schematically illustrating an IC card according to a first embodiment of the present invention.

With reference to the drawings, an IC module and an IC card according to first to eighth embodiments of the present invention will be described. The scope of the present invention is not limited to the following embodiments, and can be arbitrarily modified within the scope of the technical idea of the present invention. In addition, in the drawings, the scale, the number, and the like of components may differ from the actual structure in order to facilitate understanding of each component.

In the following description, a plate thickness direction Dt is shown in each drawing as appropriate. The plate thickness direction Dt is a direction in which the plate surface of a substrate in the IC module of the embodiments described below faces. In the following description, the side to which the arrow of the plate thickness direction Dt is directed (+Dt side) is referred to as an "upper side". The side opposite to that to which the arrow of the plate thickness direction Dt is directed (−Dt side) is referred to as a "lower side". Further, among the outer surfaces of each member constituting the IC card, the surface facing upward may be referred to as a "front surface" and the surface facing downward may be referred to as a "rear surface". The "upper side" and "lower side" are simply terms used to indicate the relative positional relationship of each components, and the actual positional relationship or the like may differ from that indicated by these terms.

In the following description, a first direction D1 is shown in each drawing as appropriate. The first direction D1 is a direction in which the long side of the rectangular substrate extends in the IC module of the embodiments described below, and is a direction perpendicular to the plate thickness direction Dt. In the following description, the side to which the arrow of the first direction D1 is directed (+D1 side) is referred to as a "first side in the first direction D1". The side opposite to that to which the arrow of the first direction D1 is directed (−D1 side) is referred to as a "second side in the first direction D1".

In the following description, a second direction D2 is shown in each drawing as appropriate. The second direction D2 is a direction in which the short side of the rectangular substrate extends, and is a direction perpendicular to both the first direction D1 and the plate thickness direction Dt. In the following description, the side to which the arrow of the second direction D2 is directed (+D2 side) is referred to as a "first side in the second direction D2". The side opposite to that to which the arrow of the second direction D2 is directed (−D2 side) is referred to as a "second side in the second direction D2".

In the following description, an inward direction Di and an outward direction Do are shown in each drawing as appropriate. The inward direction Di is a direction toward a center axis O1 of the substrate when viewed in the plate thickness direction Dt. The center axis O1 of the substrate is a virtual axis extending in the plate thickness direction. The outward direction Do is a direction opposite to the direction toward the center axis O1 of the substrate when viewed in the plate thickness direction Dt. In the first to eighth embodiments, the center axis O1 of the substrate is coaxial with the center axis of the IC chip. In the following description, the side to which the arrow of the inward direction Di is directed (Di side) is referred to as an "inside" and the side to which the arrow of the outward direction Do is directed (Do side) is referred to as an "outside".

First Embodiment

With reference to FIGS. 1 to 6, a first embodiment of the present invention will be described. In the embodiments described below, components corresponding to each other will be denoted by the same reference signs, and duplicated description thereof may be omitted. Further, in the following description, expressions indicating a relative or absolute arrangement, such as "perpendicular" and "center", not only indicate strictly such arrangement, but also indicate a state of relative displacement with a tolerance or an angle or distance to the extent that the same functions can be obtained.

Figure 2:
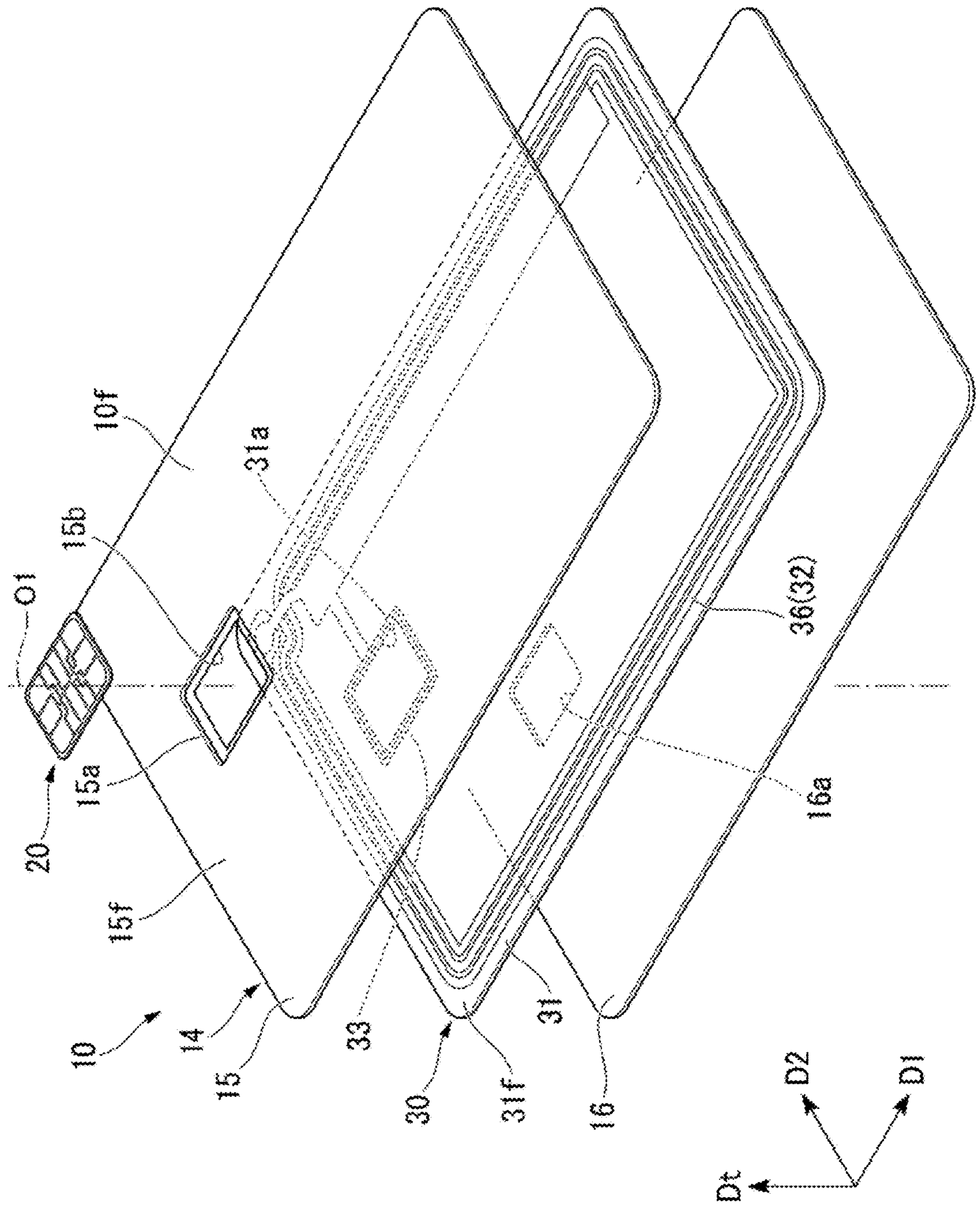
FIG. 2 is an exploded perspective view schematically illustrating the IC card.
Figure 3:
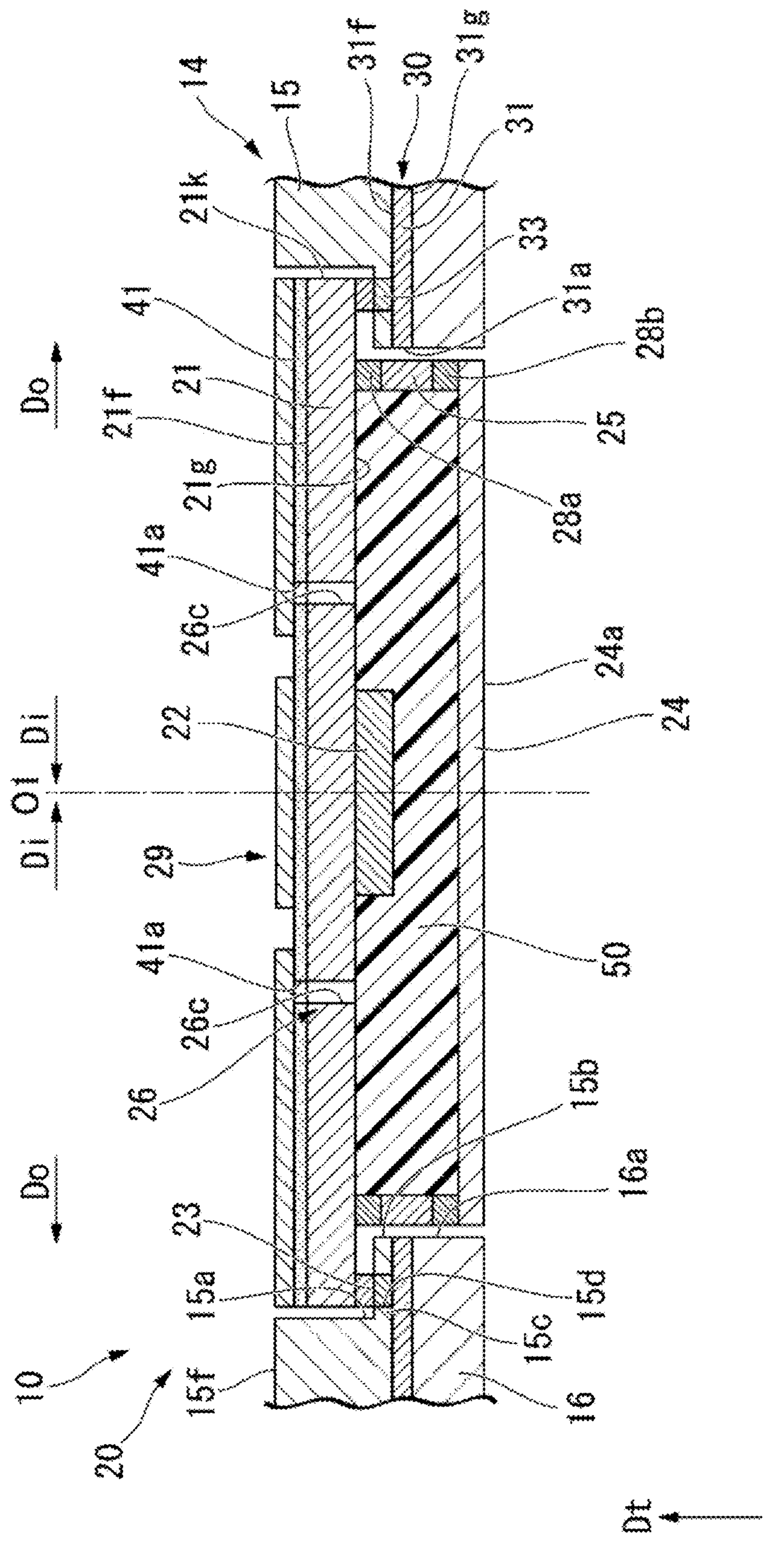
FIG. 3 is a cross-sectional view schematically illustrating the IC card taken along the line III-III of FIG. 1.
Figure 4:
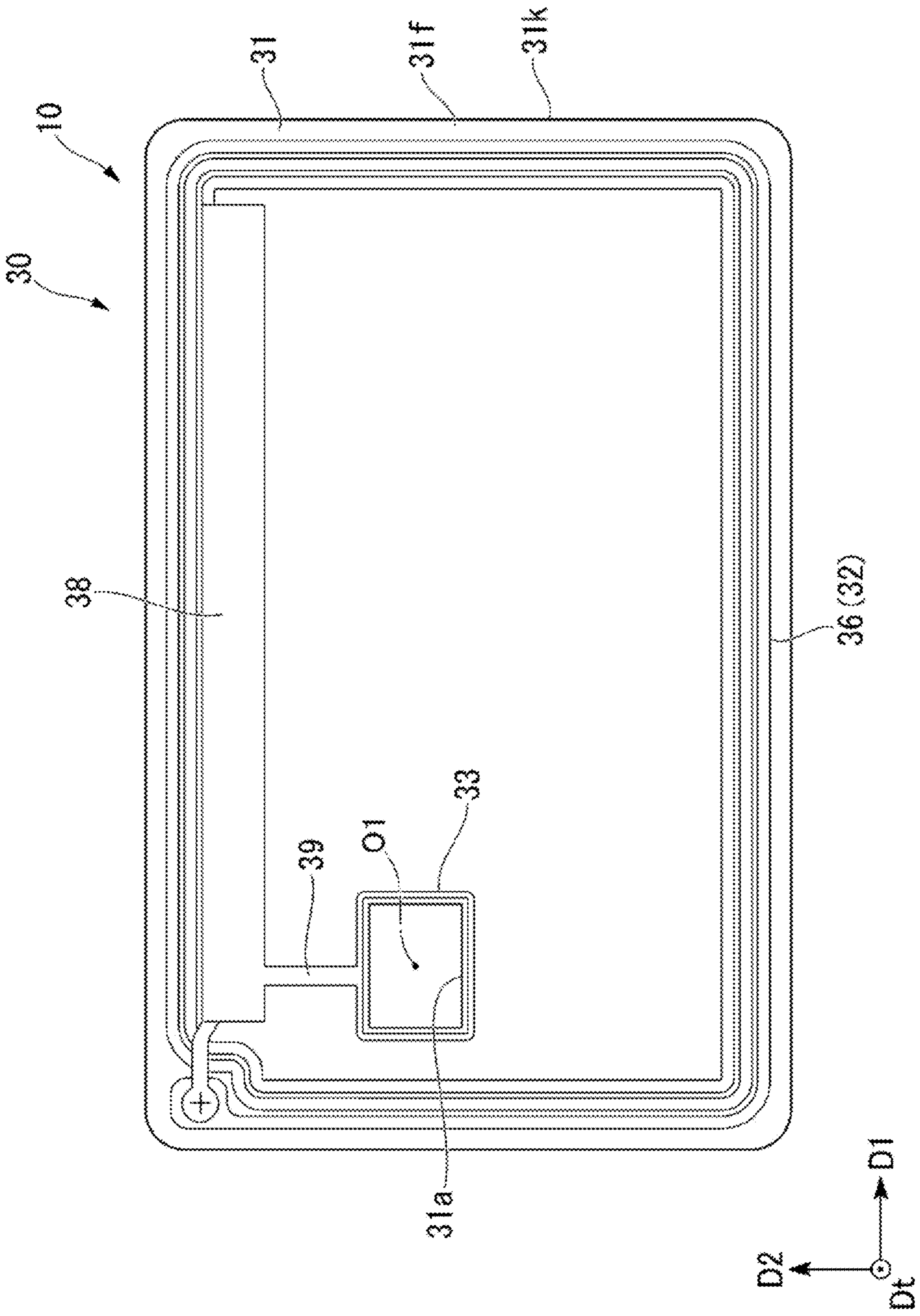
FIG. 4 is a plan view schematically illustrating an antenna substrate of the IC card.

FIG. 1 is a plan view schematically illustrating an IC card 10 according to a first embodiment. FIG. 2 is an exploded perspective view schematically illustrating the IC card 10. FIG. 3 is a cross-sectional view schematically illustrating the IC card 10 taken along the line III-III of FIG. 1. FIG. 4 is a plan view schematically illustrating an antenna substrate 30 of the IC card 10.

The IC card 10 of the present embodiment is a hybrid IC card (dual IC card) capable of both contact type communication and contactless type communication with an external device. In the present embodiment, the communication region of the contactless type communication is the HF band (13.56 MHz) generally used in the market. As shown in FIG. 1, the IC card 10 has a plate shape with the plate surface facing in the plate thickness direction Dt. The IC card 10 is formed in a rectangular shape with the long side extending in the first direction D1 as viewed in the plate thickness direction Dt. The IC card 10 is formed to have a thickness in the range of 680 μm or greater and 840 μm or less, as specified by ISO/IEC 7810. As shown in FIG. 2, the IC card 10 includes a card substrate 14, an antenna substrate 30 and an IC module 20. The IC module 20 of the present embodiment is a dual-interface electromagnetic coupling card module capable of both contact type communication and contactless type communication with an external device. Further, the IC module 20 of the present embodiment is a card module capable of authenticating the user's fingerprint information.

[Card Substrate 14]

The card substrate 14 is a substrate constituting the IC card 10. The card substrate 14 includes a first card substrate 15 and a second card substrate 16. The first card substrate 15 is located on the upper side (+Dt side) of the antenna substrate 30. A front surface **15*f* of the first card substrate 15 is a front surface 10*f* of the IC card 10. The second card substrate 16 is located on the lower side (−Dt side) of the antenna substrate 30. In the present embodiment, the card substrate 14 may be formed using a substrate such as polyvinyl chloride (PVC), polyurethane (PU), polyethylene terephthalate (PET), amorphous polyethylene terephthalate (PET-G), or the like. The card substrate 14 may be formed using a metal sheet, a magnetic material, or the like. The card substrate 14** may also be formed using a plastic material having high fluidity and insulation, such as a UV curing type or a mixed liquid reaction-curing type.

The shape of the card substrate 14, such as the external shape, can be made in accordance with card standards such as ISO/IEC 7810 as appropriate. The first card substrate 15 and the second card substrate 16 may be configured as a laminate of two or more layers. The card substrate 14 may also be provided with a magnetic layer, a protective layer, or the like, or may have a functional surface coating by a forming method such as thermal, thermal transfer or ink jet method. The front surface **15*f* of the first card substrate 15 is preferably translucent, colored transparent or colorless transparent. Further, the card substrate 14** may have fine linear projections or recesses.

The first card substrate 15 and the second card substrate 16 have a rectangular shape with the long side extending in the first direction D1. The first card substrate 15 and the second card substrate 16 have substantially the same shape as viewed in the plate thickness direction Dt. As shown in FIG. 3, the first card substrate 15 has a first aperture **15*a*, a first opening 15*b* and a hole 15*d*. The first aperture 15*a* is a hole recessed downward (−Dt side) from the front surface 15*f* of the first card substrate 15. The first aperture 15*a* may be formed, for example, by milling the first card substrate 15. As shown in FIG. 2, the first aperture 15*a* surrounds the center axis O1. The shape of the first aperture 15*a* viewed in the plate thickness direction Dt is not specifically limited, but in the present embodiment, it is formed in a substantially rectangular shape to match the shape of the IC module 20**.

As shown in FIG. 3, the first opening **15*b* penetrates a bottom wall 15*c* of the first aperture 15*a* in the plate thickness direction Dt. As shown in FIG. 2, the first opening 15*b* surrounds the center axis O1. The shape of the first opening 15*b* viewed in the plate thickness direction Dt is not specifically limited, but in the present embodiment, it is formed in a substantially rectangular shape. The dimensions of the first opening 15*b* in the first direction D1 and the second direction D2 are smaller than the dimensions of the first aperture 15*a* in the first direction D1 and the second direction D2, respectively. As shown in FIG. 3, the hole 15*d* penetrates the bottom wall 15*c* in the plate thickness direction Dt. The hole 15*d* surrounds the center axis O1. Although not shown, the shape of the hole 15*d*** viewed in the plate thickness direction Dt is formed in a substantially rectangular annular shape.

The second card substrate 16 has a second opening **16*a*. The second opening 16*a* penetrates the second card substrate 16 in the plate thickness direction Dt. The second opening 16*a* surrounds the center axis O1. As shown in FIG. 2, the shape of the second opening 16*a* viewed in the plate thickness direction Dt is not particularly limited, but in the present embodiment, it is formed in a substantially rectangular shape. The inner surface of the second opening 16*a* overlaps the inner surface of the first opening 15*b*** when viewed in the plate thickness direction Dt.

[Antenna Substrate 30]

In the present embodiment, the antenna substrate 30 is disposed between the first card substrate 15 and the second card substrate 16. As shown in FIG. 4, the antenna substrate 30 includes an antenna sheet 31, a booster antenna 32, a connection terminal 33 and a capacitor 38.

The antenna sheet 31 is a flexible insulating substrate. The antenna sheet 31 may be formed using a material, such as polyethylene terephthalate, polyethylene naphthalate, amorphous polyethylene terephthalate, polyvinyl chloride, vinyl chloride-vinyl acetate copolymer, polycarbonate, polyamide, polyimide, cellulose diacetate, cellulose triacetate, polystyrene-based materials, ABS, polyacrylate, polypropylene, polyethylene, polyurethane, polyimide, glass epoxy or phenolic resin. The antenna sheet 31 has an antenna hole **31*a***.

As shown in FIG. 3, the antenna hole **31*a* penetrates the antenna sheet 31 in the plate thickness direction Dt. The antenna hole 31*a* may be formed in the antenna sheet 31, for example, by milling. As shown in FIG. 4, the antenna hole 31*a* is formed in a substantially rectangular shape as viewed in the plate thickness direction Dt. As shown in FIG. 3, the inner surface of the antenna hole 31*a* overlaps the inner surface of the first opening 15*b* and the inner surface of the second opening 16*a***, when viewed in the plate thickness direction Dt.

As shown in FIG. 4, the connection terminal 33 is a terminal formed on a front surface **31*f*** of the antenna sheet

31. The connection terminal 33 is electrically conductive. The connection terminal 33 is formed in a substantially rectangular shape as viewed in the plate thickness direction Dt. The connection terminal 33 is disposed on the periphery of the antenna hole 31*a*. As shown in FIG. 3, the connection terminal 33 is disposed inside the hole 15*d* of the first card substrate 15. The surface of the connection terminal 33 facing upward is exposed to the inside of the first aperture 15*a* through the hole 15*d*. As shown in FIG. 4, the connection terminal 33 is electrically connected to the capacitor 38 via a connection wiring 39. Further, the connection terminal 33 is electrically connected to the booster antenna 32 via the connection wiring 39 and the capacitor 38.

The booster antenna 32 is an antenna pattern disposed on the front surface 31*f* of the antenna sheet 31. In the present embodiment, the booster antenna 32 is formed of an antenna coil 36. The antenna coil 36 is electrically connected to the connection terminal 33 and the capacitor 38, and performs contactless type communication with a contactless type external device such as a reader/writer. The antenna coil 36 is formed in a rectangular shape. The antenna coil 36 is formed in two or three turns along an edge 31*k* of the antenna sheet 31. The number of turns, the shape, the line width, and the like of the antenna coil 36 are not limited as long as contactless type communication with a contactless type external device is possible. The antenna coil 36 may be formed on a rear surface 31*g* of the antenna sheet 31. The antenna coil 36 may be formed on at least one of the front surface 31*f* and the rear surface 31*g* of the antenna sheet 31.

The method of producing the antenna coil 36 is not particularly limited, and the antenna coil 36 may be formed by various methods. Examples of the method of producing the antenna coil 36 include laser cutting or punching a metal plate or a metal foil, etching a metal foil or a metal layer, arranging metal wires. In the present embodiment, the antenna coil 36 is formed by etching an aluminum foil coated with a resist by general gravure printing.

The capacitor 38 may be, for example, a chip capacitor. The capacitor 38 forms a resonant circuit together with the antenna coil 36 and adjusts the resonant frequency. The capacitance of the capacitor 38 can be adjusted by changing the line width and length of the electrodes of the capacitor 38. The capacitor 38 can be formed by etching a copper foil or an aluminum foil coated with a resist by general gravure printing.

[IC Module 20]

Figure 5:
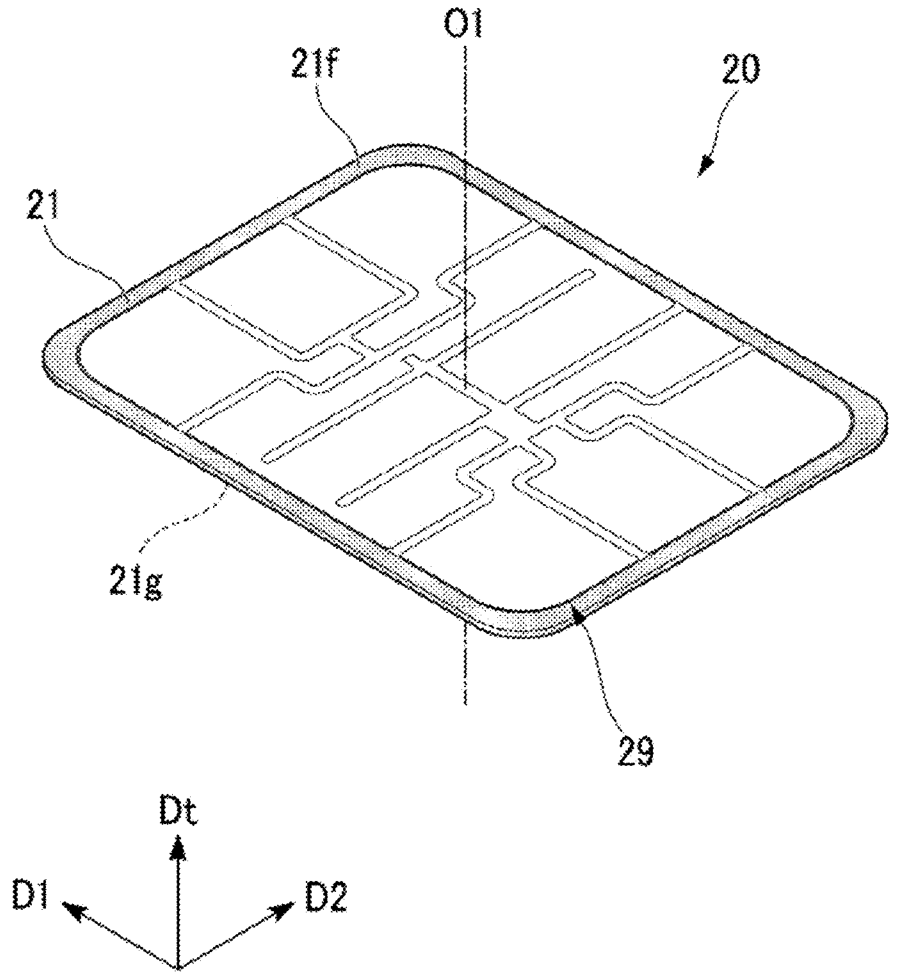
FIG. 5 is a perspective view of an IC module of the IC card as seen from above.
Figure 6:
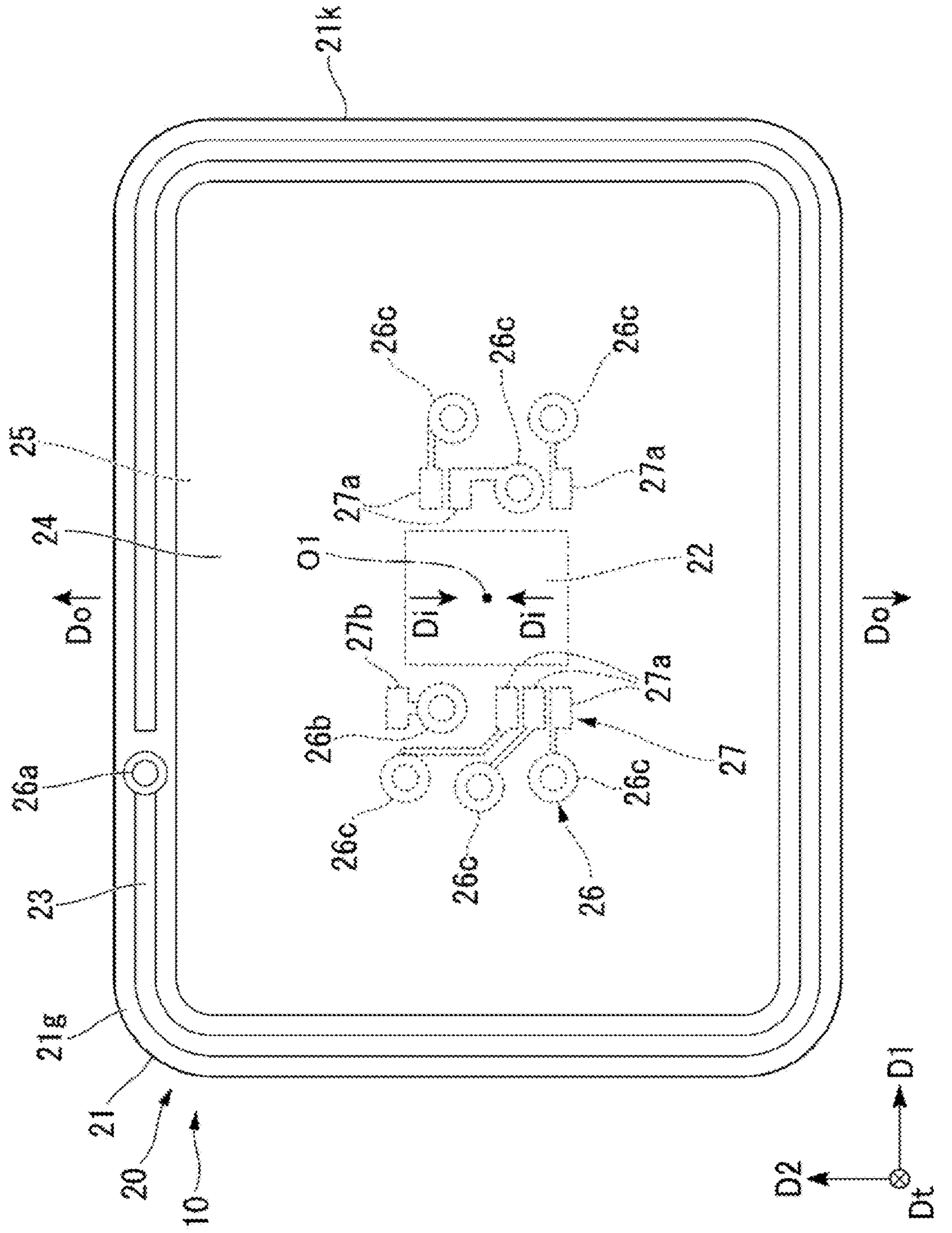
FIG. 6 is a plan view of an IC module of the IC card as seen from below.

FIG. 5 is a perspective view of the IC module 20 of the IC card 10 as seen from above (+Dt side). FIG. 6 is a plan view of the IC module 20 of the IC card 10 as seen from below (−Dt side).

As shown in FIG. 3, the IC module 20 is fitted into the first aperture 15*a* and the first opening 15*b* of the first card substrate 15, and the second opening 16*a* of the second card substrate 16. That is, the IC module 20 is fitted into the card substrate 14. The IC module 20 includes a substrate 21, an IC chip 22, a coupling portion 23, a fingerprint sensor 24, a holding portion 25, a first fixing portion 28*a*, a second fixing portion 28*b*, a contact terminal 29 and a resin sealing portion 50. As shown in FIG. 6, the IC module 20 includes a pad portion 27. As shown in FIG. 5, the IC module 20 has a rectangular shape with the long side extending in the first direction D1. The long side of the IC module 20 measures approximately 11.0 mm, and the short side of the IC module 20 measures approximately 8.0 mm. The IC module 20 of the present embodiment is a six-terminal IC module. The long side of the IC module 20 may be 12 mm or greater and 14 mm or less, and the short side of the IC module 20 may be 9 mm or greater and 11 mm or less. The thickness of the IC module 20 is set in the range of 680 μm or greater and 840 μm or less, as specified by ISO/IEC 7810. The IC module 20 may be an eight-terminal IC module.

As shown in FIG. 3, the IC module 20 is disposed with a slight gap from the inner surface of the first aperture 15*a* of the first card substrate 15, the inner surface of the first opening 15*b*, and the inner surface of the second opening 16*a* of the second card substrate 16. With this configuration, it is possible to prevent electric short circuit from occurring between the IC module 20 and the card substrate 14 even when the card substrate 14 is made of a conductive material such as a metal. Therefore, it is possible to prevent the IC card 10 from having a communication failure.

The substrate 21 has a sheet-like form extending in a direction perpendicular to the plate thickness direction Dt. In the present embodiment, the substrate 21 is a flexible substrate. As shown in FIG. 5, the substrate 21 is formed in a rectangular shape with the long side extending in the first direction D1 as viewed in the plate thickness direction Dt. The substrate 21 may be made of, for example, an insulating material such as glass epoxy or polyethylene terephthalate. In the present embodiment, the substrate 21 is formed to have a thickness in the range of 50 μm or greater and 200 μm or less. As shown in FIG. 3, the substrate 21 is disposed inside the first aperture 15*a*. The substrate 21 includes a first surface 21*f* and a second surface 21*g*. The first surface 21*f* is a surface facing the upper side (+Dt side), that is, the first side in the plate thickness direction Dt, among the outer surfaces of the substrate 21. The first surface 21*f* is the front surface of the substrate 21. The second surface 21*g* is a surface facing the lower side (−Dt side), that is, the second side in the plate thickness direction Dt, among the outer surfaces of the substrate 21. The second surface 21*g* is the rear surface of the substrate 21. The substrate 21 has a through hole 26.

The through hole 26 penetrates the substrate 21 in the plate thickness direction Dt and has a copper foil layer on the inner peripheral surface. As shown in FIG. 6, in the present embodiment, the through hole 26 includes a first through hole 26*a*, an inner through hole 26*b* and a plurality of relay through holes 26*c*. A conductive land portion is formed around each through hole and connected to each through hole. The first through hole 26*a* is disposed on the outer edge of the substrate 21. The first through hole 26*a* is electrically connected to one end of the coupling portion 23 via the land portion. Although not shown, the first through hole 26*a* is electrically connected to the contact terminal 29. Thus, the coupling portion 23 is electrically connected to the contact terminal 29.

The inner through hole 26*b* is disposed on the second side (−D1 side) of the IC chip 22 in the first direction D1. The inner through hole 26*b* is disposed on the inside (Di side) of the coupling portion 23. The inner through hole 26*b* is electrically connected to the contact terminal 29. The inner through hole 26*b* is electrically connected to the coupling portion 23 via the contact terminal 29 and the first through hole 26*a*.

The plurality of relay through holes 26*c* are connected to the contact terminal 29. In the present embodiment, six relay through holes 26*c* are provided in the substrate 21. Each relay through hole 26*c* is disposed on the inside (Di side) of the coupling portion 23.

The pad portion 27 is formed on the second surface 21*g* of the substrate 21. The pad portion 27 is electrically conductive. The pad portion 27 includes a plurality of relay pads 27*a* and a connection pad 27*b*. In the present embodiment, six relay pads 27*a* are formed. Each relay pad 27*a* electrically connects each relay through hole 26*c* to the IC chip 22. Each relay pad 27*a* is disposed on the inside (Di side) of the relay through hole 26*c*. Each relay pad 27*a* is electrically connected to a different relay through hole 26*c* via the connection wiring. Each relay pad 27*a* is electrically connected to a part of the plurality of electrodes of the IC chip 22 by wire bonding or the like. As described above, each relay through hole 26*c* is connected to the contact terminal 29. Thus, the contact terminal 29 is electrically connected to the IC chip 22. That is, the contact terminal 29 is electrically connected to the IC chip 22 via the plurality of relay through holes 26*c*. Therefore, the IC chip 22 can perform contact type communication with a contact type external device via the contact terminal 29.

The connection pad 27*b* electrically connects the inner through hole 26*b* to the IC chip 22. The connection pad 27*b* is electrically connected to the inner through hole 26*b* via the connection wiring. The connection pad 27*b* is electrically connected to a part of the plurality of electrodes of the IC chip 22 by wire bonding or the like. As described above, the inner through hole 26*b* is electrically connected to the contact terminal 29. Thus, the contact terminal 29 is electrically connected to the IC chip 22. That is, the contact terminal 29 is electrically connected to the IC chip 22 via the inner through hole 26*b*. As described above, the contact terminal 29 is electrically connected to the IC chip 22 via the plurality of relay through holes 26*c*. That is, the contact terminal 29 is electrically connected to the IC chip 22 via the through hole 26.

In the present embodiment, the IC chip 22 is a secure microcomputer. The IC chip 22 may have a known configuration having a contact type communication function and a contactless type communication function. Further, the IC chip 22 authenticates the user by comparing the user's fingerprint information acquired by the fingerprint sensor 24 with the fingerprint information stored in the IC chip 22, and outputs the authentication result to a contactless type external device or a contact type external device. The IC chip 22 is provided on the second surface 21*g* of the substrate 21. The IC chip 22 is provided in a portion of the second surface 21*g* on the inside (Di side) of the coupling portion 23. The IC chip 22 is disposed substantially at the center of the substrate 21 in the first direction D1 and the second direction D2 when viewed in the plate thickness direction Dt. The IC chip 22 includes a plurality of terminals (not shown). Each terminal of the IC chip 22 is electrically connected to each of the coupling portion 23, the fingerprint sensor 24 and the contact terminal 29 via the pad portion 27, wiring formed on the substrate 21, wires (not shown), and the like. Thus, the IC chip 22 is electrically connected to the coupling portion 23, the fingerprint sensor 24 and the contact terminal 29.

As shown in FIG. 5, the contact terminal 29 is provided on the first surface 21*f* of the substrate 21. The contact terminal 29 is configured to be contactable with a contact type external device. The contact terminal 29 is electrically conductive. The contact terminal 29 may be made of, for example, a metal such as gold, nickel or palladium. The contact terminal 29 is electrically connected to the IC chip 22 via the through hole 26, the pad portion 27, and the like. Therefore, the IC chip 22 can perform contact type communication with a contact type external device via the contact terminal 29.

The contact terminal 29 is composed of a plurality of terminals. In the present embodiment, the number of terminals used when the IC chip 22 performs contact type communication with a contact type external device is six. That is, the IC module 20 of the present embodiment is a six-terminal IC module. The number of terminals used when the IC chip 22 performs contact type communication with a contact type external device is not limited to six, but may be five or less, or seven or more.

As shown in FIG. 6, the coupling portion 23 is a terminal formed on the second surface 21*g* of the substrate 21. More specifically, as shown in FIG. 3, the coupling portion 23 is provided in a portion of the second surface 21*g* of the substrate 21 on the outside (Do side) of the holding portion 25. As shown in FIG. 6, the coupling portion 23 is formed so as to extend substantially the entire circumference of the substrate 21 along an outer edge 21*k*. One end of the coupling portion 23 is electrically connected to the first through hole 26*a* via the land portion. As described above, the inner through hole 26*b* is electrically connected to the first through hole 26*a*, and the inner through hole 26*b* is electrically connected to the IC chip 22. Thus, the coupling portion 23 is electrically connected to the IC chip 22.

The coupling portion 23 is fixed to the substrate 21 by an adhesive or the like (not shown). The coupling portion 23 may be formed, for example, on the second surface 21*g* by patterning a copper foil or an aluminum foil by etching. The coupling portion 23 can be formed to have a thickness in the range of 5 μm or greater and 50μm or less. In the present embodiment, the thickness of the coupling portion 23 is approximately 30 μm.

As shown in FIG. 3, when the IC module 20 is fitted into the card substrate 14, the coupling portion 23 comes into contact with the connection terminal 33 in the plate thickness direction Dt. Thus, the coupling portion 23 is electrically connected to the booster antenna 32 via the connection terminal 33. In the present embodiment, the coupling portion 23 is physically coupled to the booster antenna 32. Therefore, the IC chip 22 can perform contactless type communication with a contactless type external device via the coupling portion 23 and the booster antenna 32.

The holding portion 25 holds the fingerprint sensor 24. The holding portion 25 is disposed between the substrate 21 and the fingerprint sensor 24 in the plate thickness direction Dt. The holding portion 25 is fixed to the second surface 21*g* of the substrate 21 by the first fixing portion 28*a*. The holding portion 25 has a rectangular cylindrical shape protruding in the plate thickness direction Dt. The holding portion 25 protrudes downward from the substrate 21, that is, toward the second side (−Dt side) in the plate thickness direction Dt. The holding portion 25 is open on both the upper side (+Dt side) and the lower side (−Dt side). The holding portion 25 is disposed across the inside of the first opening 15*b* and the second opening 16*a*. The dimensions of the holding portion 25 in the first direction D1 and the second direction D2 are smaller than the dimensions of the substrate 21 in the first direction D1 and the second direction D2, respectively. The outer edge 21*k* of the substrate 21 surrounds the holding portion 25 when viewed in the plate thickness direction Dt. The holding portion 25 is made of a conductive material. Therefore, the holding portion 25 is electrically conductive. The holding portion 25 may be made of a metal or may be made of a conductive resin.

The fingerprint sensor 24 is a sensor that acquires the user's fingerprint information. In the present embodiment, the fingerprint sensor 24 is a capacitance sensor, and acquires the user's fingerprint information by acquiring the electrical potential of the user's finger. The thickness of the fingerprint sensor 24 is approximately 200 μm or greater and 250 μm or less. As shown in FIG. 6, when viewed in the plate thickness direction Dt, the fingerprint sensor 24 has a substantially rectangular shape with the long side extending in the first direction D1. As shown in FIG. 3, the fingerprint sensor 24 is fixed to the lower end of the holding portion 25 by the second fixing portion 28*b*. The fingerprint sensor 24 is disposed facing an IC chip 22 with a gap therebetween in the plate thickness direction Dt. The fingerprint sensor 24 has an acquisition portion 24*a* that acquires the electrical potential of the user's finger on the rear surface of the fingerprint sensor 24. The acquisition portion 24*a* is exposed to the outside of the IC card 10 through the second opening 16*a* of the second card substrate 16. This allows the user to easily touch the acquisition portion 24*a* with their finger, improving the convenience of the IC card 10. The outer edge of the fingerprint sensor 24 overlaps the outer edge of the holding portion 25 when viewed in the plate thickness direction Dt. As shown in FIG. 6, when viewed in the plate thickness direction Dt, the outer edge 21*k* of the substrate 21 surrounds the fingerprint sensor 24.

As described above, the first fixing portion 28*a* fixes the holding portion 25 to the substrate 21. Further, as described above, the second fixing portion 28*b* fixes the holding portion 25 to the fingerprint sensor 24. Thus, the fingerprint sensor 24 is fixed to the substrate 21. Therefore, the IC module 20 of the present embodiment is an integrated IC module including the IC chip 22, the contact terminal 29 and the fingerprint sensor 24. As shown in FIG. 3, when viewed in the plate thickness direction Dt, the IC chip 22, the contact terminal 29 and the fingerprint sensor 24 are disposed overlapping each other. Each of the first fixing portion 28*a* and the second fixing portion 28*b* is formed of solder. In the present embodiment, the first fixing portion 28*a* and the second fixing portion 28*b* are formed of solders having different melting points from each other. Each of the first fixing portion 28*a* and the second fixing portion 28*b* is electrically conductive. As described above, the holding portion 25 is electrically conductive. Therefore, the fingerprint sensor 24 is electrically connected to the IC chip 22 via the second fixing portion 28*b*, the holding portion 25 and the first fixing portion 28*a*. That is, the fingerprint sensor 24 is electrically connected to the IC chip 22 via the holding portion 25.

The resin sealing portion 50 covers the IC chip 22 and the pad portion 27 shown in FIG. 6, and wires (not shown). As shown in FIG. 3, the resin sealing portion 50 is disposed in a space formed by the substrate 21, the first fixing portion 28*a*, the holding portion 25, the second fixing portion 28*b* and the fingerprint sensor 24. The resin sealing portion 50 is made of a resin. The resin sealing portion 50 has insulating properties. The resin sealing portion 50 may be made of, for example, a known epoxy resin, an ultraviolet curing resin or a thermosetting resin.

An adhesive layer 41 is disposed between the substrate 21 and the contact terminal 29 in the plate thickness direction Dt. The adhesive layer 41 bonds the substrate 21 and the contact terminal 29 to each other. The adhesive layer 41 is an insulator formed by applying an adhesive to the first surface 21*f* of the substrate 21 or by laminating an adhesive sheet. The adhesive layer 41 is formed of a material such as polyvinyl acetate resin, ethylene-vinyl acetate copolymer resin, vinyl chloride-vinyl acetate copolymer resin, acrylic resin, polyester resin, polyamide resin, polyurethane resin or nitrocellulose. The adhesive layer 41 is provided with a plurality of adhesive layer holes 41*a* that penetrate the adhesive layer 41 in the plate thickness direction Dt. The respective adhesive layer holes 41*a* overlap the through holes 26 of the substrate 21 when viewed in the plate thickness direction Dt.

The first card substrate 15 and the antenna substrate 30 are fixed together by an adhesive layer (not shown). The second card substrate 16 and the antenna substrate 30 are fixed together by an adhesive layer (not shown). Thus, the first card substrate 15 and the second card substrate 16 are fixed to each other via the antenna substrate 30.

The IC card 10 is formed by integrating the antenna substrate 30, the card substrate 14 laminated on the antenna substrate 30, and the IC module 20 inserted from the upper side (+Dt side) of the card substrate 14, by thermal pressure lamination, adhesion, or the like, and then punching it into a card shape.

According to the present embodiment, the IC module 20 includes the substrate 21 having the through hole 26 penetrating in the plate thickness direction Dt, the contact terminal 29 provided on the first surface 21*f* of the substrate 21 facing the upper side (+Dt side), that is, the first side in the plate thickness direction Dt, the IC chip 22 provided on the second surface 21*g* of the substrate 21 facing the lower side (−Dt side), that is, the second side in the plate thickness direction Dt, the holding portion 25 fixed to the substrate 21 and projecting downward from the substrate 21, and the fingerprint sensor 24 fixed to the holding portion 25 and disposed facing the IC chip 22 with a gap therebetween in the plate thickness direction Dt. The contact terminal 29 is electrically connected to the IC chip 22 via the through hole 26, and the fingerprint sensor 24 is electrically connected to the IC chip 22 via the holding portion 25. If the IC card 10 provided with the fingerprint sensor 24 has a configuration in which the contact terminal 29, the fingerprint sensor 24 and the IC chip 22 are each separately mounted on the card substrate 14, it is necessary to provide a wiring mechanism for electrically connecting the contact terminal 29, the fingerprint sensor 24 and the IC chip 22. This requires connecting the wiring mechanism to each of the contact terminal 29, the fingerprint sensor 24 and the IC chip 22 in the production process of the IC card 10, increasing the number of production steps and production costs of the IC card 10. In contrast, in the present embodiment, an integrated IC module 20 can be formed in which the contact terminal 29 and the fingerprint sensor 24 are each electrically connected to the IC chip 22. Therefore, the IC card 10 can be formed by a simple operation of inserting the IC module 20 into the card substrate 14, suppressing an increase in the number of production steps and production costs of the IC card 10 having a fingerprint authentication function.

Further, in the IC card 10 provided with the fingerprint sensor 24, the fingerprint sensor 24 has a large number of terminals, which increases the number of terminals of the IC chip 22. Therefore, when the contact terminal 29, the fingerprint sensor 24 and the IC chip 22 are mounted on the substrate using an anisotropic conductive film (ACF), if a force is applied to the anisotropic conductive film due to bending of the IC card 10 or the like, the anisotropic conductive film is likely to be peeled off, causing the IC card 10 to be unable to communicate. In contrast, in the present embodiment, since the contact terminal 29 is electrically connected to the IC chip 22 via the through hole 26, the electrical connection between the contact terminal 29 and the IC chip 22 can be stabilized. Further, in the present embodiment, since the fingerprint sensor 24 is electrically connected to the IC chip 22 via holding portion 25, the electrical connection between the fingerprint sensor 24 and the IC chip 22 can be stabilized. As a result, even when the IC card 10 is bent, the electrical connection between the contact terminal 29 and the IC chip 22 and between the fingerprint sensor 24 and the IC chip 22 can be stabilized. Therefore, the stability of the communication performance of the IC card 10 can be enhanced.

According to the present embodiment, the holding portion 25 is made of a conductive material. If the holding portion 25 is made of an insulating material, a wiring mechanism for electrically connecting the fingerprint sensor 24 to the IC chip 22 needs to be provided separately from the holding portion 25. This increases the number of components of the IC module 20. In contrast, in the present embodiment, since the fingerprint sensor 24 can be electrically connected to the IC chip 22 via the holding portion 25, it is not necessary to provide such a wiring mechanism separately from the holding portion 25. Therefore, an increase in the number of components of the IC module 20 can be suppressed. Further, the work of connecting the wiring mechanism to the fingerprint sensor 24 and the IC chip 22 becomes unnecessary. Therefore, an increase in the number of production steps and production costs of the IC module 20 and the IC card 10 can be suppressed.

According to the present embodiment, the IC module 20 includes the first fixing portion 28*a* that fixes the holding portion 25 to the substrate 21 and the second fixing portion 28*b* that fixes the holding portion 25 to the fingerprint sensor 24, and the first fixing portion 28*a* and the second fixing portion 28*b* are formed of solders having different melting points from each other. Therefore, in the production process of the IC module 20, when the fingerprint sensor 24 is fixed to the holding portion 25 by the second fixing portion 28*b* and then the holding portion 25 is fixed to the substrate 21 by the first fixing portion 28*a*, the melting point of the second fixing portion 28*b* can be set to a temperature higher than the melting point of the first fixing portion 28*a* to prevent the position of the fingerprint sensor 24 from being shifted relative to the holding portion 25 and prevent the fingerprint sensor 24 from being detached from the holding portion 25 due to melting of the second fixing portion 28*b* during the fixation of the holding portion 25 to the substrate 21. Therefore, the holding portion 25 and the fingerprint sensor 24 can be easily fixed to the substrate 21, and thus an increase in the number of production steps and production costs of the IC module 20 and the IC card 10 can be suppressed.

Further, in the present embodiment, in the production process of the IC module 20, when the holding portion 25 is fixed to the substrate 21 by the first fixing portion 28*a* and then the fingerprint sensor 24 is fixed to the holding portion 25 by the second fixing portion 28*b*, the melting point of the second fixing portion 28*b* can be set to a temperature lower than the melting point of the first fixing portion 28*a* to prevent the position of the holding portion 25 from being shifted relative to the substrate 21 and prevent the holding portion 25 from being detached from the substrate 21 due to melting of the first fixing portion 28*a* during the fixation of the fingerprint sensor 24 to the holding portion 25. Therefore, the holding portion 25 and the fingerprint sensor 24 can be easily fixed to the substrate 21, and thus an increase in the number of production steps and production costs of the IC module 20 and the IC card 10 can be suppressed.

Further, in the present embodiment, the first fixing portion 28*a* and the second fixing portion 28*b* are each made of solder, making it possible to firmly fix the fingerprint sensor 24 to the substrate 21 via the holding portion 25. Therefore, even when the IC card 10 is bent, the electrical connection between the fingerprint sensor 24 and the IC chip 22 can be stabilized, and thus the stability of the communication performance of the IC card 10 can be further enhanced.

According to the present embodiment, the IC module 20 includes the resin sealing portion 50 made of resin, and the resin sealing portion 50 covers the IC chip 22. Accordingly, the resin sealing portion 50 can protect the IC chip 22 from external force loads and environmental loads, and can prevent breakage of wires connected to the terminals of the IC chip 22. Therefore, the electrical connection between the IC chip 22 and the contact terminal 29 and between the IC chip 22 and the fingerprint sensor 24 can be more suitably stabilized, and thus the stability of the communication performance of the IC card 10 can be more suitably enhanced.

According to the present embodiment, the IC module 20 includes the coupling portion 23 electrically connected to the IC chip 22, the outer edge 21*k* of the substrate 21 surrounds the holding portion 25 and the fingerprint sensor 24 when viewed in the plate thickness direction Dt, and the coupling portion 23 is provided in a portion of the second surface 21*g* of the substrate 21 on the outside (Do side) of the holding portion 25. Therefore, in the production process of the IC card 10, the coupling portion 23 can be brought into contact with the connection terminal 33 of the antenna substrate 30 by a simple operation of inserting the IC module 20 into the card substrate 14 from the upper side (+Dt side) and fitting it into the card substrate 14. Since the coupling portion 23 and the booster antenna 32 can be easily physically coupled to each other via the connection terminal 33, an increase in the number of production steps and production costs of the IC card 10 can be suppressed.

According to the present embodiment, the IC card 10 includes the IC module 20, the card substrate 14 into which the IC module 20 is fitted, and the antenna substrate 30 having the booster antenna 32 electrically connected to the coupling portion 23. Therefore, the IC chip 22 can perform contact type communication with a contact type external device via the contact terminal 29, and can perform contactless type communication with a contactless type external device via the booster antenna 32. Therefore, it is possible to suppress an increase in the number of production steps and production costs of the IC card 10 capable of performing both contact type communication and contactless type communication and having a fingerprint authentication function.

According to the present embodiment, the antenna substrate 30 includes the connection terminal 33 electrically connected to the booster antenna 32, and the coupling portion 23 is a terminal in contact with the connection terminal 33. This allows the coupling portion 23 and the booster antenna 32 to be physically coupled to each other via the connection terminal 33. Therefore, since the IC chip 22 can be electrically connected to the booster antenna 32, the IC card 10 can perform contactless type communication with a contactless type external device.

Second Embodiment

Next, a second embodiment of the present invention will be described with reference to FIGS. 7 to 9. In the following description, components that are common to those in the first embodiment are denoted by the same reference signs, and duplicated description thereof will be omitted. The following description will be given focusing on the differences from the first embodiment.

Figure 7:
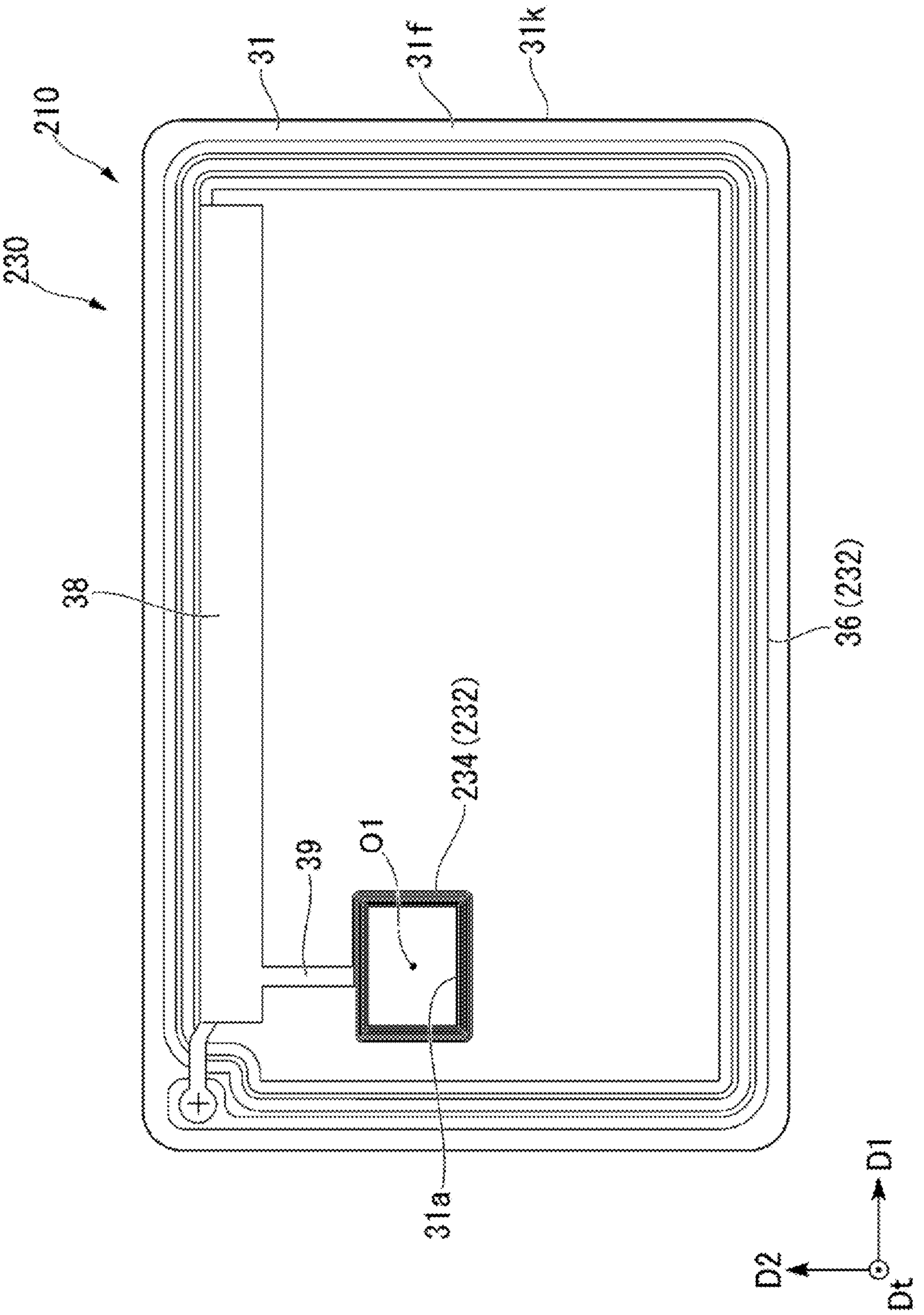
FIG. 7 is a plan view schematically illustrating an antenna substrate of an IC card according to a second embodiment of the present invention.

FIG. 7 is a plan view schematically illustrating an antenna substrate 230 of an IC card 210 according to the present embodiment. FIG. 8 is a cross-sectional view schematically illustrating the IC card 210. FIG. 9 is a plan view of an IC module 220 of the IC card 210 as seen from below.

As shown in FIG. 7, in the present embodiment, the antenna substrate 230 includes an antenna sheet 31, a booster antenna 232 and a capacitor 38. The booster antenna 232 includes a coupling coil 234 and an antenna coil 36.

The coupling coil 234 is formed on a front surface 31*f* of the antenna sheet 31. The coupling coil 234 has a rectangular shape surrounding the center axis O1. The coupling coil 234 is formed in a spiral shape having two or more turns. The coupling coil 234 is electrically connected to the capacitor 38 and the antenna coil 36 via a connection wiring 39. As shown in FIG. 8, the coupling coil 234 is disposed inside a bottom wall 15*c* of a first card substrate 15.

Figure 8:
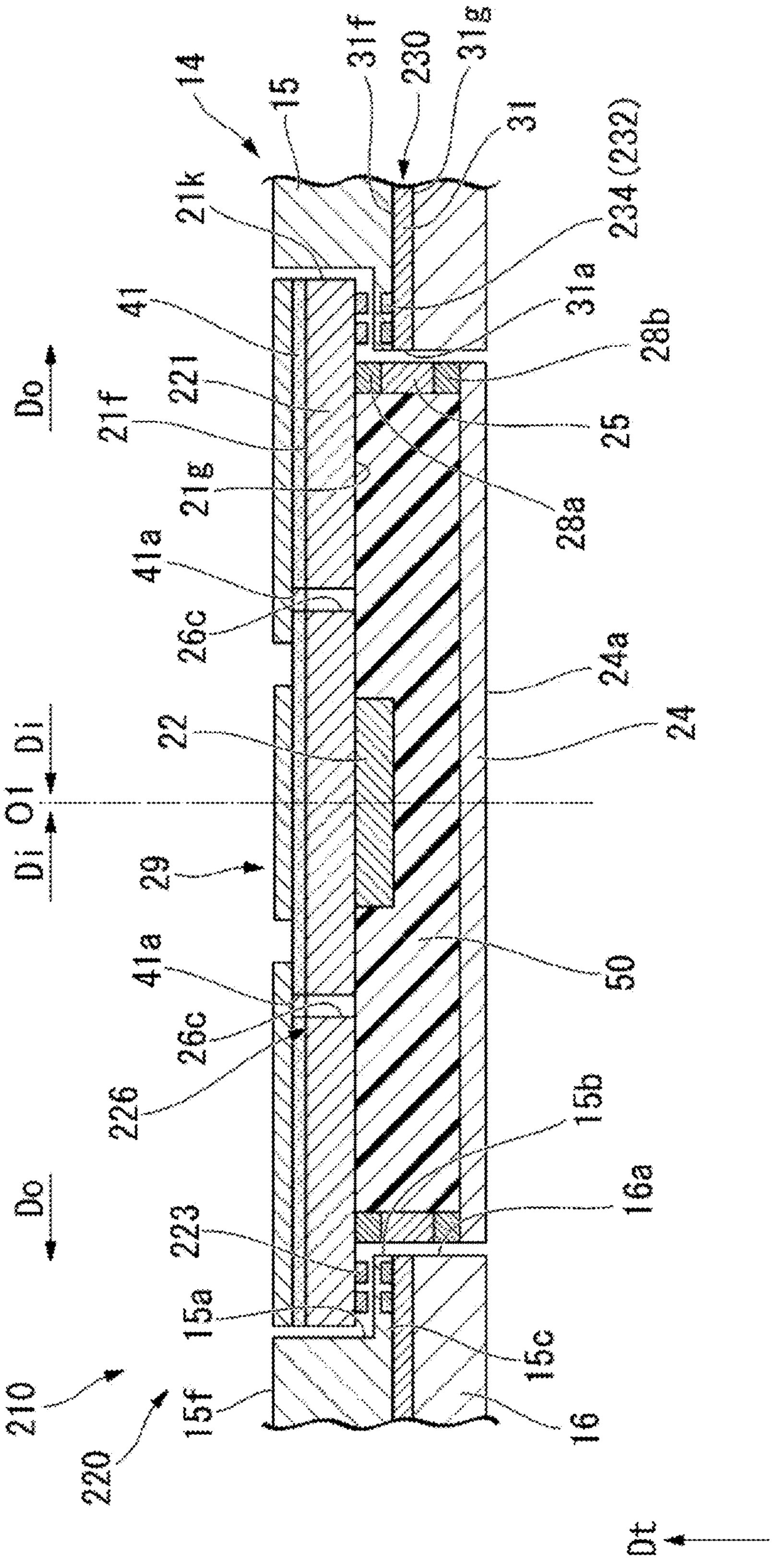
FIG. 8 is a cross-sectional view schematically illustrating the IC card.

As shown in FIG. 8, in the present embodiment, the IC module 220 includes a substrate 221, an IC chip 22, a coupling portion 223, a fingerprint sensor 24, a holding portion 25, a first fixing portion 28*a*, a second fixing portion 28*b*, a contact terminal 29 and a resin sealing portion 50. As shown in FIG. 9, the IC module 220 includes a pad portion 27.

In the present embodiment, the coupling portion 223 is a coil formed on a second surface 21*g* of the substrate 221. The coupling portion 223 extends along an outer edge 21*k* of the substrate 221 and is formed in a substantially rectangular shape. The coupling portion 223 is formed of a coil wire wound in a spiral shape. In the present embodiment, the coupling portion 223 is formed by a coil wire wound about twice in a substantially rectangular shape. As shown in FIG. 8, the coupling portion 223 is provided in a portion of the second surface 21*g* of the substrate 221 on the outside (Do side) of the holding portion 25. The coupling portion 223 faces the coupling coil 234 of the antenna substrate 230 with a gap therebetween in the plate thickness direction Dt. Thus, the coupling portion 223 can be electromagnetically coupled to the booster antenna 232.

The coupling portion 223 is fixed to the second surface 21*g* of the substrate 221 via an adhesive or the like (not shown). The coupling portion 223 may be formed, for example, on the second surface 21*g* by patterning a copper foil or an aluminum foil by etching. The coupling portion 223 can be formed to have a thickness in the range of 5 μm or greater and 50 μm or less. In the present embodiment, the thickness of the coupling portion 223 is approximately 30 μm.

Figure 9:
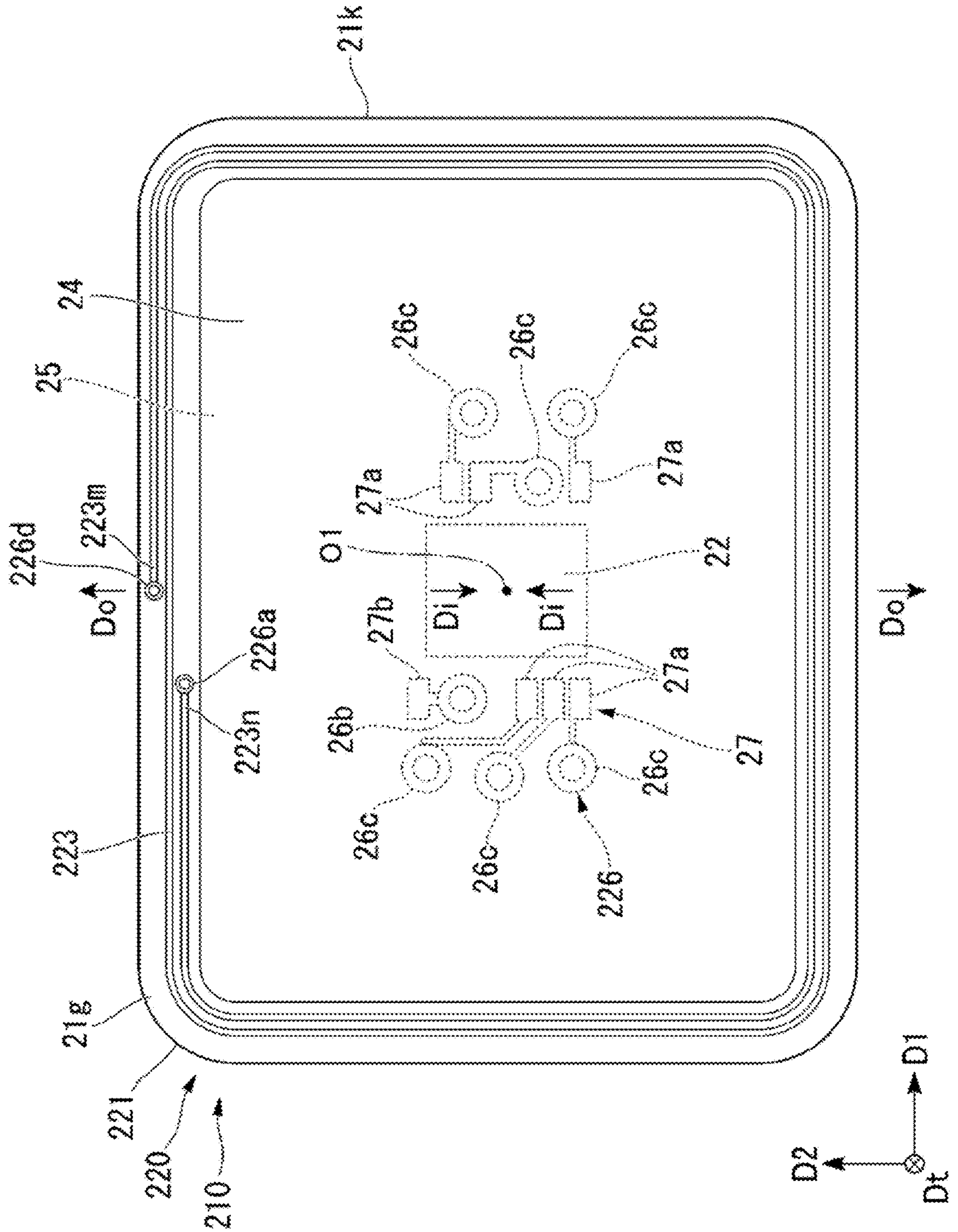
FIG. 9 is a plan view of an IC module of the IC card as seen from below.

As shown in FIG. 9, the substrate 221 has a through hole 226. Other configurations and the like of the substrate 221 are the same as those of the substrate 21 of the first embodiment described above. The through hole 226 penetrates the substrate 221 in the plate thickness direction Dt and has a copper foil layer on the inner peripheral surface. In the present embodiment, the through hole 226 includes a first through hole 226*a*, an inner through hole 26*b*, a plurality of relay through holes 26*c*, and a second through hole 226*d*. A conductive land portion is formed around each through hole and connected to each through hole.

The first through hole 226*a* is electrically connected to an innermost end 223*n* of the coupling portion 223 via the land portion. Although not shown, the first through hole 226*a* is electrically connected to the contact terminal 29. The first through hole 226*a* is electrically connected to the IC chip 22 via the contact terminal 29, the inner through hole 26*b* and a connection pad 27*b*. Thus, the coupling portion 223 is electrically connected to the IC chip 22. As described above, the coupling portion 223 can be electromagnetically coupled to the booster antenna 232. Therefore, the IC chip 22 can perform contactless type communication with a contactless type external device via the coupling portion 223 and the booster antenna 232. The second through hole 226*d* is electrically connected to an outermost end 223*m* of the coupling portion 223 via the land portion. Although not shown, the second through hole 226*d* is electrically connected to the contact terminal 29.

According to the present embodiment, the coupling portion 223 is a coil that can be electromagnetically coupled to the booster antenna 232. Therefore, since the IC chip 22 can be electrically connected to the booster antenna 232 via the coupling portion 223, the IC card 210 can perform contactless type communication with a contactless type external device.

Further, in the present embodiment, the contact terminal 29 is electrically connected to the IC chip 22 via the through hole 226, and the fingerprint sensor 24 is electrically connected to the IC chip 22 via the holding portion 25. As a result, as in the first embodiment, it is possible to form an integrated IC module 220 in which the contact terminal 29 and the fingerprint sensor 24 are each electrically connected to the IC chip 22. Therefore, the IC card 210 can be formed by a simple operation of inserting the IC module 220 into a card substrate 14, suppressing an increase in the number of production steps and production costs of the IC card 210 having a fingerprint authentication function.

Further, in the present embodiment, as in the first embodiment, the outer edge 21*k* of the substrate 221 surrounds the holding portion 25 and the fingerprint sensor 24 when viewed in the plate thickness direction Dt, and the coupling portion 223 is provided in a portion of the second surface 21*g* of the substrate 221 on the outside (Do side) of the holding portion 25. As a result, in the production process of the IC card 210, the coupling portion 223 and the coupling coil 234 of the antenna substrate 230 can be disposed facing each other in the plate thickness direction Dt by a simple operation of inserting the IC module 220 into the card substrate 14 from the upper side (+Dt side) and fitting it into the card substrate 14. Therefore, an increase in the number of production steps and production costs of the IC card 210 can be suppressed.

Third Embodiment

Next, a third embodiment of the present invention will be described with reference to FIG. 10. In the following description, components that are common to those in the first embodiment are denoted by the same reference signs, and duplicated description thereof will be omitted. The following description will be given focusing on the differences from the first embodiment.

Figure 10:
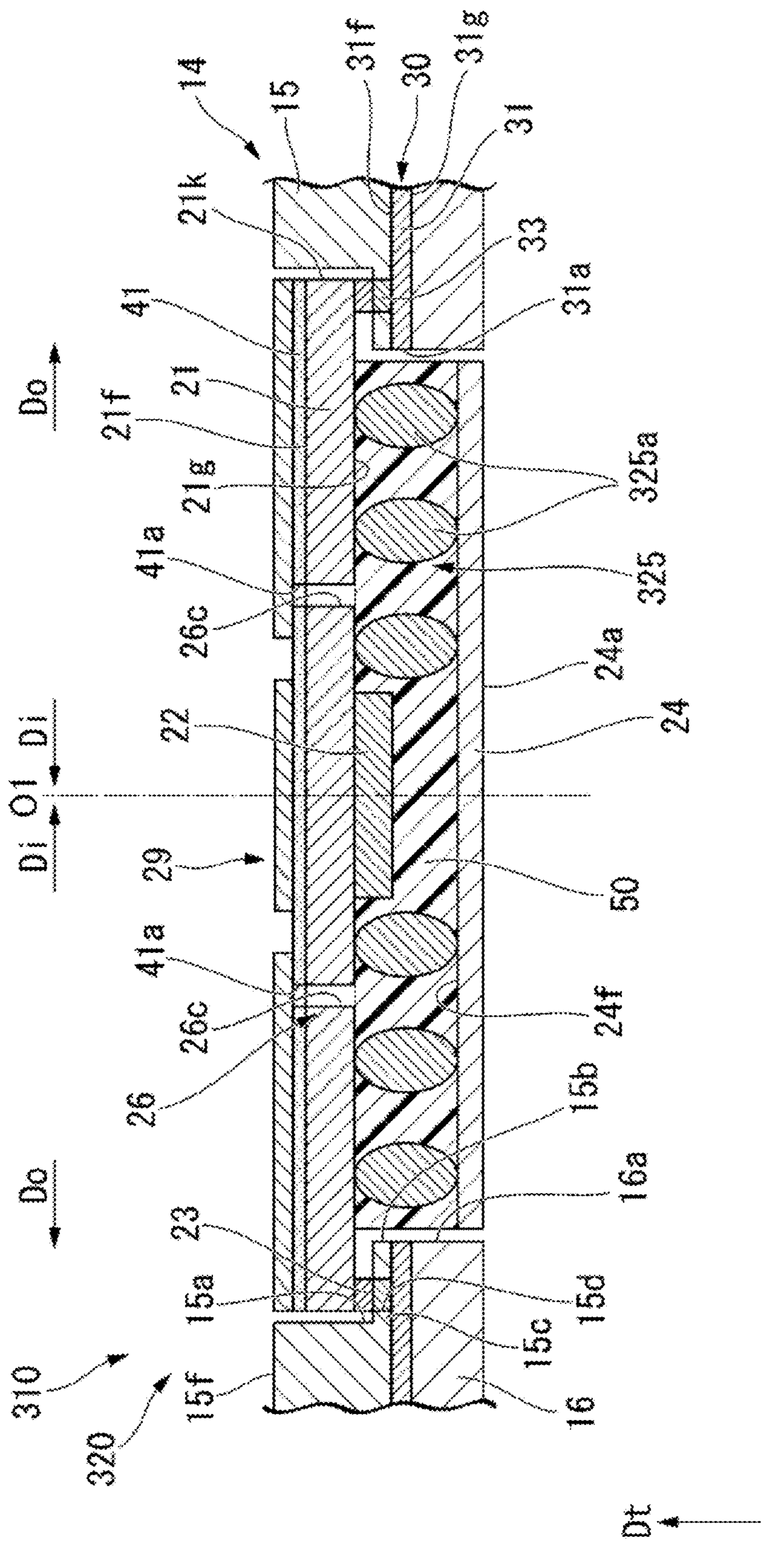
FIG. 10 is a cross-sectional view schematically illustrating an IC card according to a third embodiment of the present invention.

FIG. 10 is a cross-sectional view schematically illustrating an IC card 310 according to the third embodiment.

In the present embodiment, a holding portion 325 provided in an IC module 320 is a copper core solder ball 325*a*. In the present embodiment, the holding portion 325 is composed of a plurality of copper core solder balls 325*a*. The holding portion 325 is disposed between a substrate 21 and a fingerprint sensor 24 in the plate thickness direction Dt. The holding portion 325 is fixed to a second surface 21*g* of the substrate 21 and a front surface 24*f* of the fingerprint sensor 24. Thus, the fingerprint sensor 24 is fixed to the second surface 21*g* of the substrate 21 via the holding portion 325. Further, the holding portion 325 holds the fingerprint sensor 24. The holding portion 325 protrudes downward from the substrate 21, that is, toward the second side (−Dt side) in the plate thickness direction Dt. Thus, the fingerprint sensor 24 is disposed facing the IC chip 22 with a gap therebetween in the plate thickness direction Dt. The holding portion 325 is disposed inside the first opening 15*b* and the second opening 16*a*. Although not shown, the outer edge 21*k* of the substrate 21 surrounds the holding portion 325 when viewed in the plate thickness direction Dt. Each copper core solder ball 325*a* is electrically conductive. The holding portion 325 is made of a conductive material. Therefore, the fingerprint sensor 24 is electrically connected to the IC chip 22 via the holding portion 325.

According to the present embodiment, the holding portion 325 is composed of the copper core solder balls 325*a*. Therefore, when the fingerprint sensor 24 is fixed to the substrate 21 in the production process of the IC module 320, the fingerprint sensor 24 is pressed against the substrate 21 while the copper core solder balls 325*a* disposed between the fingerprint sensor 24 and the substrate 21 are heated and melted. In this operation, the dimension of the heated and melted copper core solder balls 325*a* in the plate thickness direction Dt varies, making it possible to adjust the dimension of the holding portion 325 in the plate thickness direction Dt. Thus, the distance between the fingerprint sensor 24 and the substrate 21 in the plate thickness direction Dt can be easily adjusted. Therefore, the thickness of the IC module 320 can be easily set in the range specified by ISO/IEC 7810, and thus the yield of the IC module 320 can be suitably increased.

Further, in the present embodiment, the holding portion 325 is made of a conductive material. Therefore, as in the first embodiment, since the fingerprint sensor 24 can be electrically connected to the IC chip 22 via the holding portion 325, it is not necessary to provide a wiring mechanism for electrically connecting the fingerprint sensor 24 to the IC chip 22 separately from the holding portion 25. Therefore, an increase in the number of components of the IC module 320 can be suppressed. Further, the work of connecting such a wiring mechanism to the fingerprint sensor 24 and the IC chip 22 is no longer necessary. Therefore, an increase in the number of production steps and production costs of the IC module 320 and the IC card 310 can be suppressed.

Fourth Embodiment

Next, a fourth embodiment of the present invention will be described with reference to FIG. 11. In the following description, components that are common to those in the second embodiment are denoted by the same reference signs, and duplicated description thereof will be omitted. The following description will be given focusing on the differences from the second embodiment.

Figure 11:
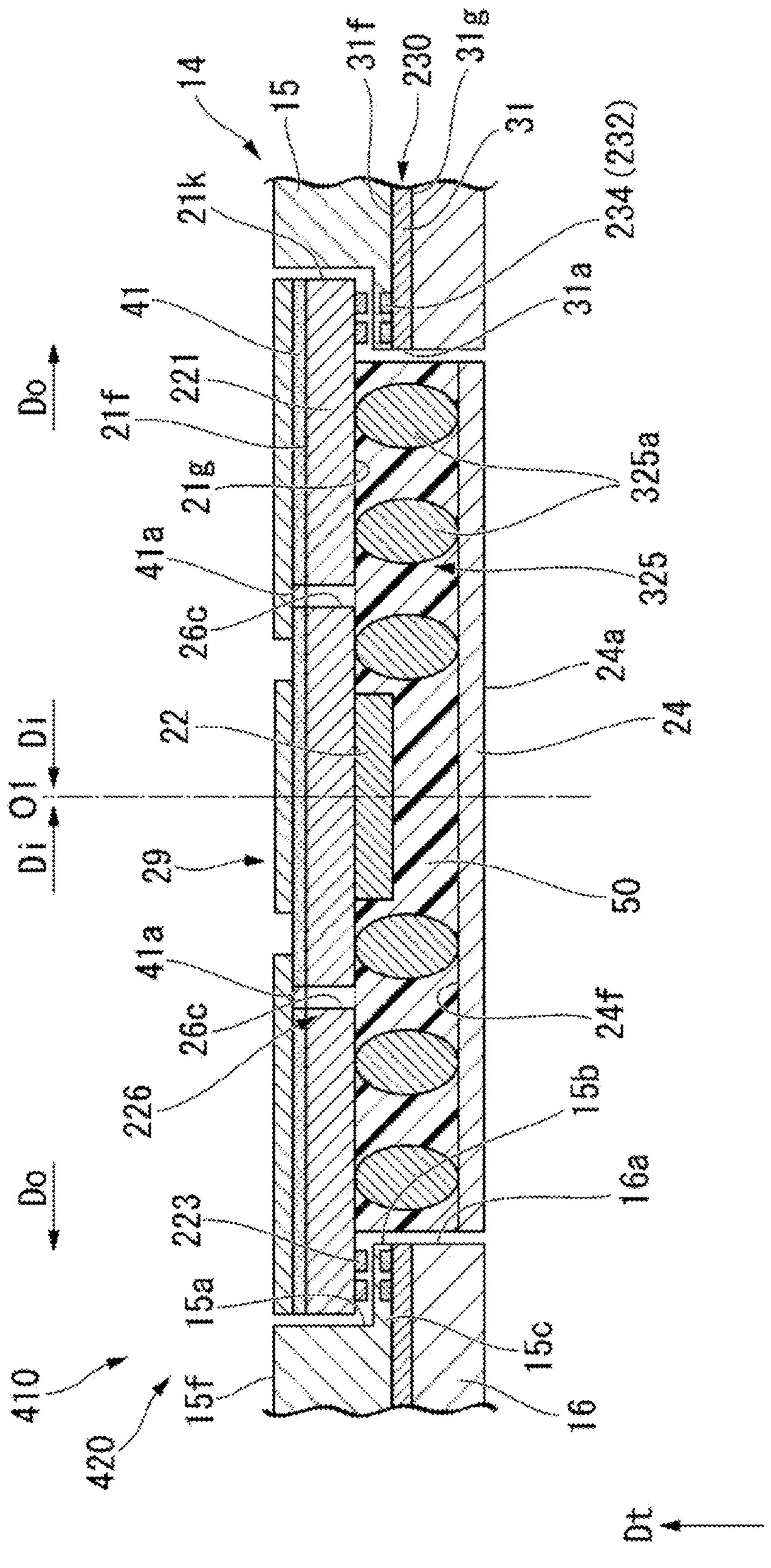
FIG. 11 is a cross-sectional view schematically illustrating an IC card according to a fourth embodiment of the present invention.

FIG. 11 is a cross-sectional view schematically illustrating an IC card 410 according to the fourth embodiment.

In the present embodiment, a holding portion 325 provided in an IC module 420 is a copper core solder ball 325*a*. The configuration and the like of the holding portion 325 of the present embodiment are the same as those of the holding portion 325 of the third embodiment described above. That is, the holding portion 325 is composed of a plurality of copper core solder balls 325*a*. The fingerprint sensor 24 is fixed to a second surface 21*g* of a substrate 221 via the holding portion 325. The fingerprint sensor 24 is disposed facing an IC chip 22 with a gap therebetween in the plate thickness direction Dt. Each copper core solder ball 325*a* is electrically conductive. Thus, the fingerprint sensor 24 is electrically connected to the IC chip 22 via the holding portion 325.

According to the present embodiment, as in the third embodiment, when the fingerprint sensor 24 is fixed to the substrate 221 in the production process of the IC module 420, the distance between the fingerprint sensor 24 and the substrate 221 in the plate thickness direction Dt can be easily adjusted by adjusting the dimension of the holding portion 325 in the plate thickness direction Dt. Therefore, the thickness of the IC module 420 can be easily set in the range specified by ISO/IEC 7810, and thus the yield of the IC module 420 can be suitably increased.

Fifth Embodiment

Next, a fifth embodiment of the present invention will be described with reference to FIG. 12. In the following description, components that are common to those in the first embodiment are denoted by the same reference signs, and duplicated description thereof will be omitted. The following description will be given focusing on the differences from the first embodiment.

Figure 12:
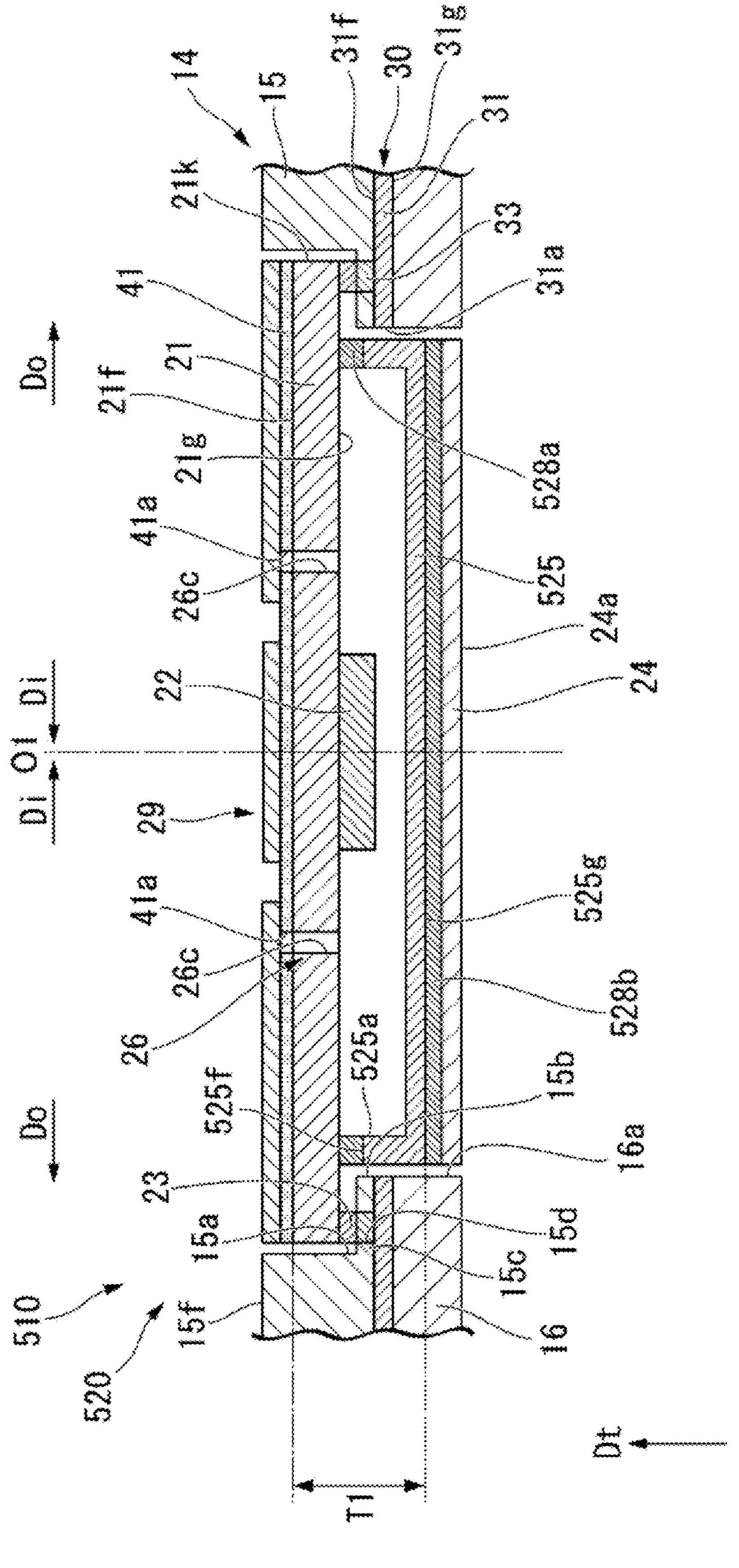
FIG. 12 is a cross-sectional view schematically illustrating an IC card according to a fifth embodiment of the present invention.

FIG. 12 is a cross-sectional view schematically illustrating an IC card 510 according to the fifth embodiment.

In the present embodiment, an IC module 520 includes a substrate 21, an IC chip 22, a coupling portion 23, a fingerprint sensor 24, a holding portion 525, a first fixing portion 528*a*, a second fixing portion 528*b*, a contact terminal 29, a resin sealing portion 50 and a pad portion 27 (not shown).

The holding portion 525 of the present embodiment is a substrate. The holding portion 525 may be made of, for example, an insulating material such as glass epoxy or polyethylene terephthalate. The holding portion 525 is provided with wiring (not shown). The holding portion 525 extends in a direction perpendicular to the plate thickness direction Dt. The holding portion 525 is a rectangular shape with the long side extending in the first direction D1 when viewed in the plate thickness direction Dt. The holding portion 525 is disposed inside a first opening 15*b* and a second opening 16*a*. Although not shown, the dimensions of the holding portion 525 in the first direction D1 and the second direction D2 are smaller than the dimensions of the substrate 21 in the first direction D1 and the second direction D2, respectively. An outer edge 21*k* of the substrate 21 surrounds the holding portion 525 when viewed in the plate thickness direction Dt. The holding portion 525 is disposed between the substrate 21 and the fingerprint sensor 24 in the plate thickness direction Dt. The holding portion 525 is fixed to a second surface 21*g* of the substrate 21 by the first fixing portion 528*a*. The holding portion 525 protrudes downward from the substrate 21, that is, toward the second side (−Dt side) in the plate thickness direction Dt. The fingerprint sensor 24 is mounted on a rear surface 525*g* of the holding portion 525. The fingerprint sensor 24 is fixed to holding portion 525 by the second fixing portion 528*b*. The holding portion 525 is provided with a recess 525*a*.

The recess 525*a* is a hole recessed downward (−Dt side), that is, toward the second side in the plate thickness direction Dt, from a front a surface 525*f* of the holding portion 525, that is, the surface facing the first side (+Dt side) in the plate thickness direction Dt. Although not shown, the recess 525*a* has a substantially rectangular shape when viewed in the plate thickness direction Dt. The recess 525*a* accommodates the IC chip 22.

A substrate thickness T1 shown in FIG. 12 is the distance between the first surface 21*f* of the substrate 21 and the rear surface 525*g* of the holding portion 525 in the plate thickness direction Dt. In the present embodiment, the substrate thickness T1 may be in the range of, for example, 500 μm or greater and 700 μm or less.

The first fixing portion 528*a* fixes holding portion 525 to the substrate 21. The second fixing portion 528*b* fixes the holding portion 525 to the fingerprint sensor 24. Thus, the fingerprint sensor 24 is fixed to the substrate 21 via the holding portion 525. In the present embodiment, the first fixing portion 528*a* and the second fixing portion 528*b* are formed of solders having different melting points from each other. Therefore, the fingerprint sensor 24 is electrically connected to the IC chip 22 via the second fixing portion 528*b*, wiring (not shown) of the holding portion 525, the first fixing portion 528*a* and the substrate 21. That is, the fingerprint sensor 24 is electrically connected to the IC chip 22 via the holding portion 525.

According to the present embodiment, the holding portion 525 is a substrate to which the fingerprint sensor 24 is mounted and in which a recess 525*a* is formed that is recessed downward (−Dt side), that is, toward the second side in the plate thickness direction Dt, from the front surface 525*f* of the holding portion 525, that is, the surface facing the first side (+Dt) in the plate thickness direction Dt, and the IC chip 22 is accommodated in the recess 525*a*. Therefore, since the holding portion 525 is a substrate capable of easily improving the dimensional accuracy in the plate thickness direction Dt, it is easy to improve the dimensional accuracy of the substrate thickness T1, which is the distance between the first surface 21*f* of the substrate 21 and the rear surface 525*g* of the holding portion 525 in the plate thickness direction Dt. This allows the substrate thickness T1 to be easily set in the range of, for example, 500 μm or greater and 700 μm or less, making it easy to improve the dimensional accuracy of the IC module 520 in the plate thickness direction Dt. Therefore, the thickness of the IC module 520 can be easily set in the range specified by ISO/IEC 7810, and thus the yield of the IC module 520 can be suitably increased.

Further, in the present embodiment, the first fixing portion 528*a* and the second fixing portion 528*b* are formed of solders having different melting points from each other. Therefore, as in the first embodiment, in the production process of the IC module 520, the holding portion 525 and the fingerprint sensor 24 can be easily fixed to the substrate 21, and thus an increase in the number of production steps and production costs of the IC module 520 and the IC card 510 can be suppressed.

Sixth Embodiment

Next, a sixth embodiment of the present invention will be described with reference to FIG. 13. In the following description, components that are common to those in the second embodiment are denoted by the same reference signs, and duplicated description thereof will be omitted. The following description will be given focusing on the differences from the second embodiment.

Figure 13:
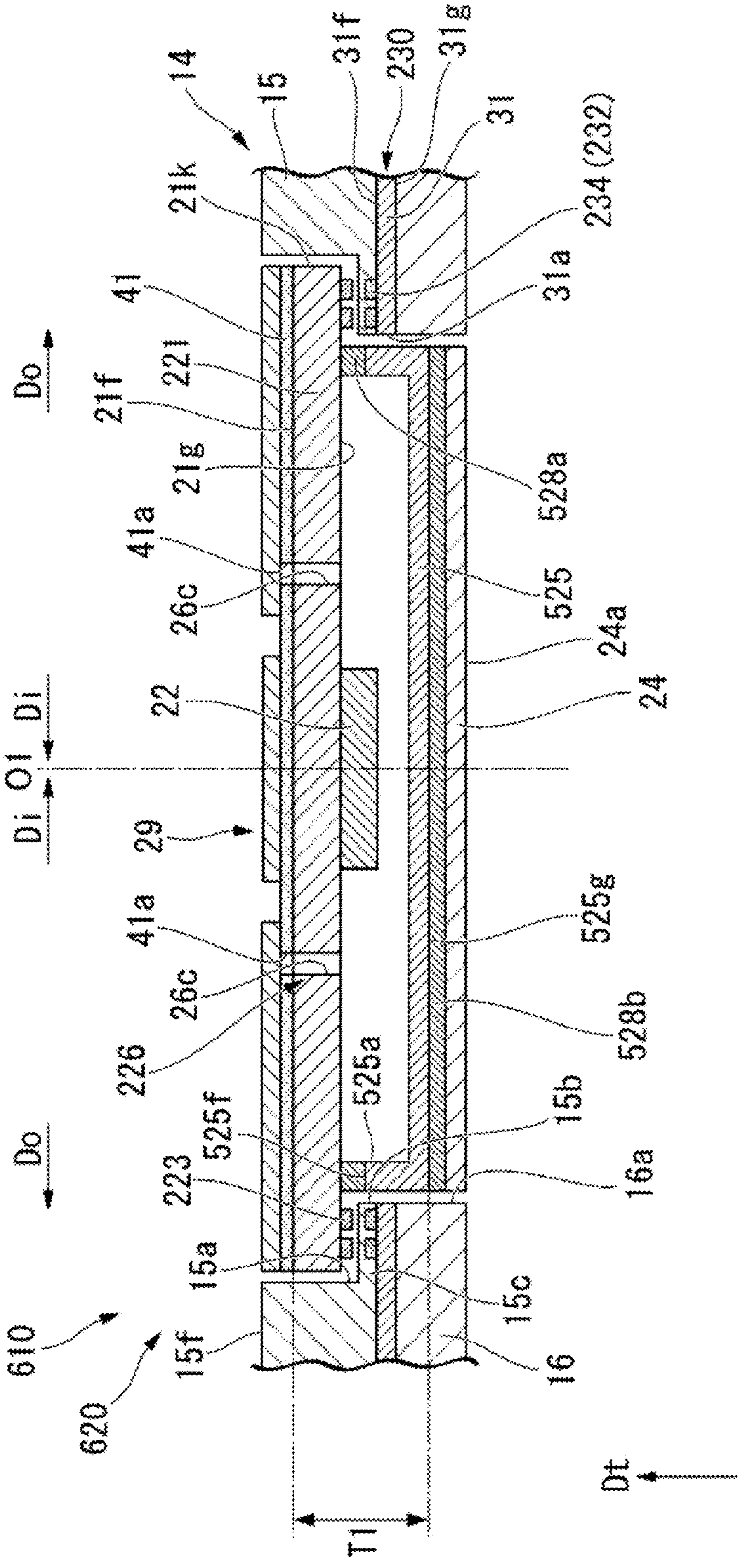
FIG. 13 is a cross-sectional view schematically illustrating an IC card according to a sixth embodiment of the present invention.

FIG. 13 is a cross-sectional view schematically illustrating an IC module 620 of an IC card 610 according to the sixth embodiment.

In the present embodiment, a holding portion 525 of the IC module 620 is a substrate to which a fingerprint sensor 24 is mounted and in which a recess 525*a* is formed that is recessed downward from a front surface 525*f* of the holding portion 525. The configuration and the like of the holding portion 525 of the present embodiment are the same as those of the holding portion 525 of the fifth embodiment described above.

Therefore, in the present embodiment, as in the fifth embodiment, since the holding portion 525 is a substrate capable of easily improving the dimensional accuracy in the plate thickness direction Dt, it is easy to improve the dimensional accuracy of the substrate thickness T1. This allows the substrate thickness T1 to be easily set in the range of, for example, 500 μm or greater and 700 μm or less. Therefore, the thickness of the IC module 620 can be easily set in the range specified by ISO/IEC 7810, and thus the yield of the IC module 620 can be suitably increased.

Seventh Embodiment

Next, a seventh embodiment of the present invention will be described with reference to FIG. 14. In the following description, components that are common to those in the first and fifth embodiments are denoted by the same reference signs, and duplicated description thereof will be omitted. The following description will be given focusing on the differences from the first and fifth embodiments.

Figure 14:
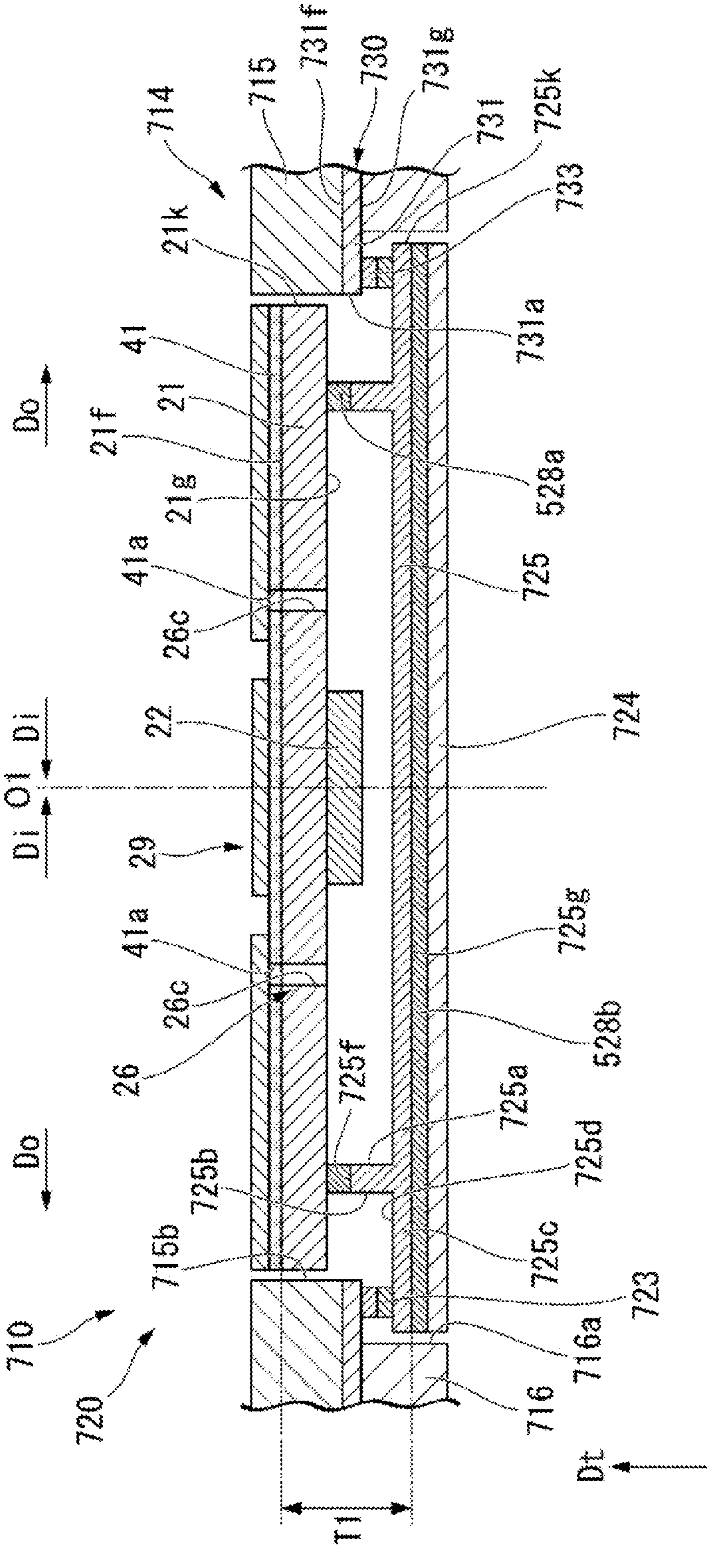
FIG. 14 is a cross-sectional view schematically illustrating an IC card according to a seventh embodiment of the present invention.

FIG. 14 is a cross-sectional view schematically illustrating an IC module 720 of an IC card 710 according to the seventh embodiment.

The IC card 710 of the present embodiment includes a card substrate 714, an antenna substrate 730 and the IC module 720. The card substrate 714 includes a first card substrate 715 and a second card substrate 716. The first card substrate 715 has a first opening 715*b*. The first opening 715*b* penetrates the first card substrate 715 in the plate thickness direction Dt. The first opening 715*b* has a substantially rectangular shape when viewed in the plate thickness direction Dt.

The second card substrate 716 has a second opening 716*a*. The second opening 716*a* penetrates the second card substrate 716 in the plate thickness direction Dt. The second opening 716*a* has a substantially rectangular shape when viewed in the plate thickness direction Dt. The dimensions of the second opening 716*a* in the first direction D1 and the second direction D2 are larger than the dimensions of the first opening 715*b* in the first direction D1 and the second direction D2, respectively. Other configurations and the like of the card substrate 714 are the same as those of the card substrate 14 of the first embodiment described above.

The antenna substrate 730 is disposed between the first card substrate 715 and the second card substrate 716. The antenna substrate 730 of the present embodiment includes an antenna sheet 731, in which an antenna hole 731*a* is provided. The antenna hole 731*a* penetrates the antenna sheet 731 in the plate thickness direction Dt. Although not shown, the antenna hole 731*a* is formed in a substantially rectangular shape as viewed in the plate thickness direction Dt. The inner surface of the antenna hole 731*a* overlaps the inner surface of the first opening 715*b* when viewed in the plate thickness direction Dt.

In the present embodiment, the connection terminal 733 is a terminal formed on a rear surface 731*g* of the antenna sheet 731. Although not shown, the connection terminal 733 is formed in a substantially rectangular shape as viewed in the plate thickness direction Dt. The connection terminal 733 is electrically connected to the capacitor 38 and the booster antenna 32 shown in FIG. 4 via a connection wiring (not shown). Other configurations and the like of the antenna substrate 730 are the same as those of the antenna substrate 30 of the first embodiment.

As shown in FIG. 14, in the present embodiment, the IC module 720 includes a substrate 21, an IC chip 22, a coupling portion 723, a fingerprint sensor 724, a holding portion 725, a first fixing portion 528*a*, a second fixing portion 528*b*, a contact terminal 29 and a pad portion 27 (not shown).

The holding portion 725 of the present embodiment is a substrate. The holding portion 725 is disposed inside the second opening 716*a*. The holding portion 725 is provided with wiring (not shown). The holding portion 725 is a rectangular shape with the long side extending in the first direction D1 when viewed in the plate thickness direction Dt. The dimensions of the holding portion 725 in the first direction D1 and the second direction D2 are larger than the dimensions of the substrate 21 in the first direction D1 and the second direction D2, respectively. An outer edge 725*k* of the holding portion 725 surrounds the substrate 21 when viewed in the plate thickness direction Dt. The holding portion 725 is disposed between the substrate 21 and the fingerprint sensor 724 in the plate thickness direction Dt. The holding portion 725 is fixed to a second surface 21*g* of the substrate 21 by the first fixing portion 528*a*. The fingerprint sensor 724 is mounted on a rear surface 725*g* of the holding portion 725. The fingerprint sensor 724 is fixed to holding portion 725 by the second fixing portion 528*b*. The holding portion 725 is provided with a recess 725*a* and a second recess 725*b*.

The recess 725*a* is a hole recessed downward (−Dt side) from a front surface 725*f* of the holding portion 725. The recess 725*a* is disposed at the center of the holding portion 725 in the first direction D1 and the second direction D2. Although not shown, the recess 725*a* has a substantially rectangular shape when viewed in the plate thickness direction Dt. The recess 725*a* accommodates the IC chip 22.

The second recess 725*b* is a hole recessed downward from the front surface 725*f* of the holding portion 725. The second recess 725*b* is disposed on the outside (Do side) of the recess 725*a*. The outer edge of the second recess 725*b* reaches the outer edge 725*k* of the holding portion 725. As a result, the second recess 725*b* opens to the outside. A bottom 725*c* of the second recess 725*b* is disposed on the lower side (−Dt side) of the antenna substrate 730 in the plate thickness direction Dt. The outer portion of the bottom 725*c* faces the antenna substrate 730 in the plate thickness direction Dt. More specifically, the outer portion of the bottom 725*c* faces the connection terminal 733 with a gap therebetween in the plate thickness direction Dt. Other configurations and the like of the holding portion 725 are the same as those of the holding portion 525 of the fifth embodiment described above.

The coupling portion 723 is a terminal formed on a front surface 725*d*, which is a surface facing the upper side (+Dt side) of the bottom 725*c*. That is, the coupling portion 723 is disposed on the surface of the holding portion 725 facing the upper side, that is, the first side in the plate thickness direction Dt. More specifically, the coupling portion 723 is provided in a portion of the front surface 725*d* of the bottom 725*c* on the outside (Do side) of the substrate 21. The coupling portion 723 is electrically connected to the IC chip 22 via wiring (not shown) formed on the holding portion 725, the first fixing portion 528*a*, and wiring (not shown) formed on the substrate 21. Other configurations and the like of the coupling portion 723 are the same as those of the coupling portion 23 of the first embodiment described above.

When the IC module 720 is fitted into the card substrate 714 from the lower side (−Dt side), the coupling portion 723 comes into contact with the connection terminal 733 in the plate thickness direction Dt. Thus, the coupling portion 723 is electrically connected to the booster antenna 32 via the connection terminal 733. In the present embodiment, the coupling portion 723 is physically coupled to the booster antenna 32. Therefore, the IC chip 22 can perform contactless type communication with a contactless type external device via the coupling portion 723 and the booster antenna 32.

According to the present embodiment, the IC module 720 includes the coupling portion 723 electrically connected to the IC chip 22, the outer edge 725*k* of the holding portion 725 surrounds the substrate 21 when viewed in the plate thickness direction Dt, and the coupling portion 723 is provided in a portion of the front surface 725*d* of the holding portion 725, that is, the surface facing the first side (+Dt side) in the plate thickness direction Dt, on the outside (Do side) of the substrate 21. Therefore, in the production process of the IC card 710, the coupling portion 723 can be brought into contact with the connection terminal 733 of the antenna substrate 730 by a simple operation of inserting the IC module 720 into the card substrate 714 from the lower side (−Dt side) and fitting it into the card substrate 714. Since the coupling portion 723 and the booster antenna 32 can be easily physically coupled to each other via the connection terminal 733, an increase in the number of production steps and production costs of the IC card 710 can be suppressed.

Further, in the present embodiment, as in the fifth embodiment, since the holding portion 725 is a substrate capable of easily improving the dimensional accuracy in the plate thickness direction Dt, it is easy to improve the dimensional accuracy of the substrate thickness T1, which is the distance between the first surface 21*f* of the substrate 21 and the rear surface 725*g* of the holding portion 725 in the plate thickness direction Dt. Therefore, the thickness of the IC module 720 can be easily set in the range specified by ISO/IEC 7810, and thus the yield of the IC module 720 can be suitably increased.

Eighth Embodiment

Next, an eighth embodiment of the present invention will be described with reference to FIG. 15. In the following description, components that are common to those in the above embodiments are denoted by the same reference signs, and duplicated description thereof will be omitted. The following description will be given focusing on the differences from the seventh embodiment.

Figure 15:
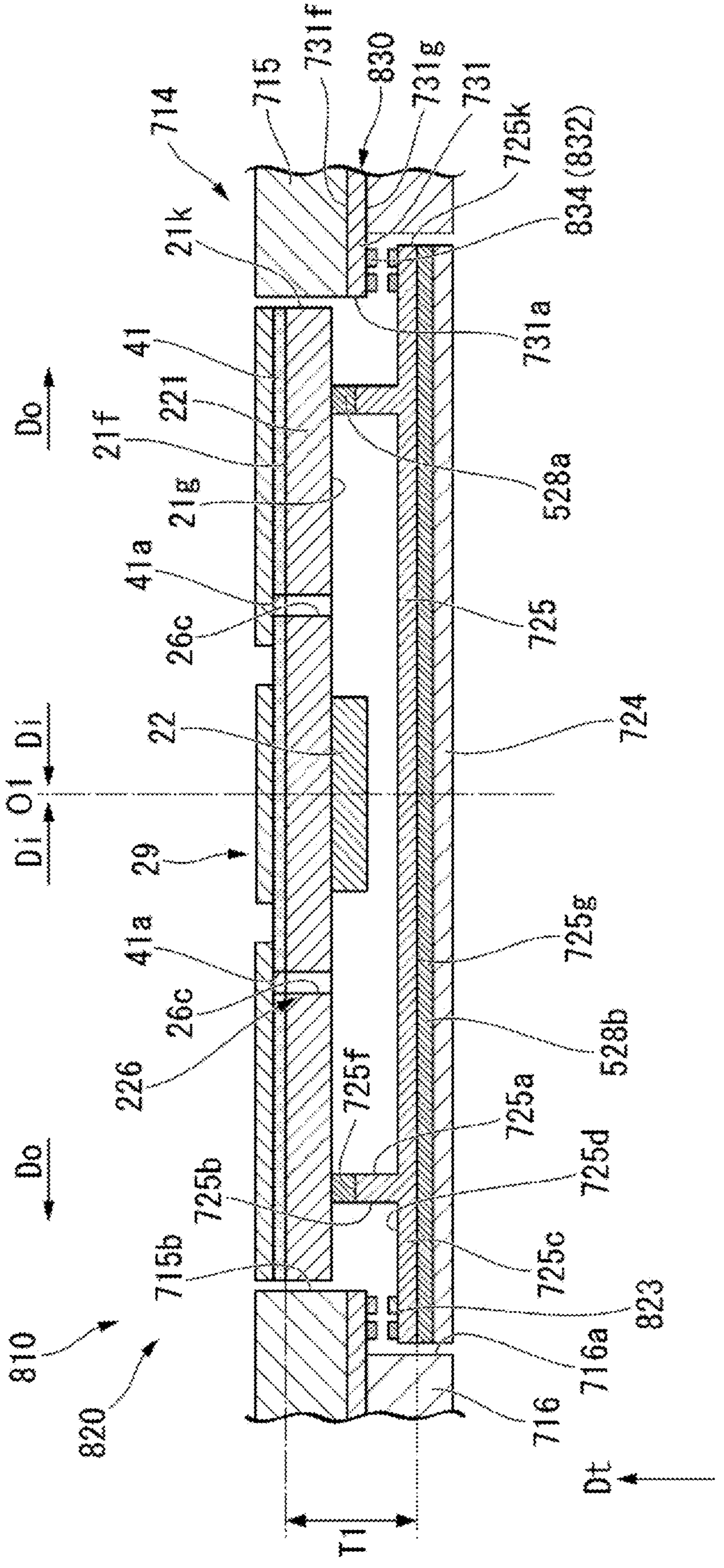
FIG. 15 is a cross-sectional view schematically illustrating an IC card according to an eighth embodiment of the present invention.

FIG. 15 is a cross-sectional view schematically illustrating an IC module 820 of an IC card 810 according to the eighth embodiment.

In the present embodiment, an antenna substrate 830 includes a coupling coil 834 and a booster antenna 832 formed of the antenna coil 36 shown in FIG. 4. As shown in FIG. 15, the coupling coil 834 is formed on a rear surface 731*g* of an antenna sheet 731. The coupling coil 834 has a rectangular shape surrounding the center axis O1. The coupling coil 834 is formed in a spiral shape having two or more turns. The coupling coil 834 is electrically connected to the capacitor 38 and the antenna coil 36 shown in FIG. 4 via a connection wiring (not shown).

As shown in FIG. 15, a coupling portion 823 of the present embodiment is a coil formed in a portion of a front surface 725*d* of a bottom 725*c* on the outside (Do side) of a substrate 221. The coupling portion 823 extends along an outer edge 725*k* of a holding portion 725 and is formed in a substantially rectangular shape. Although not shown, the coupling portion 823 is formed of a coil wire wound in a spiral shape. The coupling portion 823 faces the coupling coil 834 of the antenna substrate 830 with a gap therebetween in the plate thickness direction Dt. Thus, the coupling portion 823 can be electromagnetically coupled to the booster antenna 832. The coupling portion 823 is electrically connected to the IC chip 22 via wiring (not shown) formed on the holding portion 725, the first fixing portion 528*a*, and the substrate 221. Thus, the IC chip 22 can perform contactless type communication with a contactless type external device via the coupling portion 823 and the booster antenna 832. Other configurations and the like of the coupling portion 823 are the same as those of the coupling portion 223 of the second embodiment described above.

As a result, in the present embodiment, in the production process of the IC card 810, the coupling portion 823 and the coupling coil 834 of the antenna substrate 830 can be disposed facing each other in the plate thickness direction Dt by a simple operation of inserting the IC module 820 into the card substrate 714 from the lower side (−Dt side) and fitting it into the card substrate 714. Since the coupling portion 823 and the booster antenna 832 can be easily electromagnetically coupled to each other, an increase in the number of production steps and production costs of the IC card 810 can be suppressed.

Although some embodiments of the present invention have been described, the specific configurations are not limited to these embodiments, and various modifications and combinations of the configurations can be made without departing from the principle of the present invention.

The IC chip may be composed of a plurality of microcomputers. For example, when the IC chip includes two microcomputers, i.e., a first IC chip and a second IC chip, the first IC chip may be a secure microcomputer connected to a contact terminal via a through hole. In this case, the first IC chip can perform contactless type communication with a contactless type external device, and can also perform contact type communication with a contact type external device. Further, the second IC chip may be a general-purpose microcomputer electrically connected to a fingerprint sensor via a holding portion. In this case, the second IC chip can authenticate the user by comparing the user's fingerprint information acquired by the fingerprint sensor with the fingerprint information stored in the second IC chip, and output the authentication result to a contactless type external device or a contact type external device via the first IC chip. Both the first IC chip and the second IC chip can be disposed on the second surface of the substrate.

In the embodiments described above, the IC card is described using an example of a hybrid IC card that functions as both a contact type and a contactless type, but the IC card is not particularly limited, and may be an IC card that functions only as a contact type or an IC card that functions only as a contactless type.

Ninth to Fourteenth Embodiments

With reference to the drawings, an IC module and an IC card according to ninth to fourteenth embodiments of the present invention will be described. The scope of the present invention is not limited to the following embodiments, and can be arbitrarily modified within the scope of the technical idea of the present invention. In addition, in the drawings, the scale, the number, and the like of components may differ from the actual structure in order to facilitate understanding of each component.

In the following description, a plate thickness direction Dt is shown in each drawing as appropriate. The plate thickness direction Dt is a direction in which the plate surface of a first substrate (substrate) in the IC module of the embodiments described below faces. In the following description, the side to which the arrow of the plate thickness direction Dt is directed (+Dt side) is referred to as an "upper side". The side opposite to that to which the arrow of the plate thickness direction Dt is directed (−Dt side) is referred to as a "lower side". Further, among the outer surfaces of each member constituting the IC card, the surface facing upward may be referred to as a "front surface" and the surface facing downward may be referred to as a "rear surface". The "upper side" and "lower side" are simply terms used to indicate the relative positional relationship of each components, and the actual positional relationship or the like may differ from that indicated by these terms.

In the following description, a first direction D1 is shown in each drawing as appropriate. The first direction D1 is a direction in which the long side of the rectangular first substrate (substrate) extends in the IC module of the embodiments described below, and is a direction perpendicular to the plate thickness direction Dt. In the following description, the side to which the arrow of the first direction D1 is directed (+D1 side) is referred to as a "first side in the first direction D1". The side opposite to that to which the arrow of the first direction D1 is directed (−D1 side) is referred to as a "second side in the first direction D1".

In the following description, a second direction D2 is shown in each drawing as appropriate. The second direction D2 is a direction in which the short side of the rectangular first substrate (substrate) extends, and is a direction perpendicular to both the first direction D1 and the plate thickness direction Dt. In the following description, the side to which the arrow of the second direction D2 is directed (+D2 side) is referred to as a "first side in the second direction D2". The side opposite to that to which the arrow of the second direction D2 is directed (−D2 side) is referred to as a "second side in the second D2".

In the following description, an inward direction Di and an outward direction Do are shown in each drawing as appropriate. The inward direction Di is a direction toward a center axis O1 of the first substrate (substrate) when viewed in the plate thickness direction Dt. The center axis O1 of the first substrate (substrate) is a virtual axis extending in the plate thickness direction. The outward direction Do is a direction opposite to the direction toward the center axis O1 of the first substrate (substrate) when viewed in the plate thickness direction Dt. In the following description, the side to which the arrow of the inward direction Di is directed (Di side) is referred to as an "inside" and the side to which the arrow of the outward direction Do is directed (Do side) is referred to as an "outside".

Ninth Embodiment

With reference to FIGS. 16 to 21, a ninth embodiment of the present invention will be described. In the embodiments described below, components corresponding to each other will be denoted by the same reference signs, and duplicated description thereof may be omitted. Further, in the following description, expressions indicating a relative or absolute arrangement, such as "perpendicular" and "center", not only indicate strictly such arrangement, but also indicate a state of relative displacement with a tolerance or an angle or distance to the extent that the same functions can be obtained.

Figure 16:
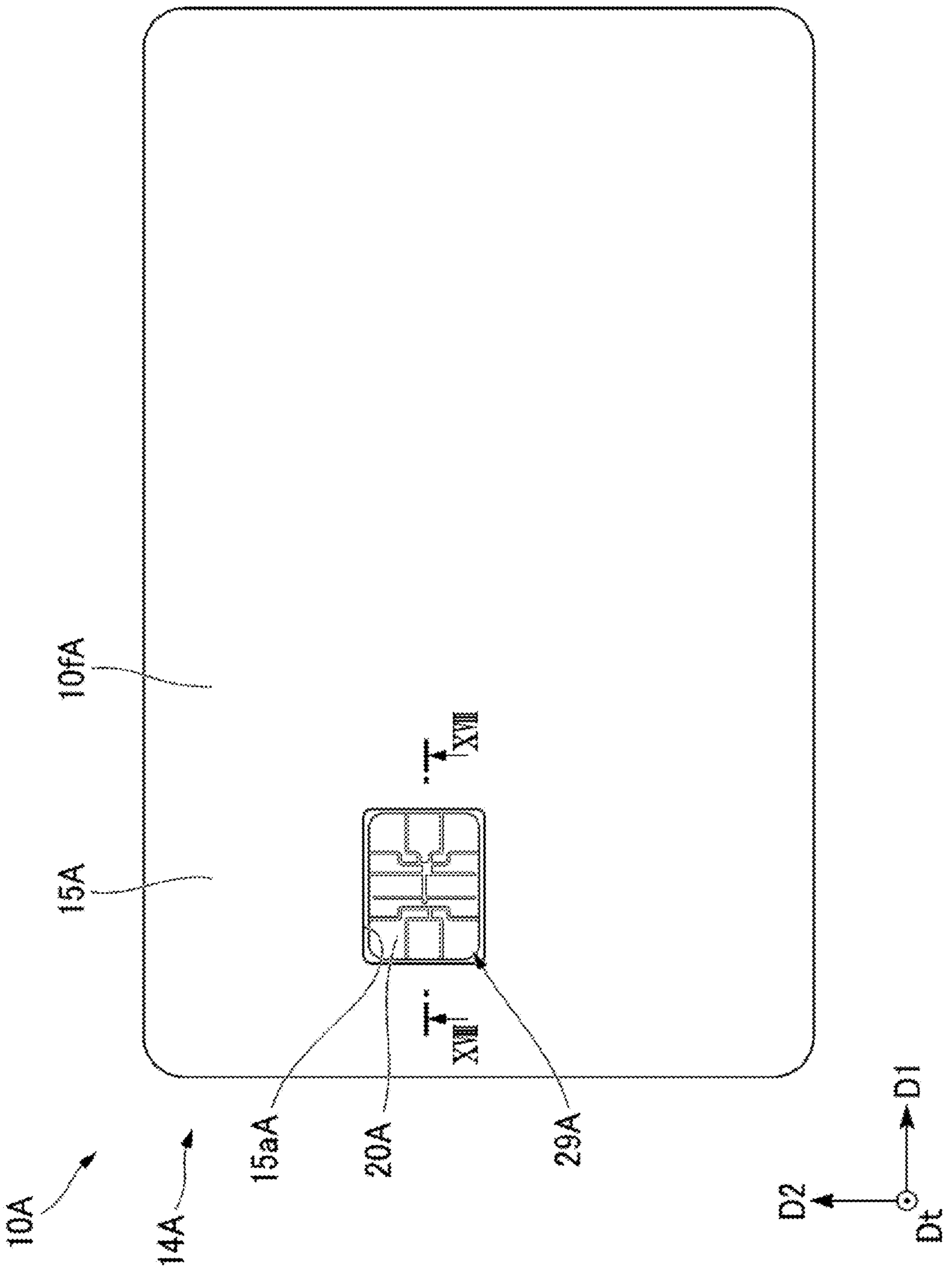
FIG. 16 is a plan view schematically illustrating an IC card according to a ninth embodiment of the present invention.
Figure 17:
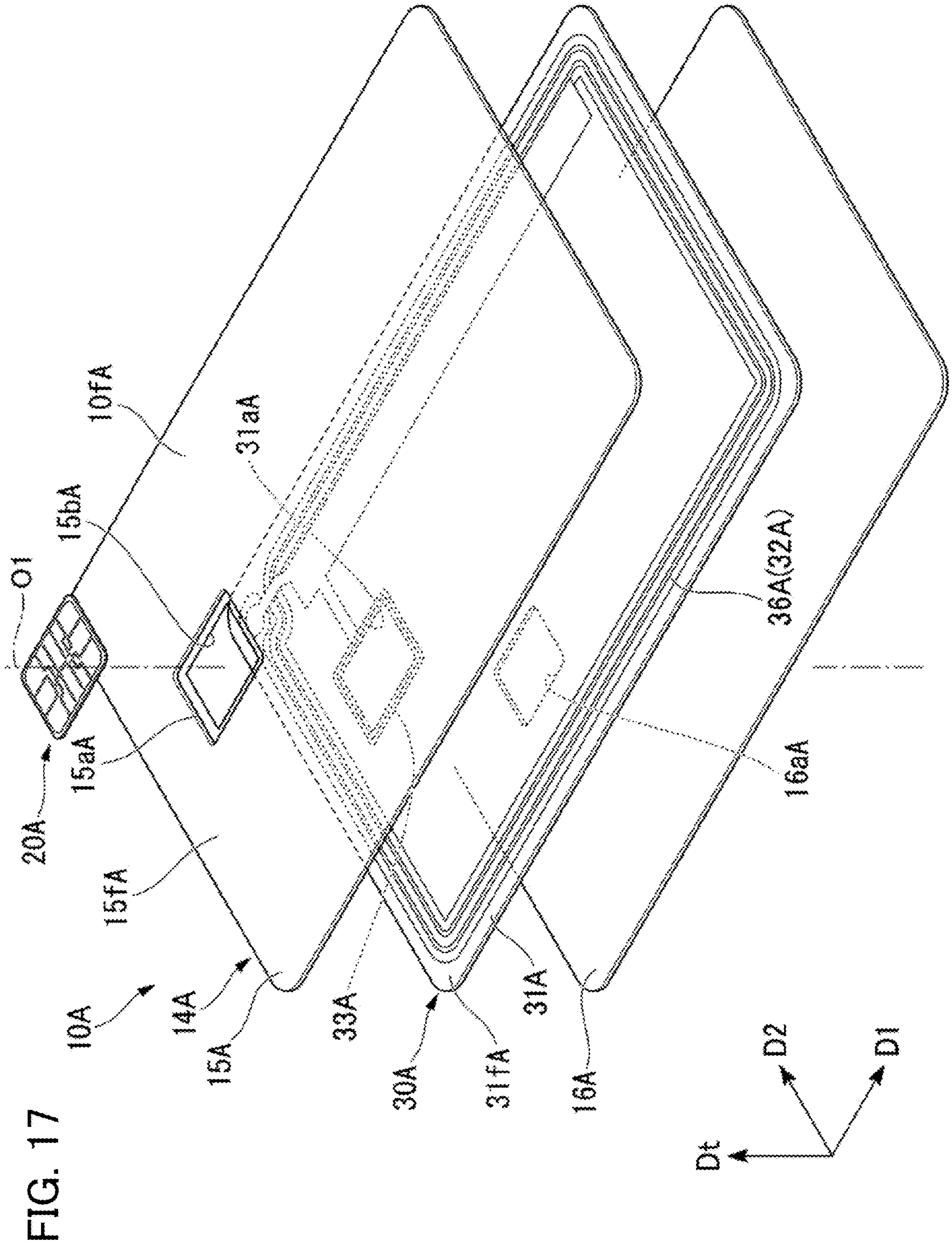
FIG. 17 is an exploded perspective view schematically illustrating the IC card.
Figure 18:
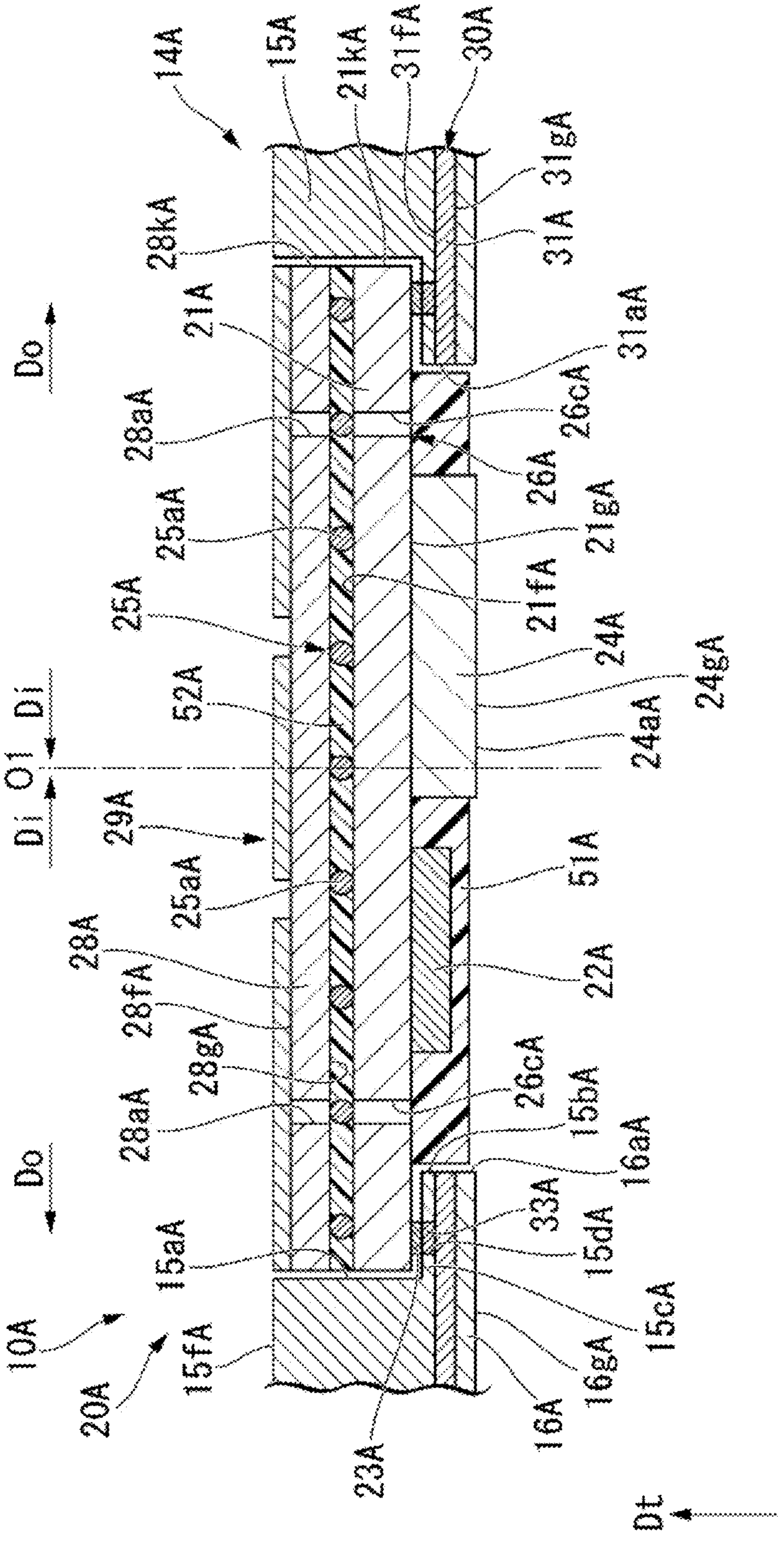
FIG. 18 is a cross-sectional view schematically illustrating the IC card taken along the line XVIII-XVIII of FIG. 16.
Figure 19:
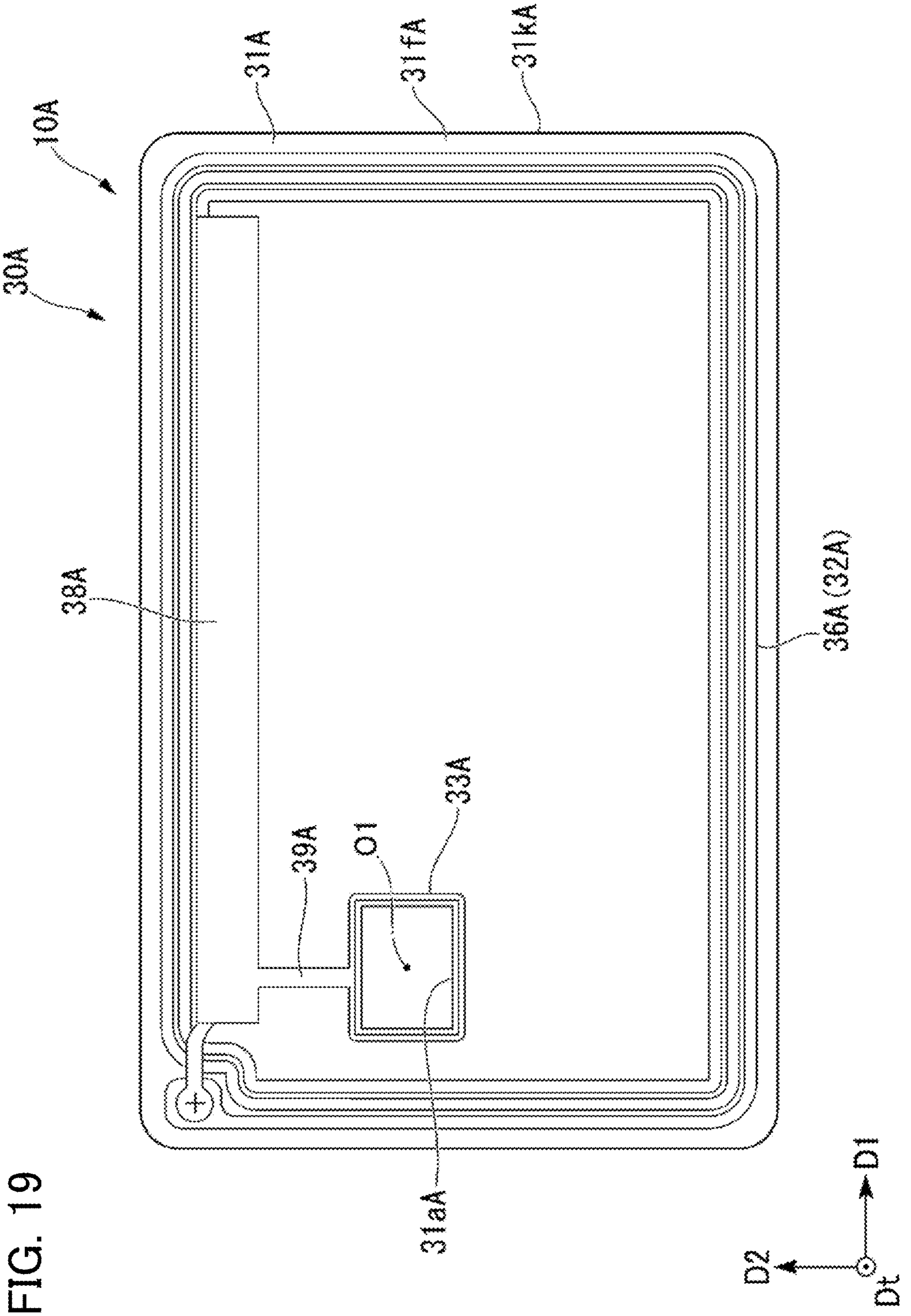
FIG. 19 is a plan view schematically illustrating an antenna substrate of the IC card.

FIG. 16 is a plan view schematically illustrating an IC card 10A according to a ninth embodiment. FIG. 17 is an exploded perspective view schematically illustrating the IC card 10A. FIG. 18 is a cross-sectional view schematically illustrating the IC card 10A taken along the line XVIII-XVIII of FIG. 16. FIG. 19 is a plan view schematically illustrating an antenna substrate 30A of the IC card 10A.

The IC card 10A of the present embodiment is a hybrid IC card (dual IC card) capable of both contact type communication and contactless type communication with an external device. In the present embodiment, the communication region of the contactless type communication is the HF band (13.56 MHz) generally used in the market. As shown in FIG. 16, the IC card 10A has a plate-shape with the plate surface facing in the plate thickness direction Dt. The IC card 10A is formed in a rectangular shape with the long side extending in the first direction D1 as viewed in the plate thickness direction Dt. The IC card 10A is formed to have a thickness in the range of 680 μm or greater and 840 μm or less, as specified by ISO/IEC 7810. As shown in FIG. 17, the IC card 10A includes a card substrate 14A, an antenna substrate 30A and an IC module 20A. The IC module 20A of the present embodiment is a dual-interface electromagnetic coupling card module capable of both contact type communication and contactless type communication with an external device. Further, the IC module 20A of the present embodiment is a card module capable of authenticating the user's fingerprint information.

[Card Substrate 14A]

The card substrate 14A is a substrate constituting the IC card 10A. The card substrate 14A includes a first card substrate 15A and a second card substrate 16A. The first card substrate 15A is located on the upper side (+Dt side) of the antenna substrate 30A. A front surface 15*f*A of the first card substrate 15A is a front surface 10*f*A of the IC card 10A. The second card substrate 16A is located on the lower side (−Dt side) of the antenna substrate 30A. In the present embodiment, the card substrate 14A may be formed using a substrate such as polyvinyl chloride (PVC), polyurethane (PU), polyethylene terephthalate (PET), amorphous polyethylene terephthalate (PET-G), or the like. The card substrate 14A may be formed using a metal sheet, a magnetic material, or the like. The card substrate 14A may also be formed using a plastic material having high fluidity and insulation, such as a UV curing type or a mixed liquid reaction-curing type.

The shape of the card substrate 14A, such as the external shape, can be made in accordance with card standards such as ISO/IEC 7810 as appropriate. The first card substrate 15A and the second card substrate 16A may be configured as a laminate of two or more layers. The card substrate 14A may also be provided with a magnetic layer, a protective layer, or the like, or may have a functional surface coating by a forming method such as thermal, thermal transfer or ink jet method. The front surface 15*f*A of the first card substrate 15A is preferably translucent, colored transparent or colorless transparent. Further, the card substrate 14A may have fine linear projections or recesses.

The first card substrate 15A and the second card substrate 16A have a rectangular shape with the long side extending in the first direction D1. The first card substrate 15A and the second card substrate 16A have substantially the same shape as viewed in the plate thickness direction Dt. As shown in FIG. 18, the first card substrate 15A has a first aperture 15*a*A, a first opening 15*b*A and a substrate hole 15*d*A. The first aperture 15*a*A is a hole recessed downward (−Dt side) from the front surface 15*f*A of the first card substrate 15A. The first aperture 15*a*A may be formed, for example, by milling the first card substrate 15A. As shown in FIG. 17, the first aperture 15*a*A surrounds the center axis O1. The shape of the first aperture 15*a*A viewed in the plate thickness direction Dt is not specifically limited, but in the present embodiment, it is formed in a substantially rectangular shape to match the shape of the IC module 20A.

As shown in FIG. 18, the first opening 15*b*A penetrates a bottom wall 15*c*A of the first aperture 15*a*A in the plate thickness direction Dt. As shown in FIG. 17, the first opening 15*b*A surrounds the center axis O1. The shape of the first opening 15*b*A viewed in the plate thickness direction Dt is not specifically limited, but in the present embodiment, it is formed in a substantially rectangular shape. The dimensions of the first opening 15*b*A in the first direction D1 and the second direction D2 are smaller than the dimensions of the first aperture 15*a*A in the first direction D1 and the second direction D2, respectively. As shown in FIG. 18, the substrate hole 15*d*A penetrates the bottom wall 15*c*A in the plate thickness direction Dt. The substrate hole 15*d*A surrounds the center axis O1. Although not shown, the shape of the substrate hole 15*d*A viewed in the plate thickness direction Dt is formed in a substantially rectangular annular shape.

The second card substrate 16A has a second opening 16*a*A. The second opening 16*a*A penetrates the second card substrate 16A in the plate thickness direction Dt. The second opening 16*a*A surrounds the center axis O1. As shown in FIG. 17, the shape of the second opening 16*a*A viewed in the plate thickness direction Dt is not particularly limited, but in the present embodiment, it is formed in a substantially rectangular shape. As shown in FIG. 18, the inner surface of the second opening 16*a*A overlaps the inner surface of the first opening 15*b*A when viewed in the plate thickness direction Dt.

[Antenna Substrate 30A]

In the present embodiment, the antenna substrate 30A is disposed between the first card substrate 15A and the second card substrate 16A. As shown in FIG. 19, the antenna substrate 30A includes an antenna sheet 31A, a booster antenna 32A, a connection terminal 33A and a capacitor 38A.

The antenna sheet 31A is a flexible insulating substrate. The antenna sheet 31A may be formed using a material, such as polyethylene terephthalate, polyethylene naphthalate, amorphous polyethylene terephthalate, polyvinyl chloride, vinyl chloride-vinyl acetate copolymer, polycarbonate, polyamide, polyimide, cellulose diacetate, cellulose triacetate, polystyrene-based materials, ABS, polyacrylate, polypropylene, polyethylene, polyurethane, polyimide, glass epoxy or phenolic resin. The antenna sheet 31A has an antenna hole 31*a*A.

As shown in FIG. 18, the antenna hole 31*a*A penetrates the antenna sheet 31A in the plate thickness direction Dt. The antenna hole 31*a*A may be formed in the antenna sheet 31A, for example, by milling. As shown in FIG. 19, the antenna hole 31*a*A is formed in a substantially rectangular shape as viewed in the plate thickness direction Dt. As shown in FIG. 18, the inner surface of the antenna hole 31*a*A overlaps the inner surface of the first opening 15*b*A and the inner surface of the second opening 16*a*A, when viewed in the plate thickness direction Dt.

As shown in FIG. 19, the connection terminal 33A is a terminal formed on a front surface 31*f*A of the antenna sheet 31A. The connection terminal 33A is electrically conductive. The connection terminal 33A is formed in a substantially rectangular shape as viewed in the plate thickness direction Dt. The connection terminal 33A is disposed on the periphery of the antenna hole 31*a*A. As shown in FIG. 18, the connection terminal 33A is disposed inside the substrate hole 15*d*A of the first card substrate 15A. The surface of the connection terminal 33A facing upward is exposed to the inside of the first aperture 15*a*A through the substrate hole 15*d*A. As shown in FIG. 19, the connection terminal 33A is electrically connected to the capacitor 38A via a connection wiring 39A. Further, the connection terminal 33A is electrically connected to the booster antenna 32A via the connection wiring 39A and the capacitor 38A.

The booster antenna 32A is an antenna pattern disposed on the front surface 31*f*A of the antenna sheet 31A. In the present embodiment, the booster antenna 32A is formed of an antenna coil 36A. The antenna coil 36A is electrically connected to the connection terminal 33A and the capacitor 38A, and performs contactless type communication with a contactless type external device such as a reader/writer. The antenna coil 36A is formed in a rectangular shape. The antenna coil 36A is formed in two or three turns along an edge 31*k*A of the antenna sheet 31A. The number of turns, the shape, the line width, and the like of the antenna coil 36A are not limited as long as contactless type communication with a contactless type external device is possible. The antenna coil 36A may be formed on a rear surface 31*g*A of the antenna sheet 31A. The antenna coil 36A may be formed on at least one of the front surface 31*f*A and the rear surface 31*g*A of the antenna sheet 31A.

The method of producing the antenna coil 36A is not particularly limited, and the antenna coil 36A may be formed by various methods. Examples of the method of producing the antenna coil 36A include laser cutting or punching a metal plate or a metal foil, etching a metal foil or a metal layer, arranging metal wires. In the present embodiment, the antenna coil 36A is formed by etching an aluminum foil coated with a resist by general gravure printing.

The capacitor 38A may be, for example, a chip capacitor. The capacitor 38A forms a resonant circuit together with the antenna coil 36A and adjusts the resonant frequency. The capacitance of the capacitor 38A can be adjusted by changing the line width and length of the electrodes of the capacitor 38A. The capacitor 38A can be formed by etching a copper foil or an aluminum foil coated with a resist by general gravure printing.

[IC module 20A]

Figure 20:
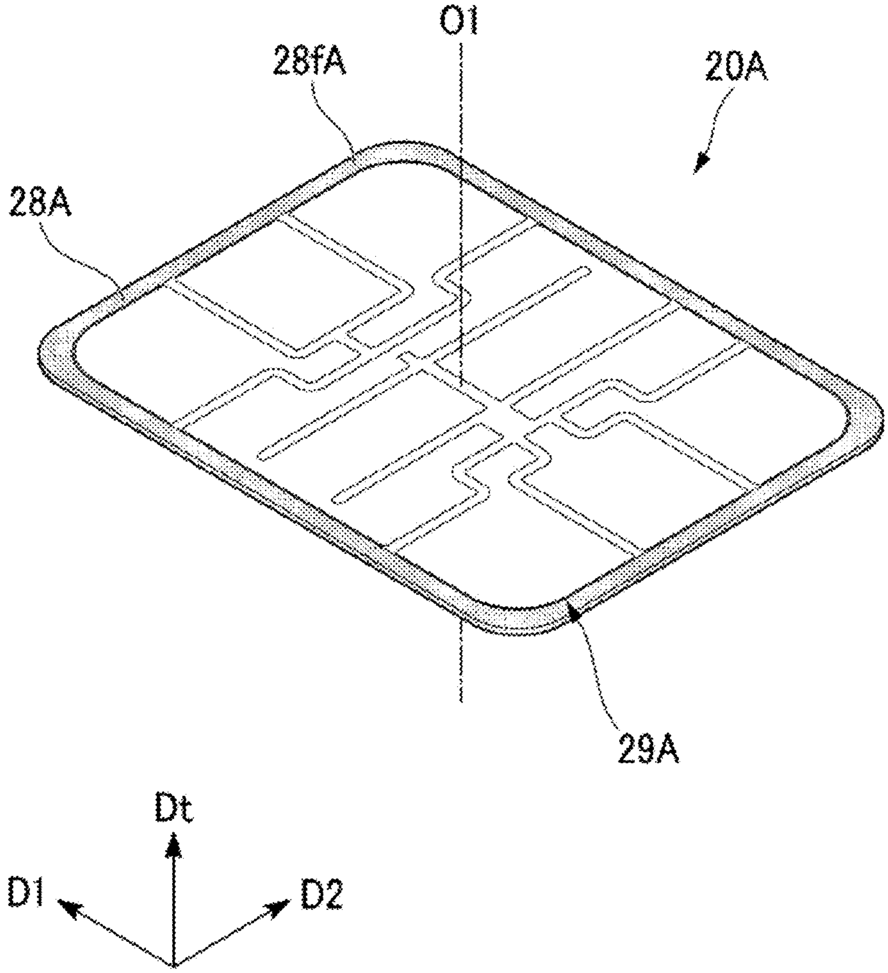
FIG. 20 is a perspective view of an IC module of the IC card as seen from above.
Figure 21:
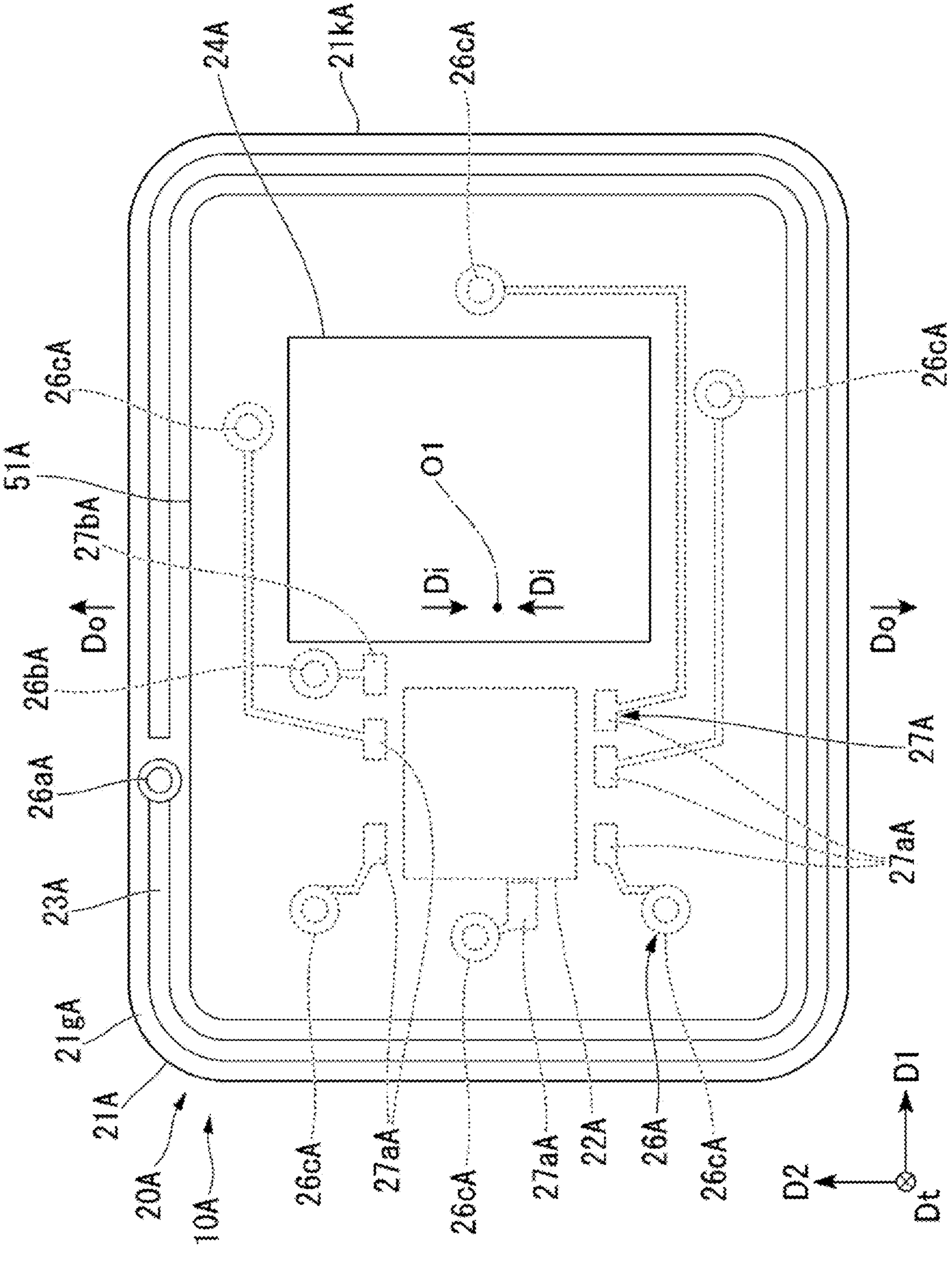
FIG. 21 is a plan view of an IC module of the IC card as seen from below.

FIG. 20 is a perspective view of the IC module 20A of the IC card 10A as seen from above (+Dt side). FIG. 21 is a plan view of the IC module 20A of the IC card 10A as seen from below (−Dt side).

As shown in FIG. 18, the IC module 20A is fitted into the first aperture 15*a*A and the first opening 15*b*A of the first card substrate 15A, and the second opening 16*a*A of the second card substrate 16A. That is, the IC module 20A is fitted into the card substrate 14A. The IC module 20A includes a first substrate 21A, an IC chip 22A, a coupling portion 23A, a fingerprint sensor 24A, a fixing portion 25A, a second substrate 28A, a contact terminal 29A, a first resin sealing portion 51A and a second resin sealing portion 52A. As shown in FIG. 21, the IC module 20A includes a pad portion 27A. As shown in FIG. 20, the IC module 20A has a rectangular shape with the long side extending in the first direction D1. The long side of the IC module 20A measures approximately 11.0 mm, and the short side of the IC module 20A measures approximately 8.0 mm. The IC module 20A of the present embodiment is a six-terminal IC module. The long side of the IC module 20A may be 12 mm or greater and 14 mm or less, and the short side of the IC module 20A may be 9 mm or greater and 11 mm or less. The thickness of the IC module 20A is set in the range of 680 μm or greater and 840 μm or less, as specified by ISO/IEC 7810. The IC module 20A may be an eight-terminal IC module.

As shown in FIG. 18, the IC module 20A is disposed with a slight gap from the inner surface of the first aperture 15*a*A of the first card substrate 15A, the inner surface of the first opening 15*b*A, and the inner surface of the second opening 16*a*A of the second card substrate 16A. With this configuration, it is possible to prevent electric short circuit from occurring between the IC module 20A and the card substrate 14A even when the card substrate 14A is made of a conductive material such as a metal. Therefore, it is possible to prevent the IC card 10A from having a communication failure.

The first substrate 21A has a sheet-like form extending in a direction perpendicular to the plate thickness direction Dt. In the present embodiment, the first substrate 21A is a flexible substrate. As shown in FIG. 21, the first substrate 21A is formed in a rectangular shape with the long side extending in the first direction D1 as viewed in the plate thickness direction Dt. The first substrate 21A may be made of, for example, an insulating material such as glass epoxy or polyethylene terephthalate. In the present embodiment, the first substrate 21A is formed to have a thickness in the range of 50 μm or greater and 200 μm or less. As shown in FIG. 18, in the present embodiment, the first substrate 21A is disposed inside the first aperture 15*a*A. The first substrate 21A is disposed on the lower side (−Dt side) of the second substrate 28A in the plate thickness direction Dt. The first substrate 21A includes a first surface 21*f*A and a second surface 21*g*A. The first surface 21*f*A is a surface facing the upper side (+Dt side), that is, the first side in the plate thickness direction Dt, among the outer surfaces of the first substrate 21A. The first surface 21*f*A is the front surface of the first substrate 21A. The second surface 21*g*A is a surface facing the lower side (−Dt side), that is, the second side in the plate thickness direction Dt, among the outer surfaces of the first substrate 21A. The second surface 21*g*A is the rear surface of the first substrate 21A. The first substrate 21A has a first through hole 26A.

The first through hole 26A penetrates the first substrate 21A in the plate thickness direction Dt and has a copper foil layer on the inner peripheral surface. As shown in FIG. 21, in the present embodiment, the first through hole 26A includes an outer through hole 26*a*A, an inner through hole 26*b*A and a plurality of relay through holes 26*c*A. A conductive land portion is formed around each through hole and connected to each through hole.

The outer through hole 26*a*A is disposed on the outer edge of the first substrate 21A. The outer through hole 26*a*A is electrically connected to one end of the coupling portion 23A via the land portion. Although not shown, the outer through hole 26*a*A is electrically connected to the contact terminal 29A via the fixing portion 25A and a second through hole 28*a*A (described later) of the second substrate 28A.

The inner through hole 26*b*A is disposed on the first side (+D2 side) of the IC chip 22A in the second direction D2. The inner through hole 26*b*A is disposed on the inside (Di side) of the coupling portion 23A. Although not shown, the inner through hole 26*b*A is electrically connected to the contact terminal 29A via the fixing portion 25A and the second through hole 28*a*A (described later) of the second substrate 28A. As described above, the outer through hole 26*a*A is electrically connected to the contact terminal 29A. Thus, the outer through hole 26*a*A is electrically connected to the inner through hole 26*b*A.

In the present embodiment, six relay through holes 26*c*A are provided in the first substrate 21A. Each relay through hole 26*c*A is disposed on the inside (Di side) of the coupling portion 23A. As shown in FIG. 18, the plurality of relay through holes 26*c*A is electrically connected to the contact terminal 29A via the fixing portion 25A and the second through hole 28*a*A (described later) of the second substrate 28A. Therefore, the first through hole 26A is electrically connected to the contact terminal 29A via the fixing portion 25A and the second through hole 28*a*A (described later) of the second substrate 28A.

As shown in FIG. 21, the pad portion 27A is formed on the second surface 21*g*A of the first substrate 21A. The pad portion 27A is electrically conductive. The pad portion 27A includes a plurality of relay pads 27*a*A and a connection pad 27*b*A. In the present embodiment, six relay pads 27*a*A are formed. Each relay pad 27*a*A is disposed in the vicinity of the IC chip 22A. Each relay pad 27*a*A is electrically connected to a different relay through hole 26*c*A via the connection wiring. Each relay pad 27*a*A is electrically connected to a part of the plurality of electrodes of the IC chip 22A by wire bonding or the like. Thus, each relay through hole 26*c*A is electrically connected to the IC chip 22A.

The connection pad 27*b*A is electrically connected to the inner through hole 26*b*A via the connection wiring. The connection pad 27*b*A is electrically connected to a part of the plurality of electrodes of the IC chip 22A by wire bonding or the like. Thus, the inner through hole 26*b*A is electrically connected to the IC chip 22A. As described above, the plurality of relay through holes 26*c*A is electrically connected to the IC chip 22A. Thus, the first through hole 26A is electrically connected to the IC chip 22A.

In the present embodiment, the IC chip 22A is a secure microcomputer. The IC chip 22A may have a known configuration having a contact type communication function and a contactless type communication function. Further, the IC chip 22A authenticates the user by comparing the user's fingerprint information acquired by the fingerprint sensor 24A with the fingerprint information stored in the IC chip 22A, and outputs the authentication result to a contactless type external device or a contact type external device. IC chip 22A is provided on the second surface 21*g*A of the first substrate 21A. The IC chip 22A is provided in a portion of the second surface 21*g*A on the inside (Di side) of the coupling portion 23A. The IC chip 22A is disposed on the second side (−D1 side) of the first substrate 21A in the first direction D1 and substantially at the center in the second direction D2. The IC chip 22A includes a plurality of terminals (not shown). Each terminal of the IC chip 22A is electrically connected to each of the coupling portion 23A, the fingerprint sensor 24A and the contact terminal 29A via the pad portion 27A, wires (not shown), the first through hole 26A, the fixing portion 25A, the second through hole 28*a*A, and the like. Thus, the IC chip 22A is electrically connected to the coupling portion 23A, the fingerprint sensor 24A and the contact terminal 29A.

The fingerprint sensor 24A is a sensor that acquires the user's fingerprint information. In the present embodiment, the fingerprint sensor 24A is a capacitance sensor, and acquires the user's fingerprint information by acquiring the electrical potential of the user's finger. The thickness of the fingerprint sensor 24A is approximately 200 μm or greater and 250 μm or less. The fingerprint sensor 24A is provided on the second surface 21*g*A of the first substrate 21A. The fingerprint sensor 24A is disposed on the first side (+D1 side) of the first substrate 21A in the first direction D1 and substantially at the center in the second direction D2. In the present embodiment, the fingerprint sensor 24A is arranged side by side with the IC chip 22A in the first direction D1. The fingerprint sensor 24A is electrically connected to the IC chip 22A via wiring (not shown) of the first substrate 21A. As shown in FIG. 18, the fingerprint sensor 24A has an acquisition portion 24*a*A that acquires the electrical potential of the user's finger on a rear surface 24*g*A of the fingerprint sensor 24A, that is, the surface facing the second side (−Dt side) in the plate thickness direction Dt. The acquisition portion 24*a*A is exposed to the outside of the IC card 10A through the second opening 16*a*A of the second card substrate 16A.

As shown in FIG. 21, the coupling portion 23A is a terminal formed on the second surface 21*g*A of the first substrate 21A. The coupling portion 23A is formed so as to extend substantially the entire circumference of the first substrate 21A along an outer edge 21*k*A. One end of the coupling portion 23A is electrically connected to the outer through hole 26*a*A via the land portion. As described above, the outer through hole 26*a*A is electrically connected to the inner through hole 26*b*A, and the inner through hole 26*b*A is electrically connected to the IC chip 22A. Thus, the coupling portion 23A is electrically connected to the IC chip 22A.

The coupling portion 23A is fixed to the first substrate 21A via an adhesive or the like (not shown). The coupling portion 23A may be formed, for example, on the second surface 21*g*A by patterning a copper foil or an aluminum foil by etching. The coupling portion 23A can be formed to have a thickness in the range of 5 μm or greater and 50 μm or less. In the present embodiment, the thickness of the coupling portion 23A is approximately 30 μm.

As shown in FIG. 18, when the IC module 20A is fitted into the card substrate 14A, the coupling portion 23A comes into contact with the connection terminal 33A in the plate thickness direction Dt. Thus, the coupling portion 23A is electrically connected to the booster antenna 32A via the connection terminal 33A. In the present embodiment, the coupling portion 23A is physically coupled to the booster antenna 32A. Therefore, the IC chip 22A can perform contactless type communication with a contactless type external device via the coupling portion 23A and the booster antenna 32A.

The second substrate 28A has a sheet-like form extending in a direction perpendicular to the plate thickness direction Dt. In the present embodiment, the second substrate 28A is a flexible substrate. Although not shown, the second substrate 28A is formed in a rectangular shape with the long side extending in the first direction D1 as viewed in the plate thickness direction Dt. The second substrate 28A may be made of, for example, an insulating material such as glass epoxy or polyethylene terephthalate. In the present embodiment, the second substrate 28A is formed to have a thickness in the range of 50 μm or greater and 200 μm or less. The second substrate 28A is disposed on the upper side (+Dt side) of the first substrate 21A in the plate thickness direction Dt. The second substrate 28A is disposed with a gap from the first substrate 21A in the plate thickness direction Dt. The second substrate 28A is disposed between the fixing portion 25A and the contact terminal 29A in the plate thickness direction Dt. The second substrate 28A is disposed inside the first aperture 15*a*A. The outer edge 21*k*A of the first substrate 21A overlaps the outer edge 28*k*A of the second substrate 28A when viewed in the plate thickness direction Dt. The second substrate 28A includes a third surface 28*f*A and a fourth surface 28*g*A. The third surface 28*f*A is a surface facing the upper side (+Dt side), that is, the first side in the plate thickness direction Dt, among the outer surfaces of the second substrate 28A. The third surface 28*f*A is the front surface of the second substrate 28A. The fourth surface 28*g*A is a surface facing the lower side (−Dt side) among the outer surfaces of the second substrate 28A. The fourth surface 28*g*A is a rear surface of the second substrate 28A. The second substrate 28A has a second through hole 28*a*A.

The second through hole 28*a*A penetrates the second substrate 28A in the plate thickness direction Dt and has a copper foil layer on the inner peripheral surface. In the present embodiment, the second substrate 28A has a plurality of second through holes 28*a*A. Each second through hole 28*a*A overlaps a different first through hole 26A when viewed in the plate thickness direction Dt. Each second through hole 28*a*A is connected to the contact terminal 29A. As will be described later, each second through hole 28*a*A is electrically connected to the first through hole 26A via the fixing portion 25A.

The fixing portion 25A fixes the first substrate 21A and the second substrate 28A to each other. The fixing portion 25A is disposed between the first substrate 21A and the second substrate 28A in the plate thickness direction Dt. In the present embodiment, the fixing portion 25A is formed of solder. More specifically, the fixing portion 25A is composed of a plurality of solder balls 25*a*A that are heated, melted and fixed to the first surface 21*f*A of the first substrate 21A and the fourth surface 28*g*A of the second substrate 28A. In the present embodiment, each solder ball 25*a*A before being heated and melted has a substantially spherical shape with a diameter of 100 μm or greater and 300 μm or less. The fixing portion 25A is electrically conductive. Some of the solder balls 25*a*A among the plurality of solder balls 25*a*A are respectively connected to the first through holes 26A and the second through holes 28*a*A that are arranged to overlap the first through holes 26A in the plate thickness direction Dt. Thus, each first through hole 26A is electrically connected, via the solder ball 25*a*A, to the second through hole 28*a*A arranged to overlap the first through hole 26A in the plate thickness direction Dt. That is, the first through hole 26A is electrically connected to the second through hole 28*a*A via the fixing portion 25A. The configuration of the fixing portion 25A is not limited to the present embodiment, and the fixing portion 25A may be a conductive adhesive.

As shown in FIG. 20, the contact terminal 29A is provided on the third surface 28*f*A of the second substrate 28A. The contact terminal 29A is configured to be contactable with a contact type external device. The contact terminal 29A is electrically conductive. The contact terminal 29A may be made of, for example, a metal such as gold, nickel or palladium. As shown in FIG. 18, the contact terminal 29A is fixed to the first surface 21*f*A of the first substrate 21A via the fixing portion 25A and the second substrate 28A. That is, the contact terminal 29A is fixed to the first surface 21*f*A of the first substrate 21A via the fixing portion 25A. The contact terminal 29A is electrically connected to the fixing portion 25A via the second through hole 28*a*A. As described above, the first through hole 26A is electrically connected to the fixing portion 25A, and the first through hole 26A is electrically connected to the IC chip 22A. Thus, the contact terminal 29A is electrically connected to the IC chip 22A via the fixing portion 25A and the first through hole 26A. Therefore, the IC chip 22A can perform contact type communication with a contact type external device via the contact terminal 29A.

As shown in FIG. 20, the contact terminal 29A is composed of a plurality of terminals. In the present embodiment, the number of terminals used when the IC chip 22A performs contact type communication with a contact type external device is six. That is, the IC module 20A of the present embodiment is a six-terminal IC module. The number of terminals used when the IC chip 22A performs contact type communication with a contact type external device is not limited to six, but may be five or less, or seven or more.

As shown in FIG. 21, the first resin sealing portion 51A covers the IC chip 22A, the upper portion (+Dt side) of the fingerprint sensor 24A, the pad portion 27A, wires (not shown), and the like. As shown in FIG. 18, the first resin sealing portion 51A is provided on the second surface 21*g*A of the first substrate 21A. The first resin sealing portion 51A is disposed inside the first opening 15*b*A and the second opening 16*a*A. The lower end of the first resin sealing portion 51A is located on the upper side (+Dt side) of the rear surface 16*g*A of the second card substrate 16A. The lower end of the first resin sealing portion 51A is located on the upper side of the rear surface 24*g*A of the fingerprint sensor 24A. Thus, the rear surface 24*g*A of the fingerprint sensor 24A is exposed from the first resin sealing portion 51A. The first resin sealing portion 51A is made of a resin. The first resin sealing portion 51A has insulating properties. The first resin sealing portion 51A may be made of, for example, a known epoxy resin, an ultraviolet curing resin or a thermosetting resin.

The second resin sealing portion 52A is disposed between the first substrate 21A and the second substrate 28A in the plate thickness direction Dt. The second resin sealing portion 52A is disposed between the plurality of solder balls 25*a*A and the outside (Do side) of the fixing portion 25A. As a result, at least a portion of the fixing portion 25A is covered with the second resin sealing portion 52A. The second resin sealing portion 52A is made of a resin. The second resin sealing portion 52A has insulating properties. The second resin sealing portion 52A may be made of, for example, a known epoxy resin, an ultraviolet curing resin or a thermosetting resin. The second resin sealing portion 52A may not necessarily be provided.

The first card substrate 15A and the antenna substrate 30A, and the second card substrate 16A and the antenna substrate 30A are fixed together by an adhesive layer (not shown). Thus, the first card substrate 15A and the second card substrate 16A are fixed to each other via the antenna substrate 30A.

The IC card 10A is formed by integrating the antenna substrate 30A, the card substrate 14A laminated on the antenna substrate 30A, and the IC module 20A inserted from the upper side (+Dt side) of the card substrate 14A, by thermal pressure lamination, adhesion, or the like, and then punching it into a card shape.

In the production process of the IC module 20A, the second substrate 28A is fixed, via the fixing portion 25A, to the first substrate 21A on which the coupling portion 23A and the pad portion 27A are formed, and then the IC chip 22A and the fingerprint sensor 24A are mounted on the second surface 21*g*A of the first substrate 21A. Then, a plurality of electrodes of the IC chip 22A are electrically connected to the pad portion 27A by wire bonding or the like. Then, the first resin sealing portion 51A is formed on the second surface 21*g*A of the first substrate 21A. Further, a SiP (System in Package) formed by sealing the IC chip 22A and the fingerprint sensor 24A in one package may be mounted on the second surface 21*g*A of the first substrate 21A. In this case, the number of production steps of the IC module 20A can be reduced compared with the case where each of the IC chip 22A and the fingerprint sensor 24A are mounted on the second surface 21*g*A.

According to the present embodiment, the IC module 20A includes the first substrate 21A having the first through hole 26A penetrating in the plate thickness direction Dt, the contact terminal 29A fixed to the first surface 21*f*A of the first substrate 21A facing the upper side (+Dt side), that is, the first side in the plate thickness direction Dt via the conductive fixing portion 25A, and the IC chip 22A and the fingerprint sensor 24A provided on the second surface 21*g*A of the first substrate 21A facing the lower side (−Dt side), that is, the second side in the plate thickness direction Dt, wherein the contact terminal 29A is electrically connected to the IC chip 22A via the fixing portion 25A and the first through hole 26A. If the IC card 10A having a fingerprint authentication function has a configuration in which the contact terminal 29A, the fingerprint sensor 24A and the IC chip 22A are each separately mounted on the card substrate 14A, it is necessary to provide a wiring mechanism for electrically connecting the contact terminal 29A, the fingerprint sensor 24A and the IC chip 22A. This requires connecting the wiring mechanism to each of the contact terminal 29A, the fingerprint sensor 24A and the IC chip 22A in the production process of the IC card 10A, increasing the number of production steps and production costs of the IC card 10A. In contrast, in the present embodiment, an integrated IC module 20A can be formed in which the contact terminal 29A and the fingerprint sensor 24A are each electrically connected to the IC chip 22A by fixing the contact terminal 29A to the first surface 21*f*A of the first substrate 21A and providing the IC chip 22A and the fingerprint sensor 24A on the second surface 21*g*A of the first substrate 21A. Therefore, the IC card 10A can be formed by a simple operation of inserting the IC module 20A into a card substrate 14A, suppressing an increase in the number of production steps and production costs of the IC card 10A having a fingerprint authentication function.

Further, in the IC card 10A provided with the fingerprint sensor 24A, the fingerprint sensor 24A has a large number of terminals, which increases the number of terminals of the IC chip 22A. Therefore, when the contact terminal 29A, the fingerprint sensor 24A and the IC chip 22A are mounted on the substrate using an anisotropic conductive film (ACF), if a force is applied to the anisotropic conductive film due to bending of the IC card 10A or the like, the anisotropic conductive film is likely to be peeled off, causing the IC card 10A to be unable to communicate. In contrast, in the present embodiment, since the contact terminal 29A is electrically connected to the IC chip 22A via the fixing portion 25A and the first through hole 26A, the electrical connection between the contact terminal 29A and the IC chip 22A can be stabilized. Further, in the present embodiment, since the fingerprint sensor 24A is electrically connected to the IC chip 22A via the wiring formed on the first substrate 21A, the electrical connection between the fingerprint sensor 24A and the IC chip 22A can be stabilized. As a result, even when the IC card 10A is bent, the electrical connection between the contact terminal 29A and the IC chip 22A and between the fingerprint sensor 24A and the IC chip 22A can be stabilized, and thus the reliability of the IC card 10A as a communication medium can be enhanced.

According to the present embodiment, the IC module 20A includes the second substrate 28A disposed between the fixing portion 25A and the contact terminal 29A in the plate thickness direction Dt, the second substrate 28A having the second through hole 28*a*A penetrating in the plate thickness direction Dt, and the contact terminal 29A is provided on the third surface 28*f*A of the second substrate 28A facing the upper side (Dt side), that is, the first side in the plate thickness direction, and is electrically connected to the fixing portion 25A via the second through hole 28*a*A. In general, since the contact terminal 29A is formed thin, the rigidity of the contact terminal 29A in the plate thickness direction Dt is small. Therefore, if the contact terminal 29A is directly fixed to the first substrate 21A via the fixing portion 25A in the production process of the IC module 20A, it is difficult to stabilize the shape of the contact terminal 29A, and thus the positional accuracy of the contact terminal 29A relative to the first substrate 21A is likely to be lowered. In contrast, in the present embodiment, the second substrate 28A can be fixed to the first substrate 21A via the fixing portion 25A after the contact terminal 29A is fixed to the second substrate 28A having high rigidity. As a result, the positional accuracy of the contact terminal 29A relative to the first substrate 21A can be easily improved. Therefore, an increase in the number of production steps and production costs of the IC module 20A and the IC card 10A can be suppressed.

Further, according to the present embodiment, the contact terminal 29A can be electrically connected to the IC chip 22A via the second through hole 28*a*A, the fixing portion 25A and the first through hole 26A, the electrical connection between the contact terminal 29A and the IC chip 22A can be stabilized. Therefore, even when the IC card 10A is bent, the electrical connection between the contact terminal 29A and the IC chip 22A can be stabilized, and thus the reliability of the IC card 10A as a communication medium can be enhanced.

According to the present embodiment, the fixing portion 25A is formed of solder. Therefore, when the second substrate 28A is fixed to the first substrate 21A in the production process of the IC module 20A, the second substrate 28 is pressed against the first substrate 21A while the solder, which is the solder ball 25*a*A in the present embodiment, disposed between the second substrate 28A and the first substrate 21A is heated and melted. In this operation, the dimension of the heated and melted solder in the plate thickness direction Dt varies. Accordingly, the distance between the second substrate 28A and the first substrate 21A in the plate thickness direction Dt can be easily adjusted by adjusting the dimension of the fixing portion 25A in the plate thickness direction Dt. Therefore, the thickness of the IC module 20A can be easily set in the range specified by ISO/IEC 7810, and thus the yield of the IC module 20A can be increased.

According to the present embodiment, the IC module 20A includes the first resin sealing portion 51A made of a resin, the first resin sealing portion 51A covers the IC chip 22A, and the rear surface 24*g*A of the fingerprint sensor 24A, that is, the surface facing the second side (−Dt side) in the plate thickness direction Dt is exposed from the first resin sealing portion 51A. Accordingly, the first resin sealing portion 51A can protect the IC chip 22A from external force loads and environmental loads, and can prevent breakage of wires connected to the terminals of the IC chip 22A. As a result, the electrical connection between the IC chip 22A and the contact terminal 29A and between the IC chip 22A and the fingerprint sensor 24A can be more suitably stabilized. Therefore, the reliability of the IC card 10A as a communication medium can be more suitably enhanced.

Further, in the present embodiment, since the rear surface 24*g*A of the fingerprint sensor 24A is exposed from the first resin sealing portion 51A as described above, the acquisition portion 24*a*A provided on the rear surface 24*g*A of the fingerprint sensor 24A can be exposed to the outside of the first resin sealing portion 51A. This allows the user to easily touch the acquisition portion 24*a*A with their finger, improving the convenience of the IC card 10A.

According to the present embodiment, the IC module 20A includes the second resin sealing portion 52A made of a resin, and at least a part of the fixing portion 25A is covered with the second resin sealing portion 52A. If stress is applied to the fixing portion 25A in the production process of the IC card 10A, cracking or the like may occur in the fixing portion 25A. Cracking or the like in the fixing portion 25A may cause the electrical connection between the IC chip 22A and the contact terminal 29A to be unstable. In contrast, in the present embodiment, since the second resin sealing portion 52A can protect the fixing portion 25A, occurrence of cracking or the like in the fixing portion 25A can be suppressed even when stress is applied to the fixing portion 25A. Therefore, the IC chip 22A and the contact terminal 29A can be more stably electrically connected to each other, and thus the reliability of the IC card 10A as a communication medium can be more suitably enhanced.

According to the present embodiment, the IC module 20A includes the coupling portion 23A electrically connected to the IC chip 22A, the outer edge 21*k*A of the first substrate 21A overlaps the outer edge 28*k*A of the second substrate 28A when viewed in the plate thickness direction Dt, and the coupling portion 23A is provided on the second surface 21*g*A of the first substrate 21. Therefore, in the production process of the IC card 10A, the coupling portion 23A can be brought into contact with the connection terminal 33A of the antenna substrate 30A by a simple operation of inserting the IC module 20A into the card substrate 14A from the upper side (+Dt side) and fitting it into the card substrate 14A. This allows the coupling portion 23A and the booster antenna 32A to be easily physically coupled to each other via the connection terminal 33A. Therefore, an increase in the number of production steps and production costs of the IC card 10A can be suppressed.

According to the present embodiment, the IC card 10A includes the IC module 20A, the card substrate 14A into which the IC module 20A is fitted, and the antenna substrate 30A having the booster antenna 32A electrically connected to the coupling portion 23A. Therefore, the IC chip 22A can perform contact type communication with a contact type external device via the contact terminal 29A, and can perform contactless type communication with a contactless type external device via the booster antenna 32A. Therefore, it is possible to suppress an increase in the number of production steps and production costs of the IC card 10A capable of performing both contact type communication and contactless type communication and having a fingerprint authentication function.

According to the present embodiment, the antenna substrate 30A includes the connection terminal 33A electrically connected to the booster antenna 32A, and the coupling portion 23A is a terminal in contact with the connection terminal 33A. This allows the coupling portion 23A and the booster antenna 32A to be physically coupled to each other via the connection terminal 33A. Therefore, since the IC chip 22A can be electrically connected to the booster antenna 32A, the IC card 10A can perform contactless type communication with a contactless type external device.

Tenth Embodiment

Next, a tenth embodiment of the present invention will be described with reference to FIGS. 22 to 24. In the following description, components that are common to those in the ninth embodiment are denoted by the same reference signs, and duplicated description thereof will be omitted. The following description will be given focusing on the differences from the ninth embodiment.

Figure 22:
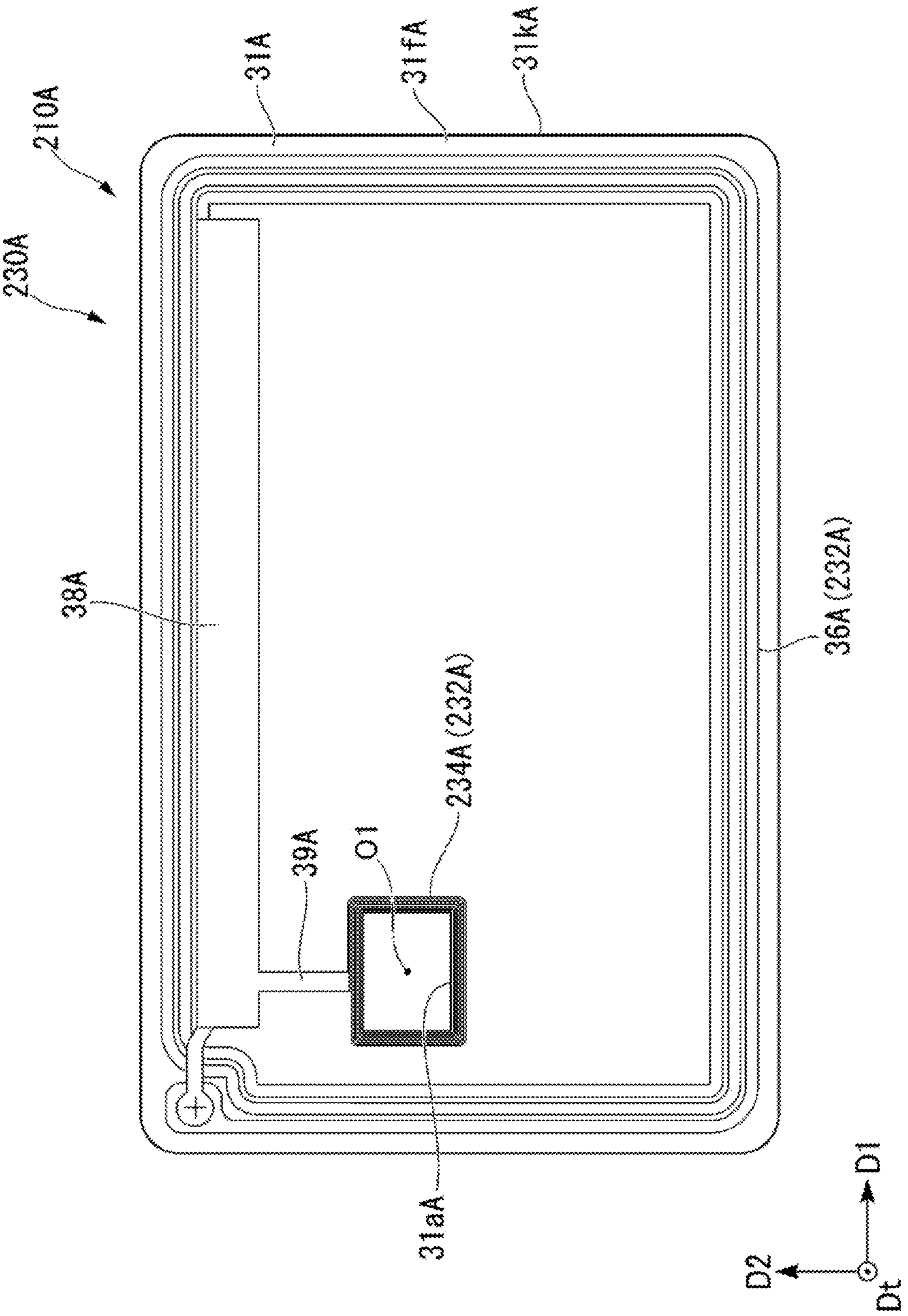
FIG. 22 is a plan view schematically illustrating an antenna substrate of an IC card according to a tenth embodiment of the present invention.
Figure 23:
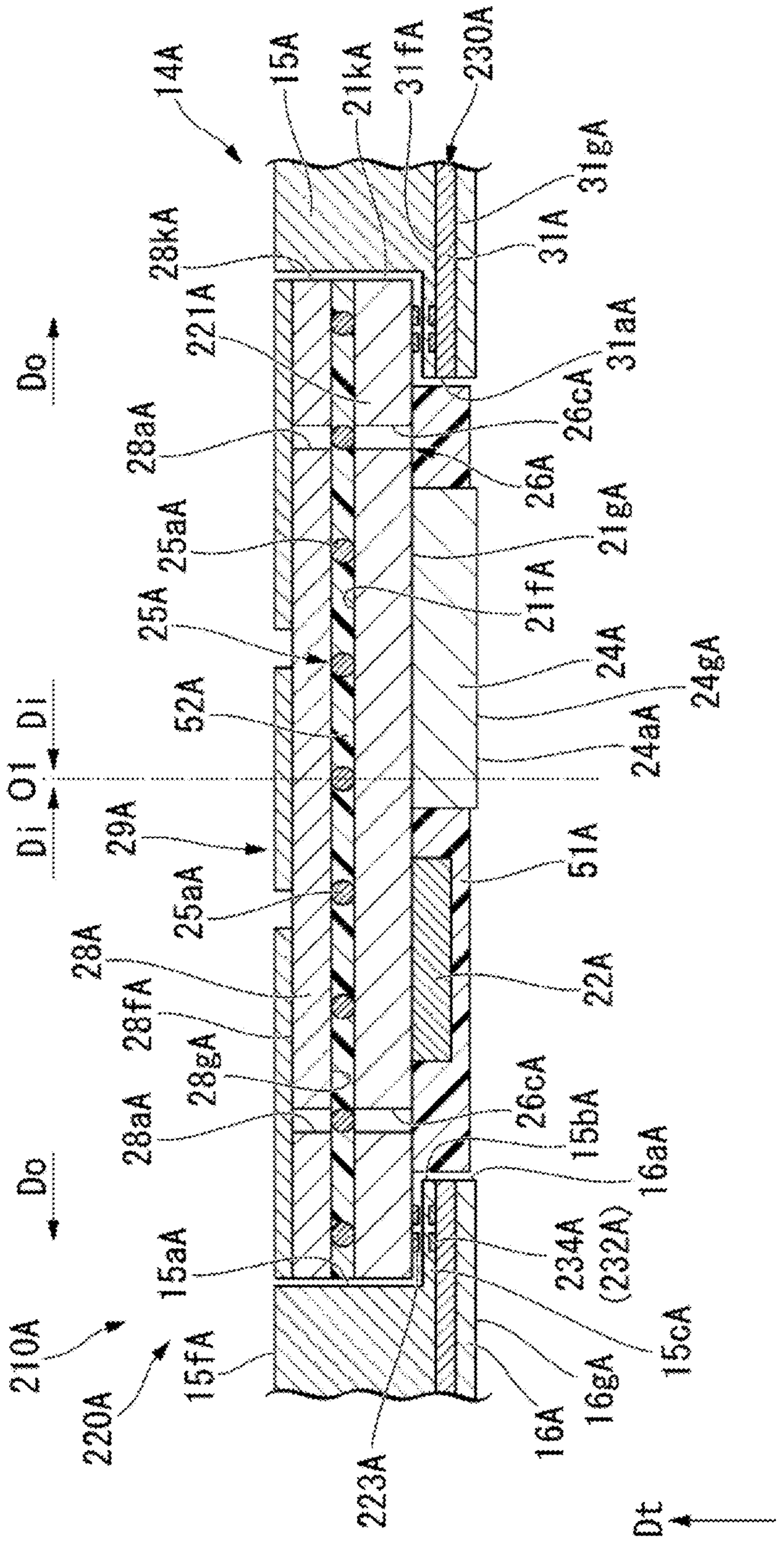
FIG. 23 is a cross-sectional view schematically illustrating the IC card.

FIG. 22 is a plan view schematically illustrating an antenna substrate 230A of an IC card 210A according to the present embodiment. FIG. 23 is a cross-sectional view schematically illustrating the IC card 210A. FIG. 24 is a plan view of an IC module 220A of the IC card 210A as seen from below.

As shown in FIG. 22, in the present embodiment, the antenna substrate 230A includes an antenna sheet 31A, a booster antenna 232A and a capacitor 38A. The booster antenna 232A includes a coupling coil 234A and an antenna coil 36A.

The coupling coil 234A is formed on a front surface 31*f*A of the antenna sheet 31A. The coupling coil 234A has a rectangular shape surrounding the center axis O1. The coupling coil 234A is formed in a spiral shape having two or more turns. The coupling coil 234A is electrically connected to the capacitor 38A and the antenna coil 36A via a connection wiring 39A. As shown in FIG. 23, the coupling coil 234A is disposed inside a bottom wall 15*c*A of a first card substrate 15A.

In the present embodiment, the IC module 220A includes a first substrate 221A, an IC chip 22A, a coupling portion 223A, a fingerprint sensor 24A, a fixing portion 25A, a second substrate 28A, a contact terminal 29A, a first resin sealing portion 51A and a second resin sealing portion 52A. As shown in FIG. 24, the IC module 220A includes a pad portion 27A.

In the present embodiment, the coupling portion 223A is a coil formed on a second surface 21*g*A of the first substrate 221A. The coupling portion 223A extends along an outer edge 21*k*A of the first substrate 221A and is formed in a substantially rectangular shape. The coupling portion 223A is formed of a coil wire wound in a spiral shape. In the present embodiment, the coupling portion 223A is formed by a coil wire wound about twice in a substantially rectangular shape. As shown in FIG. 23, the coupling portion 223A faces the coupling coil 234A of the antenna substrate 230A with a gap therebetween in the plate thickness direction Dt. Thus, the coupling portion 223A can be electromagnetically coupled to the booster antenna 232A.

The coupling portion 223A is fixed to the second surface 21*g*A of the first substrate 221A via an adhesive or the like (not shown). The coupling portion 223A may be formed, for example, on the second surface 21*g*A by patterning a copper foil or an aluminum foil by etching. The coupling portion 223A can be formed to have a thickness in the range of 5 μm or greater and 50 μm or less. In the present embodiment, the thickness of the coupling portion 223A is approximately 30 μm.

Figure 24:
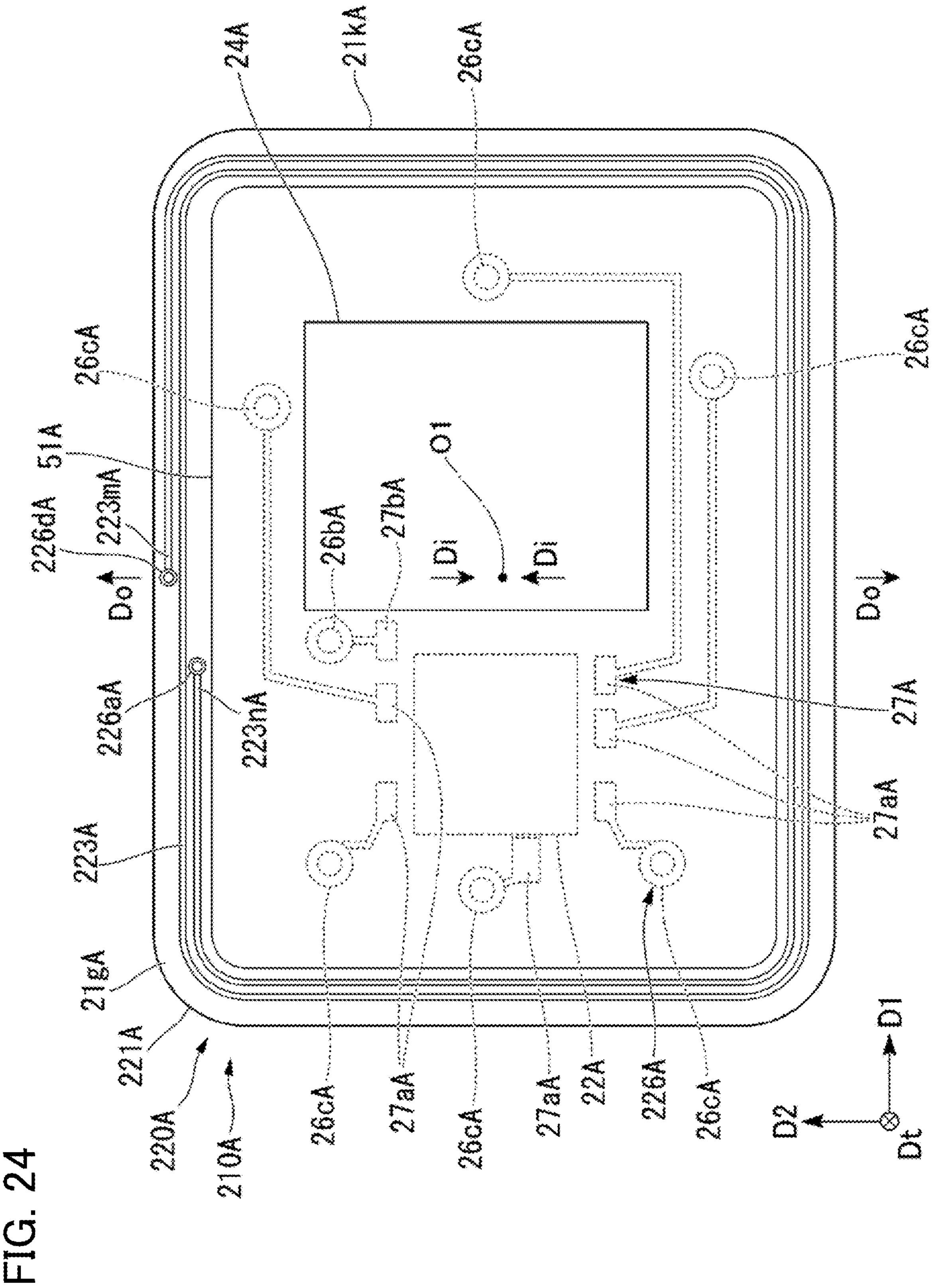
FIG. 24 is a plan view of an IC module of the IC card as seen from below.

As shown in FIG. 24, the first substrate 221A has a first through hole 226A. Other configurations and the like of the first substrate 221A are the same as those of the first substrate 21A of the ninth embodiment described above. In the present embodiment, the first through hole 226A includes an outer through hole 226*a*A, an inner through hole 26*b*A, a plurality of relay through holes 26*c*A and an outermost through hole 226*d*A.

The outer through hole 226*a*A is electrically connected to an innermost end 223*n*A of the coupling portion 223A via the land portion. Although not shown, the outer through hole 226*a*A is electrically connected to the IC chip 22A via the fixing portion 25A, a second through hole 28*a*A, the contact terminal 29A and the inner through hole 26*b*A. Thus, the coupling portion 223A is electrically connected to the IC chip 22A. As described above, the coupling portion 223A can be electromagnetically coupled to the booster antenna 232A. Therefore, the IC chip 22A can perform contactless type communication with a contactless type external device via the coupling portion 223A and the booster antenna 232A. The outermost through hole 226*d*A is electrically connected to an outermost end 223*m*A of the coupling portion 223A via the land portion. Although not shown, the outermost through hole 226*d*A is electrically connected to the contact terminal 29A.

According to the present embodiment, the coupling portion 223A is a coil that can be electromagnetically coupled to the booster antenna 232A. Therefore, since the IC chip 22A can be electrically connected to the booster antenna 232A via the coupling portion 223A, the IC card 210A can perform contactless type communication with a contactless type external device.

Further, in the present embodiment, as in the ninth embodiment, an integrated IC module 220A can be formed in which the contact terminal 29A and the fingerprint sensor 24A are each electrically connected to the IC chip 22A by fixing the contact terminal 29A to the first surface 21*f*A of the first substrate 221A and providing the IC chip 22A and the fingerprint sensor 24A on the second surface 21*g*A of the first substrate 221A. Therefore, the IC card 210A can be formed by a simple operation of inserting the IC module 220A into a card substrate 14A, suppressing an increase in the number of production steps and production costs of the IC card 210A having a fingerprint authentication function.

Further, in the present embodiment, as in the ninth embodiment, the outer edge 21*k*A of the first substrate 221A overlaps the outer edge 28*k*A of the second substrate 28A when viewed in the plate thickness direction Dt, and the coupling portion 223A is provided on the second surface 21*g*A of the first substrate 21A. As a result, in the production process of the IC card 210A, the coupling portion 223A and the coupling coil 234A of the antenna substrate 230A can be disposed facing each other in the plate thickness direction Dt by a simple operation of inserting the IC module 220A into the card substrate 14A from the upper side (+Dt side) and fitting it into the card substrate 14A. Therefore, an increase in the number of production steps and production costs of the IC card 210A can be suppressed.

Eleventh Embodiment

Next, an eleventh embodiment of the present invention will be described with reference to FIG. 25. In the following description, components that are common to those in the ninth embodiment are denoted by the same reference signs, and duplicated description thereof will be omitted. The following description will be given focusing on the differences from the ninth embodiment.

Figure 25:
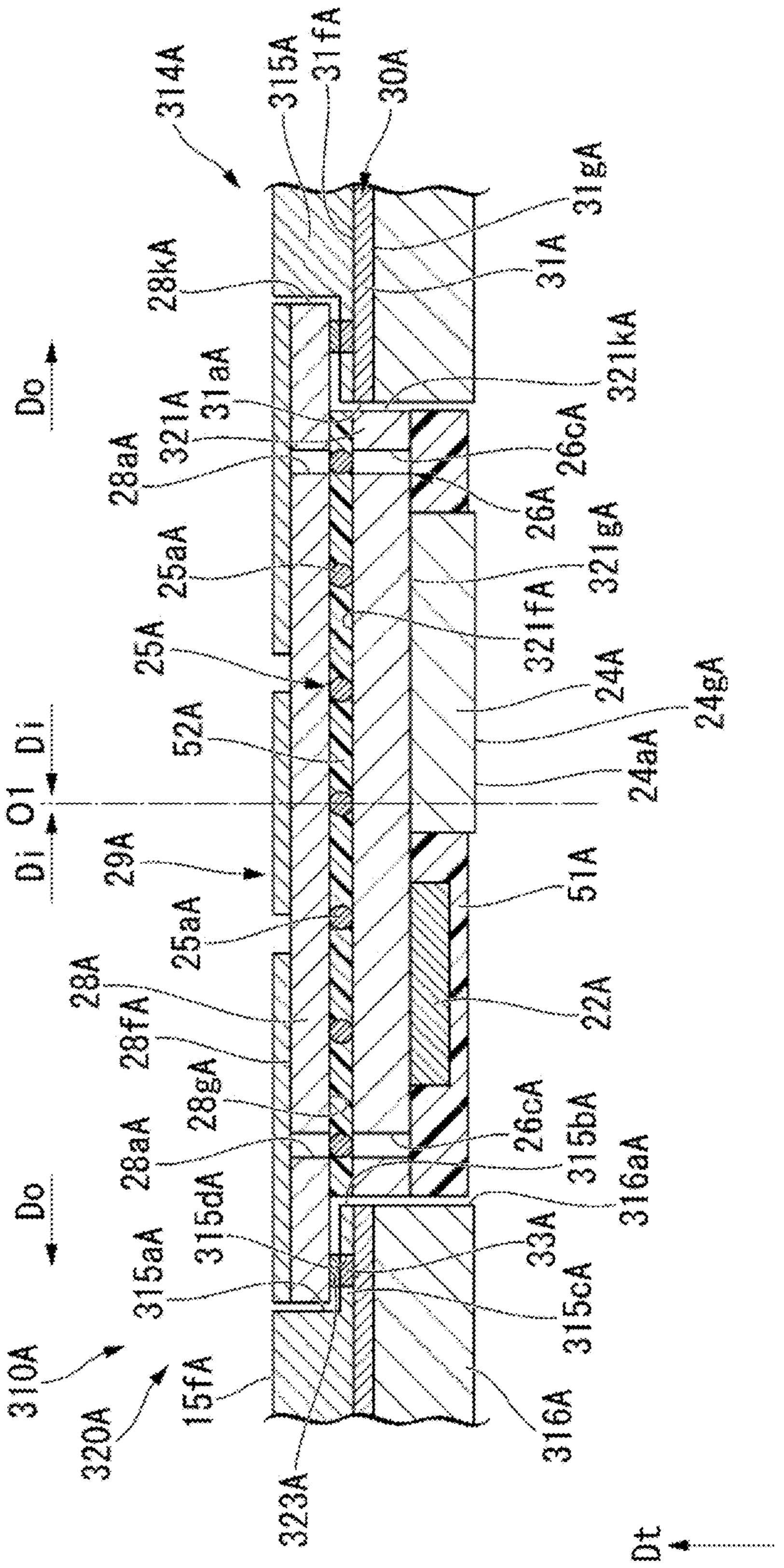
FIG. 25 is a cross-sectional view schematically illustrating an IC card according to an eleventh embodiment of the present invention.

FIG. 25 is a cross-sectional view schematically illustrating an IC card 310A according to the eleventh embodiment.

The IC card 310A of the present embodiment includes a card substrate 314A, an antenna substrate 30A and an IC module 320A.

The card substrate 314A includes a first card substrate 315A and a second card substrate 316A. The dimension of the first card substrate 315A in the plate thickness direction Dt is smaller than the dimension of the first card substrate 15A of the ninth embodiment in the plate thickness direction Dt. The dimension of the second card substrate 316A in the plate thickness direction Dt is larger than the dimension of the second card substrate 16A of the ninth embodiment in the plate thickness direction Dt. The first card substrate 315A has a first aperture 315*a*A, a first opening 315*b*A and a substrate hole 315*d*A.

The first aperture 315*a*A is a hole recessed downward (−Dt side) from the front surface 15*f*A of the first card substrate 315A. The shape of the first aperture 315*a*A viewed in the plate thickness direction Dt is formed in a substantially rectangular shape. The first opening 315*b*A penetrates a bottom wall 315*c*A of the first aperture 315*a*A in the plate thickness direction Dt. The shape of the first opening 315*b*A viewed in the plate thickness direction Dt is formed in a substantially rectangular shape. The substrate hole 315*d*A penetrates the bottom wall 315*c*A in the plate thickness direction Dt. The substrate hole 315*d*A surrounds the center axis O1. Although not shown, the shape of the substrate hole 315*d*A viewed in the plate thickness direction Dt is formed in a substantially rectangular annular shape. The connection terminal 33A of the antenna substrate 30A is disposed inside the substrate hole 315*d*A. Other configurations and the like of the first card substrate 315A are the same as those of the first card substrate 15A of the first embodiment described above.

The second card substrate 316A has a second opening 316*a*A. The second opening 316*a*A penetrates the second card substrate 316A in the plate thickness direction Dt. The shape of the second opening 316*a*A viewed in the plate thickness direction Dt is formed in a substantially rectangular shape. The inner surface of the second opening 316*a*A overlaps the inner surface of the first opening 315*b*A when viewed in the plate thickness direction Dt. Other configurations and the like of the second card substrate 316A are the same as those of the second card substrate 16A of the ninth embodiment described above.

The IC module 320A includes a first substrate 321A, an IC chip 22A, a coupling portion 323A, a fingerprint sensor 24A, a fixing portion 25A, a second substrate 28A, a contact terminal 29A, a first resin sealing portion 51A and a second resin sealing portion 52A.

The first substrate 321A is formed in a rectangular shape with the long side extending in the first direction D1. The dimensions of the first substrate 321A in the first direction D1 and the second direction D2 are smaller than the dimensions of the first substrate 21A of the ninth embodiment in the first direction D1 and the second direction D2, respectively. The outer edge 28*k*A of the second substrate 28A overlaps the outer edge 321*k*A of the first substrate 321A when viewed in the plate thickness direction Dt. The first substrate 321A is disposed inside the first opening 315*b*A and the second opening 316*a*A. The first substrate 321A includes a first surface 321*f*A and a second surface 321*g*A. The first surface 321*f*A is the front surface of the first substrate 321A. The second surface 321*g*A is the rear surface of the first substrate 321A.

The coupling portion 323A of the present embodiment is a terminal formed on a fourth surface 28*g*A of the second substrate 28A. As described above, the fourth surface 28*g*A faces the lower side (−Dt side), that is, the second side in the plate thickness direction Dt. The coupling portion 323A is provided in a portion of the fourth surface 28*g*A on the outside (Do side) of the first substrate 321A. The coupling portion 323A is formed so as to extend substantially the entire circumference of the second substrate 28A along an outer edge 28*k*A. Although not shown, the coupling portion 323A is electrically connected to the IC chip 22A via the fixing portion 25A and the first through hole 26A.

When the IC module 320A is fitted into the card substrate 314A, the coupling portion 323A comes into contact with the connection terminal 33A in the plate thickness direction Dt. Thus, the coupling portion 323A is electrically connected to the booster antenna 32A via the connection terminal 33A. In the present embodiment, the coupling portion 323A is physically coupled to the booster antenna 32A. Therefore, the IC chip 22A can perform contactless type communication with a contactless type external device via the coupling portion 323A and the booster antenna 32A.

According to the present embodiment, the IC module 320A includes the coupling portion 323A electrically connected to the IC chip 22A, the outer edge 28*k*A of the second substrate 28A surrounds the outer edge 321*k*A of the first substrate 321A when viewed in the plate thickness direction Dt, and the coupling portion 323A is provided in a portion of the fourth surface 28*g*A of the second substrate 28A facing the lower side (−Dt side), that is, the second side in the plate thickness direction Dt, on the outside (Do side) of the first substrate 321A. Therefore, in the production process of the IC card 310A, the coupling portion 323A can be brought into contact with the connection terminal 33A of the antenna substrate 30A by a simple operation of inserting the IC module 320A into the card substrate 314A from the upper side (+Dt side) and fitting it into the card substrate 314A. Since the coupling portion 323A and the booster antenna 32A can be easily physically coupled to each other via the connection terminal 33A, an increase in the number of production steps and production costs of the IC card 310A can be suppressed.

Twelfth Embodiment

Next, a twelfth embodiment of the present invention will be described with reference to FIG. 26. In the following description, components that are common to those in the tenth embodiment are denoted by the same reference signs, and duplicated description thereof will be omitted. The following description will be given focusing on the differences from the tenth embodiment.

Figure 26:
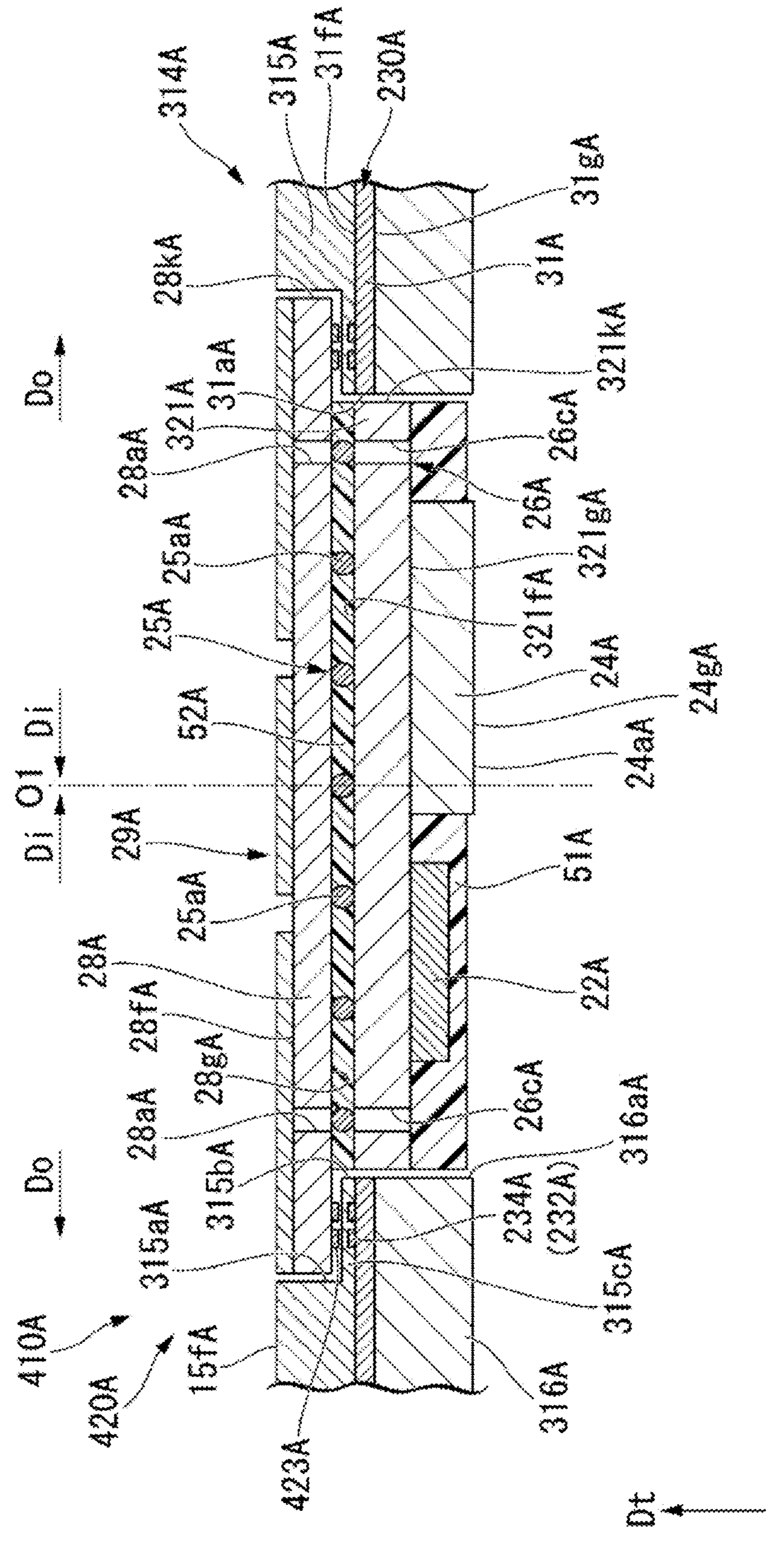
FIG. 26 is a cross-sectional view schematically illustrating an IC card according to a twelfth embodiment of the present invention.

FIG. 26 is a cross-sectional view schematically illustrating an IC card 410A according to the twelfth embodiment.

The IC card 410A of the present embodiment includes a card substrate 314A, an antenna substrate 230A and an IC module 420A. Configurations and the like of the card substrate 314A of the present embodiment are the same as configurations and the like of the card substrate 314A of the eleventh embodiment described above.

In the present embodiment, a coupling portion 423A of the IC module 420A is a coil formed on a fourth surface 28*g*A of a second substrate 28A. More specifically, the coupling portion 423A is provided in a portion of the fourth surface 28*g*A on the outside (Do side) of a first substrate 321A. The coupling portion 423A extends along an outer edge 28*k*A of the second substrate 28A and is formed in a substantially rectangular shape. Although not shown, the coupling portion 423A is formed of a coil wire wound in a spiral shape. Although not shown, the coupling portion 423A is electrically connected to the IC chip 22A via the fixing portion 25A and the first through hole 26A. That is, the coupling portion 423A is electrically connected to the IC chip 22A. The coupling portion 423A faces the coupling coil 234A of the antenna substrate 230A with a gap therebetween in the plate thickness direction Dt. Thus, the coupling portion 423A can be electromagnetically coupled to the booster antenna 232A. Other configurations and the like of the IC module 420A of the present embodiment are the same as those of the IC module 320A of the eleventh embodiment described above.

According to the present embodiment, the IC module 420A includes the coupling portion 423A electrically connected to the IC chip 22A, the outer edge 28*k*A of the second substrate 28A surrounds the outer edge 321*k*A of the first substrate 321A when viewed in the plate thickness direction Dt, and the coupling portion 423A is provided in a portion of the fourth surface 28*g*A of the second substrate 28A on the outside (Do side) of the first substrate 321A. As a result, in the production process of the IC card 410A, the coupling portion 423A and the coupling coil 234A of the antenna substrate 230A can be disposed facing each other in the plate thickness direction Dt by a simple operation of inserting the IC module 420A into the card substrate 314A from the upper side (+Dt side) and fitting it into the card substrate 314A. Therefore, an increase in the number of production steps and production costs of the IC card 410A can be suppressed.

Thirteenth Embodiment

Next, a thirteenth embodiment of the present invention will be described with reference to FIG. 27. In the following description, components that are common to those in the eleventh embodiment are denoted by the same reference signs, and duplicated description thereof will be omitted. The following description will be given focusing on the differences from the eleventh embodiment.

Figure 27:
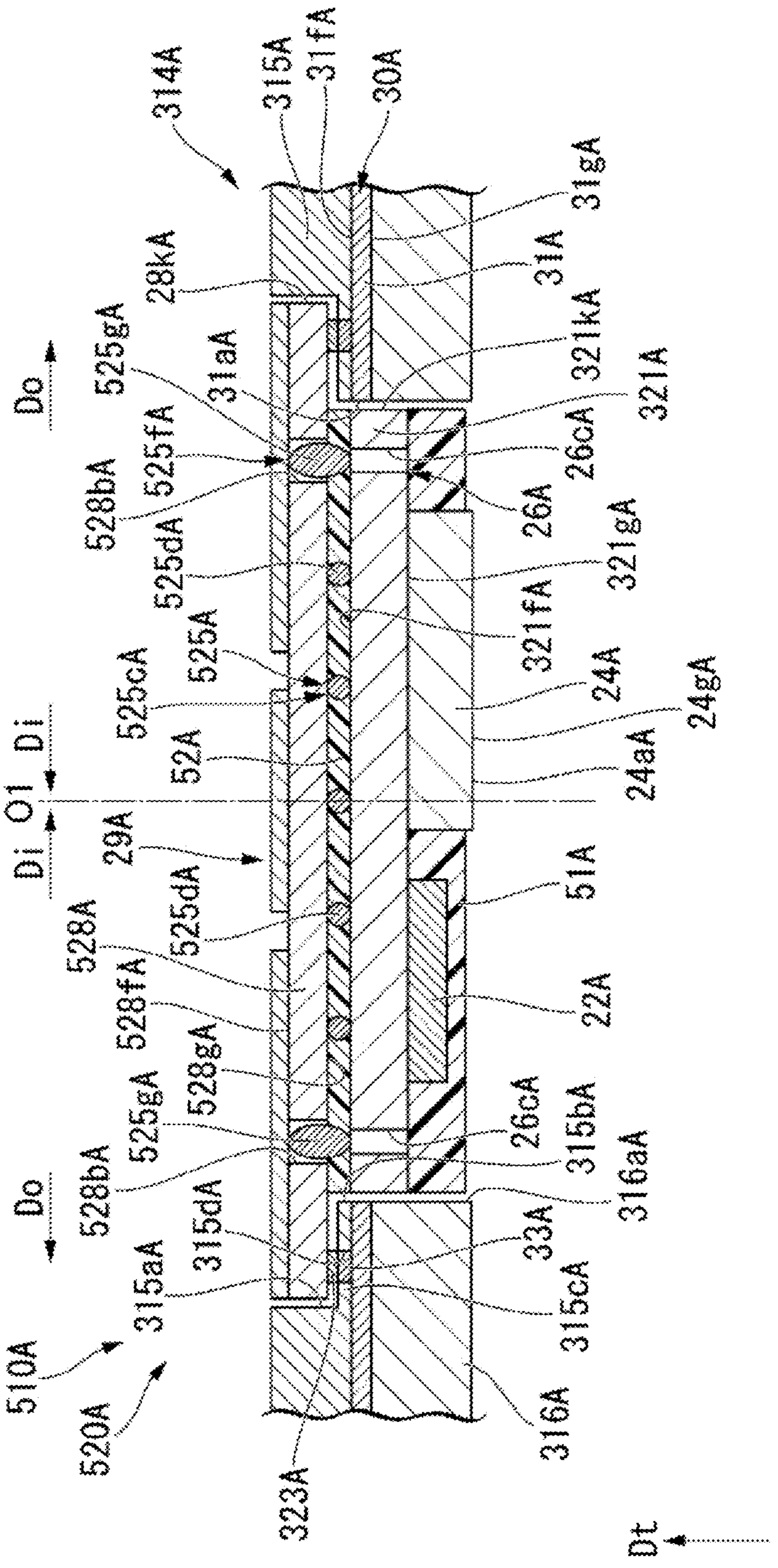
FIG. 27 is a cross-sectional view schematically illustrating an IC card according to a thirteenth embodiment of the present invention.

FIG. 27 is a cross-sectional view schematically illustrating an IC card 510A according to the thirteenth embodiment.

An IC module 520A of the present embodiment includes a first substrate 321A, an IC chip 22A, a coupling portion 323A, a fingerprint sensor 24A, a fixing portion 525A, a second substrate 528A, a contact terminal 29A, a first resin sealing portion 51A and a second resin sealing portion 52A.

The second substrate 528A is disposed between the first substrate 321A and the contact terminal 29A in the plate thickness direction Dt. The contact terminal 29A is provided on a third surface 528*f*A of the second substrate 528A. The second substrate 528A has a hole 528*b*A. The hole 528*b*A penetrates the second substrate 528A in the plate thickness direction Dt. In the present embodiment, the second substrate 528A has a plurality of holes 528*b*A. Each hole 528*b*A overlaps a different first through hole 26A when viewed in the plate thickness direction Dt.

The fixing portion 525A fixes the first substrate 321A and the second substrate 528A to each other, and electrically connects the first through hole 26A and the contact terminal 29A. The fixing portion 525A includes a first fixing portion 525*c*A and a second fixing portion 525*f*A.

The first fixing portion 525*c*A is disposed between the first substrate 321A and the second substrate 528A in the plate thickness direction Dt. In the present embodiment, the first fixing portion 525*c*A is formed of solder. More specifically, the first fixing portion 525*c*A is composed of a plurality of solder balls 525*d*A that are heated, melted and fixed to a first surface 321*f*A of the first substrate 321A and a fourth surface 528*g*A of the second substrate 528A. The first fixing portion 525*c*A fixes the first substrate 321A and the second substrate 528A to each other. The first fixing portion 525*c*A is electrically conductive.

The second fixing portion 525*f*A passes through the inside of the hole 528*b*A of the second substrate 528A in the plate thickness direction Dt. In the present embodiment, the second fixing portion 525*f*A is formed of a copper core solder ball 525*g*A. More specifically, the second fixing portion 525*f*A is composed of a plurality of a plurality of copper core solder balls 525*g*A that are heated and melted and fixed to a first surface 321*f*A of the first substrate 321A and the contact terminal 29A. Thus, the second fixing portion 525*f*A fixes the first substrate 321A and the contact terminal 29A to each other. In the present embodiment, the copper core solder ball 525*g*A is a spherical shape in which solder is plated around a copper sphere. At least one copper core solder ball 525*g*A is disposed inside each hole 528*b*A. The second fixing portion 525*f*A is electrically conductive. As described above, since each hole 528*b*A overlaps a different first through hole 26A when viewed in the plate thickness direction Dt, the lower end of each copper core solder ball 525*g*A is connected to the first through hole 26A. Thus, the contact terminal 29A is electrically connected to the first through hole 26A via the second fixing portion 525*f*A. Further, as described above, the first through hole 26A is electrically connected to the IC chip 22A. Thus, the contact terminal 29A is electrically connected to the IC chip 22A.

According to the present embodiment, the IC module 520A includes a second substrate 528A disposed between the first substrate 321A and the contact terminal 29A in the plate thickness direction Dt, the second substrate 528A having the hole 528*b*A penetrating in the plate thickness direction Dt, the contact terminal 29A is provided on the third surface 528*f*A of the second substrate 528A, and the fixing portion 525A includes the first fixing portion 525*c*A that fixes the first substrate 321A and the second substrate 528A to each other, and the second fixing portion 525*f*A that passes through the inside of the hole 528*b*A and fixes the first substrate 321A and the contact terminal 29A to each other. Since the second fixing portion 525*f*A can electrically connect the contact terminal 29A and the first through hole 26A to each other, there is no need to form a through hole with a copper foil layer on the inner peripheral surface in the second substrate 528A. Therefore, an increase in the number of production steps and production costs of the second substrate 528A can be suppressed.

According to the present embodiment, the first fixing portion 525*c*A is formed of solder, and the second fixing portion 525*f*A is formed of the copper core solder balls 525*g*A. Therefore, as in the ninth embodiment, when the second substrate 528A to which the contact terminal 29A is fixed is fixed to the first substrate 321A in the production process of the IC module 520A, the distance between the second substrate 528A and the first substrate 321A in the plate thickness direction Dt can be easily adjusted by adjusting the dimension in the plate thickness direction Dt of each of the solder ball 525*d*A disposed between the second substrate 528A and the first substrate 321A and the copper core solder ball 525*g*A disposed between the contact terminal 29A and the first substrate 321A. Therefore, the thickness of the IC module 520A can be easily set in the range specified by ISO/IEC 7810, and thus the yield of the IC module 520A can be increased.

Fourteenth Embodiment

Next, a fourteenth embodiment of the present invention will be described with reference to FIG. 28. In the following description, components that are common to those in the tenth embodiment are denoted by the same reference signs, and duplicated description thereof will be omitted. The following description will be given focusing on the differences from the twelfth embodiment.

Figure 28:
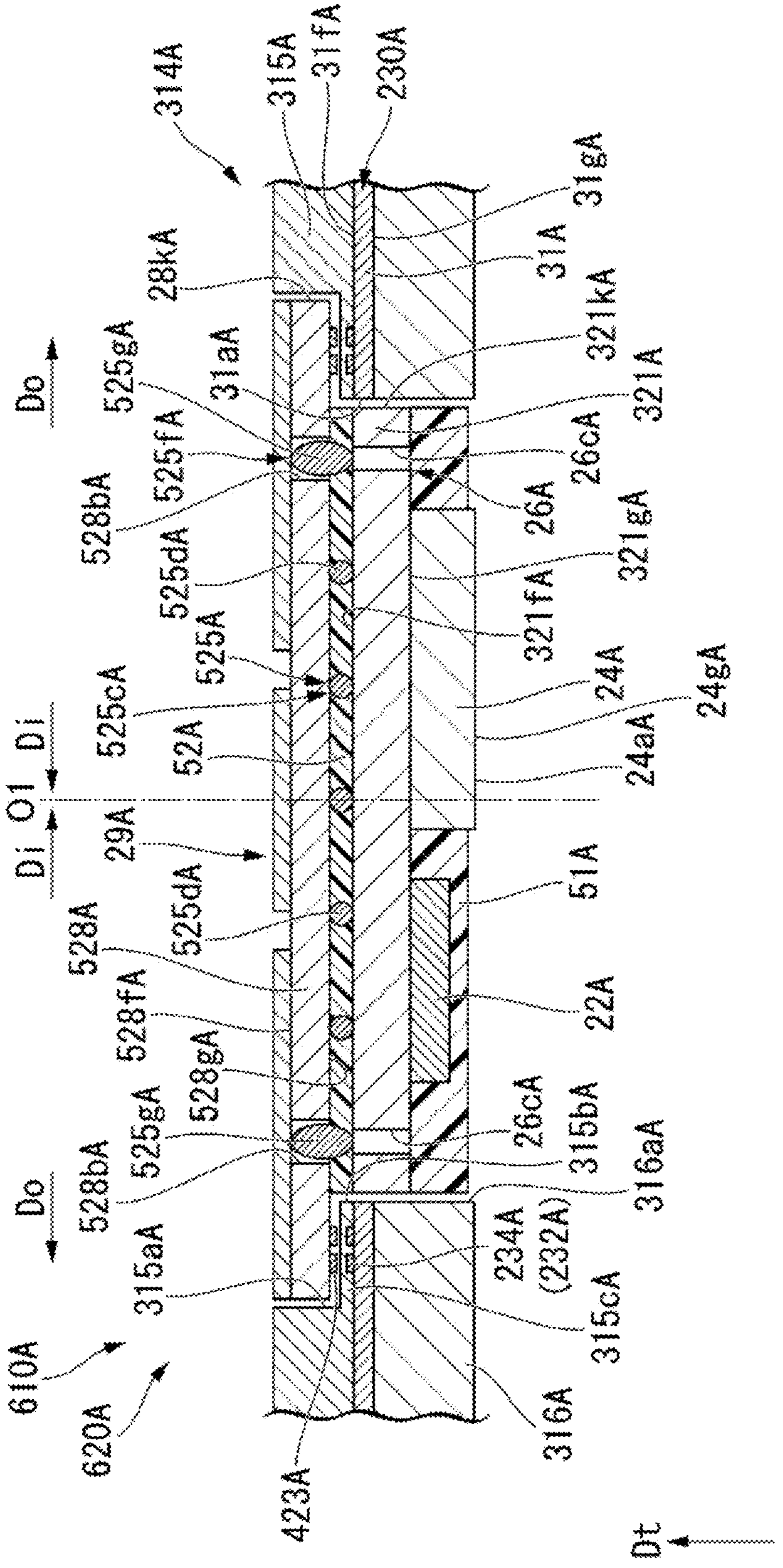
FIG. 28 is a cross-sectional view schematically illustrating an IC card according to a fourteenth embodiment of the present invention.

FIG. 28 is a cross-sectional view schematically illustrating an IC module 620A of an IC card 610A according to the fourteenth embodiment.

The IC module 620A of the present embodiment includes a first substrate 321A, an IC chip 22A, a coupling portion 423A, a fingerprint sensor 24A, a fixing portion 525A, a second substrate 528A, a contact terminal 29A, a first resin sealing portion 51A and a second resin sealing portion 52A. Configurations and the like of the fixing portion 525A and the second substrate 528A of the present embodiment are the same as configurations and the like of the fixing portion 525A and the second substrate 528A of the thirteenth embodiment described above.

In the present embodiment, as in the thirteenth embodiment, since the second fixing portion 525*f*A can electrically connect the contact terminal 29A and the first through hole 26A to each other, there is no need to form a through hole with a copper foil layer on the inner peripheral surface in the second substrate 528A. Therefore, an increase in the number of production steps and production costs of the second substrate 528A can be suppressed.

Further, in the present embodiment, as in the thirteenth embodiment, when the second substrate 528A to which the contact terminal 29A is fixed is fixed to the first substrate 321A in the production process of the IC module 620A, the distance between the second substrate 528A and the first substrate 321A in the plate thickness direction Dt can be easily adjusted. Therefore, the thickness of the IC module 620A can be easily set in the range specified by ISO/IEC 7810, and thus the yield of the IC module 620A can be increased.

Although some embodiments of the present invention have been described, the specific configurations are not limited to these embodiments, and various modifications and combinations of the configurations can be made without departing from the principle of the present invention.

The IC chip may be composed of a plurality of microcomputers. For example, when the IC chip includes two microcomputers, i.e., a first IC chip and a second IC chip, the first IC chip may be a secure microcomputer connected to a contact terminal via first through hole, a fixing portion and a second through hole. In this case, the first IC chip can perform contactless type communication with a contactless type external device, and can also perform contact type communication with a contact type external device. Further, the second IC chip may be a general-purpose microcomputer electrically connected to a fingerprint sensor. In this case, the second IC chip can authenticate the user by comparing the user's fingerprint information acquired by the fingerprint sensor with the fingerprint information stored in the second IC chip, and output the authentication result to a contactless type external device or a contact type external device via the first IC chip. Both the first IC chip and the second IC chip can be disposed on the second surface of the first substrate.

In the embodiments described above, the IC card is described using an example of a hybrid IC card that functions as both a contact type and a contactless type, but the IC card is not particularly limited, and may be an IC card that functions only as a contact type or an IC card that functions only as a contactless type.

INDUSTRIAL APPLICABILITY

According to the IC module and the IC card of the present invention, an increase in the number of production steps and production costs can be suppressed.

REFERENCE SIGNS LIST

10, 210, 310, 410, 510, 610, 710, 810 IC card
14, 714 Card substrate
20, 220, 320, 420, 520, 620, 720, 820 IC module
21 Substrate
21*f* First surface
21*g* Second surface
22 IC chip
23, 223, 723, 823 Coupling portion
24, 724 Fingerprint sensor
25, 325, 525, 725 Holding portion
26, 226 Through hole
28*a*, 528*a* First fixing portion
28*b*, 528*b* Second fixing portion
29 Contact terminal
30, 230, 730, 830 Antenna substrate
32, 232, 832 Booster antenna
33, 733 Connection terminal
50 Resin sealing portion
525*a*, 725*a* Recess
10A, 210A, 310A, 410A, 510A, 610A IC card
14A, 314A Card substrate
20A, 220A, 320A, 420A, 520A, 620A IC module
21A, 221A, 321A First substrate
21*f*A, 321*f*A First surface
21*g*A, 321*g*A Second surface
22A IC chip
23A, 223A, 323A, 423A Coupling portion
24A Fingerprint sensor
25A, 525A Fixing portion
26A, 226A First through hole
28A, 528A Second substrate
28*a*A Second through hole
28*f*A Third surface
29A Contact terminal
30A, 230A Antenna substrate
32A, 232A Booster antenna
33A Connection terminal
51A First resin sealing portion
52A Second resin sealing portion
525*c*A First fixing portion
525*d*A Solder (solder ball)
525*f*A Second fixing portion
525*g*A Copper core solder ball
528*b*A Hole
Dt Plate thickness direction

What is claimed is:

1. An IC module comprising:
a substrate having a through hole penetrating in a plate thickness direction;
a contact terminal provided on a first surface of the substrate facing a first side in the plate thickness direction;
an IC chip provided on a second surface of the substrate facing a second side in the plate thickness direction;
a holding portion fixed to the substrate and projecting from the substrate toward the second side in the plate thickness direction; and
a fingerprint sensor fixed to the holding portion and disposed facing the IC chip with a gap therebetween in the plate thickness direction, wherein
the contact terminal is electrically connected to the IC chip via the through hole, and
the fingerprint sensor is electrically connected to the IC chip via the holding portion.

2. The IC module of claim 1, wherein the holding portion is made of a conductive material.

3. The IC module of claim 1, wherein
the holding portion is a substrate to which the fingerprint sensor is mounted and in which a recess is formed that is recessed from a surface facing the first side in the plate thickness direction toward the second side in the plate thickness direction, and
the IC chip is accommodated in the recess.

4. The IC module of claim 3, comprising
a coupling portion electrically connected to the IC chip, wherein
an outer edge of the holding portion surrounds the substrate when viewed in the plate thickness direction, and
the coupling portion is provided in a portion of a surface of the holding portion facing the first side in the plate thickness direction on the outside of the substrate.

5. The IC module of claim 1, comprising:
a first fixing portion that fixes the holding portion to the substrate; and
a second fixing portion that fixes the holding portion to the fingerprint sensor, wherein
the first fixing portion and the second fixing portion are formed of solders having different melting points from each other.

6. The IC module of claim 1, wherein
the holding portion is a copper core solder ball.

7. The IC module of claim 1, comprising
a resin sealing portion made of a resin, wherein
the resin sealing portion covers the IC chip.

8. The IC module of claim 1, comprising
a coupling portion electrically connected to the IC chip, wherein
an outer edge of the substrate surrounds the holding portion and the fingerprint sensor when viewed in the plate thickness direction, and
the coupling portion is provided in a portion of the second surface of the substrate on the outside of the holding portion.

9. An IC card comprising:
the IC module of claim 8;
a card substrate into which the IC module is fitted; and
an antenna substrate having a booster antenna electrically connected to the coupling portion.

10. The IC card of claim 9, wherein
the antenna substrate includes a connection terminal electrically connected to the booster antenna, and
the coupling portion is a terminal in contact with the connection terminal.

11. The IC card of 10, wherein
the coupling portion is a coil capable of being electromagnetically coupled to the booster antenna.

12. An IC module comprising:
a substrate having a through hole penetrating in a plate thickness direction;
a contact terminal provided on a first surface of the substrate facing a first side in the plate thickness direction;
an IC chip provided on a second surface of the substrate facing a second side in the plate thickness direction;
a holding portion fixed to the substrate and projecting from the substrate toward the second side in the plate thickness direction; and
a fingerprint sensor fixed to the holding portion and disposed facing the IC chip with a gap therebetween in the plate thickness direction, wherein
the IC chip includes a first IC chip and a second IC chip, the contact terminal is electrically connected to the first IC chip via the through hole, and the fingerprint sensor is electrically connected to the second IC chip via the holding portion.

13. An IC module comprising:

a first substrate having a first through hole penetrating in a plate thickness direction;

a contact terminal fixed to a first surface of the first substrate facing a first side in the plate thickness direction via a conductive fixing portion; and an IC chip and a fingerprint sensor provided on a second surface of the first substrate facing a second side in the plate thickness direction, wherein the contact terminal is electrically connected to the IC chip via the fixing portion and the first through hole.

14. The IC module of claim 13, comprising a second substrate disposed between the fixing portion and the contact terminal in the plate thickness direction, the second substrate having a second through hole penetrating in the plate thickness direction, wherein the contact terminal is provided on a third surface of the second substrate facing a first side in the plate thickness direction, and is electrically connected to the fixing portion via the second through hole.

15. The IC module of claim 14, wherein the fixing portion is formed of solder.

16. The IC module of claim 14, comprising a first resin sealing portion made of a resin, wherein the first resin sealing portion covers the IC chip, and a surface of the fingerprint sensor facing a second side in the plate thickness direction is exposed from the first resin sealing portion.

17. The IC module of claim 14, comprising a second resin sealing portion made of a resin, wherein at least a part of the fixing portion is covered with the second resin sealing portion.

18. The IC module of claim 14, comprising a coupling portion electrically connected to the IC chip, wherein an outer edge of the first substrate overlaps an outer edge of the second substrate when viewed in the plate thickness direction, and the coupling portion is formed on the second surface of the first substrate.

19. An IC card comprising:

the IC module of claim 18;

a card substrate into which the IC module is fitted; and an antenna substrate having a booster antenna electrically connected to the coupling portion.

20. The IC card of claim 19, wherein the antenna substrate includes a connection terminal electrically connected to the booster antenna, and the coupling portion is a terminal in contact with the connection terminal.

21. The IC card of claim 19, wherein the coupling portion is a coil capable of being electromagnetically coupled to the booster antenna.

22. The IC module of claim 14, comprising a coupling portion electrically connected to the IC chip, wherein an outer edge of the second substrate surrounds an outer edge of the first substrate when viewed in the plate thickness direction, and the coupling portion is provided in a portion of a fourth surface of the second substrate facing the second side in the plate thickness direction on the outside of the first substrate.

23. The IC module of claim 13, comprising a second substrate disposed between the first substrate and the contact terminal in the plate thickness direction, the second substrate having a hole penetrating in the plate thickness direction, wherein the contact terminal is provided on a third surface of the second substrate facing a first side in the plate thickness direction, and the fixing portion includes a first fixing portion that fixes the first substrate and the second substrate to each other, and a second fixing portion that passes through an inside of the hole and fixes the first substrate and the contact terminal to each other.

24. The IC module of claim 23, wherein the first fixing portion is formed of solder, and the second fixing portion is formed of a copper core solder ball.

25. An IC module comprising:

a first substrate having a first through hole penetrating in a plate thickness direction;

a contact terminal fixed to a first surface of the first substrate facing a first side in the plate thickness direction via a conductive fixing portion; and an IC chip and a fingerprint sensor provided on a second surface of the first substrate facing a second side in the plate thickness direction, wherein the IC chip includes a first IC chip and a second IC chip, the contact terminal is electrically connected to the first IC chip via the fixing portion and the first through hole, and the fingerprint sensor is electrically connected to the second IC chip.

* * * * *